US012631586B2

(12) United States Patent
Zang et al.

(10) Patent No.: US 12,631,586 B2
(45) Date of Patent: May 19, 2026

(54) DETECTING COMPOUNDS IN AIRBORNE PARTICLES USING ION EXCHANGE

(71) Applicants: University of Utah Research Foundation, Salt Lake City, UT (US); Gentex Corporation, Zeeland, MI (US)

(72) Inventors: Ling Zang, Salt Lake City, UT (US); Jayc Johnson, Salt Lake City, UT (US); Paul Slattum, Salt Lake City, UT (US); Benjamin Ross Bunes, Murray, UT (US); Douglas Wayne Later, Sandy, UT (US)

(73) Assignees: UNIVERSITY OF UTAH RESEARCH FOUNDATION, Salt Lake City, UT (US); GENTEX CORPORATION, Zeeland, MI (US)

( * ) Notice: Subject to any disclaimer, the term of this patent is extended or adjusted under 35 U.S.C. 154(b) by 1181 days.

(21) Appl. No.: 17/239,247

(22) Filed: Apr. 23, 2021

(65) Prior Publication Data

US 2021/0341373 A1 Nov. 4, 2021

Related U.S. Application Data

(60) Provisional application No. 63/061,478, filed on Aug. 5, 2020, provisional application No. 63/014,879, filed on Apr. 24, 2020.

(51) Int. Cl.
*G01N 27/12* (2006.01)
*B82Y 15/00* (2011.01)
(Continued)

(52) U.S. Cl.
CPC ............ *G01N 27/127* (2013.01); *B82Y 15/00* (2013.01); *G01N 15/0606* (2013.01);
(Continued)

(58) Field of Classification Search
CPC ................ G01N 27/126; G01N 27/127; Y10T 436/174614; B82Y 15/00; C09B 5/62; H10K 85/621
See application file for complete search history.

(56) References Cited

U.S. PATENT DOCUMENTS 8,058,075 B2 11/2011 Zang et al.
8,153,065 B2 4/2012 Zang et al.
(Continued)

FOREIGN PATENT DOCUMENTS

CN 1402000 A 3/2003
CN 1618014 A 5/2005
(Continued)

OTHER PUBLICATIONS

Later, D. et al. "Innovative Systems Based on Organic Nanofiber Sensors for Air Quality," Air and Odor Management Conference and Technology Showcase; Toronto, Canada; Sep. 19-20, 2019 (Year: 2019).*

(Continued)

*Primary Examiner* — Jennifer Wecker
*Assistant Examiner* — Michelle Adams
(74) *Attorney, Agent, or Firm* — Price Heneveld LLP; Brian James Brewer

(57) ABSTRACT

A sensor to detect solid particles of a target salt can include a support substrate, an adsorption layer, a sensing layer oriented between the support substrate and the adsorption layer, and an electrode pair in contact with the sensing layer and separated by the sensing layer. The adsorption layer can include an ion exchange medium formed of a first porous structured material functionalized with basic or acidic functional groups. The basic or acidic functional groups can remove an acid or base component from the target salt to form a free base or free acid, respectively, of the target salt.

(Continued)

The sensing layer can include a second porous structured material functionalized to detect the free base or acid of the target salt by a change in conductivity.

17 Claims, 22 Drawing Sheets

(51) Int. Cl.
*G01N 15/06* (2006.01)
*H10K 85/60* (2023.01)
*C09B 5/62* (2006.01)
*G01N 15/00* (2006.01)

(52) U.S. Cl.
CPC ....... *G01N 15/0656* (2013.01); *H10K 85/621* (2023.02); *C09B 5/62* (2013.01); *G01N 2015/0046* (2013.01); *G01N 2015/0681* (2013.01); *Y10T 436/174614* (2015.01)

(56) References Cited

U.S. PATENT DOCUMENTS

| | | | | |
|---|---|---|---|---|
| 8,486,708 | B2 | 7/2013 | Zang et al. | |
| 8,809,063 | B2 | 8/2014 | Zang et al. | |
| 8,809,420 | B2 | 8/2014 | Wei et al. | |
| 9,786,848 | B2 | 10/2017 | Zang et al. | |
| 10,151,720 | B2 | 12/2018 | Wang et al. | |
| 2007/0114138 | A1 * | 5/2007 | Krasteva .............. | G01N 27/126 204/400 |
| 2013/0130398 | A1 | 5/2013 | Zang | |
| 2014/0193923 | A1 | 7/2014 | Zang et al. | |
| 2015/0118760 | A1 | 4/2015 | Zang et al. | |
| 2015/0204836 | A1 | 7/2015 | Prestwich et al. | |
| 2017/0160252 | A1 | 6/2017 | Zang et al. | |
| 2018/0201612 | A1 | 7/2018 | Zang et al. | |
| 2020/0018713 | A1 | 1/2020 | Bunes et al. | |

FOREIGN PATENT DOCUMENTS

| | | |
|---|---|---|
| CN | 103718031 A | 4/2014 |
| CN | 108290888 A | 7/2018 |
| CN | 110140043 A | 8/2019 |

OTHER PUBLICATIONS

Vaporsens, Inc. "Bilayer Nanofibers as Wearable Sensors for Detecting Fentanyl Compounds," Department of Homeland Security Award abstract; Contract No. 70RSAT18C00000018; Award Year: 2018; accessed from https://www.sbir.gov/awards/169849 on Aug. 7, 2025 (Year: 2018).*

Zang Research Group. Group News: entries dated May 24, 2018 and Nov. 8, 2018; accessed from https://my.eng.utah.edu/~Izang/news.html on Aug. 8, 2025 (Year: 2018).*

Zang, L. "Interfacial Donor-Acceptor Engineering of Nanofiber Materials to Achieve Photoconductivity and Applications," Acc. Chem. Res. 2015, 48, 2705-2714 (Year: 2015).*

News Release: DHS Awards Nearly $3 Million to Small Businesses for Innovative Research. Release Date: May 24, 2018; accessed from https://www.dhs.gov/science-and-technology/news/2018/05/24/news-release-dhs-awards-nearly-3-million-sbir on Aug. 8, 2025 (Year: 2018).*

Vaporsens, Inc. Portfolio Data at https://www.sbir.gov/awards/169849; accessed on Aug. 7, 2025 (Year: 2025).*

The Wayback Machine—https://web.archive.org/web/20130912195123/http://sbir.gov/sbirsearch/detail/405240; Sep. 12, 2013 archive, accessed on Aug. 7, 2025 (Year: 2013).*

"Bilayer Nanofibers as Wearable Sensors for Detecting Fentanyl Compounds," Award last edited on: Jul. 17, 2019; accessed from https://seekingalpha.inknowvation.com/sbir/awards/dhs-2018-bilayer-nanofibers-wearable-sensors-detecting-fentanyl-compounds on Aug. 8, 2025 (Year: 2019).*

Arduini.; "Nanomaterials and Cross-Cutting Technologies for Fostering Smart Electrochemical biosensors in the Detection of Chemical Warfare agents." Appl. Sci. 2021, 11, 720, 12 pages.

Chen et al.; "Perylene Diimide-Based Fluorescent and Colorimetric Sensors for Environmental Detection." Sensors 2020; 20, 917; 28 Pages.

Chen et al.; "Self-Assembly of Perylene Imide Molecules into ID Nanostructures: Methods, Morphologies, and Applications." Chemical Reviews; ACS Publications; Oct. 6, 2015; vol. 115, Issue 21; pp. 11967-11998.

Chen et al.; "Tunable nanofibril heterojunction for controlling interfacial charge transfer in chemiresistive gas sensors." J. Mater. Chem. 2019. 7, pp. 13709-13735.

Datar et al.; "One-dimensional self-assembly of a water soluble perylene diimide molecule by pH triggered hydrogelation." ChemComm; RCS Publishing; 2013; vol. 49; pp. 6894-6896.

E et al.; "Fluorescent bilayer nanocoils assembled from an asymmetric perylene diimide molecule with ultrasensitivity for amine vapors." Chem. Commun., 2014, 50, pp. 13596-13599.

Huang et al.; "Direct synthesis of highly pure perylene tetracarboxylic monoimide." Tetrahedron Letters; Elsevier; vol. 51; 2010; pp. 6651-6653.

Huang et al.; "Morphology Control of Nanofibril Donor-Acceptor Heterojunction To Achieve High Photoconductivity: Exploration of New Molecular Design Rule." J. Am. Chem. Soc. 2013, 135, pp. 16490-16496.

Mishra et al.; "Continuous Opioid Monitoring along with Nerve Agents on a Wearable Microneedle Sensor Array." J. Am. Chem. Soc. Mar. 2020, 142, 13, pp. 5991-5995.

Postigo et al.; "Determination of Drugs of Abuse in Airborne Particles by Pressurized Liquid Extraction and Liquid Chromatography-Electrospray-Tandem Mass Spectrometry." Anal. Chem. 2009, 81, pp. 4382-4388.

PCT Application No. PCT/US21/28963 Filing date Apr. 23, 2021, Ling Zang International Search Report Mailing date Aug. 12, 2021; 54 Pages.

Weatherston et al.; "Multi-functional SERS substrate: collection, separation, and identification of airborne chemical powders on a single device." Sens Acutators B chem. 2019 297; 16 Pages.

Xue et al.; "Electrochemical Study of Structure Tunable Perylene Diimides and the Nanofibers Deposited on Electrodes." Langmuir; ACS Publications; 2019, 35; pp. 12009-12016.

Yang et al.; "Donor-Acceptor Supramolecular Organic Nanofibers as Visible-Light Photoelectrocatalysts for Hydrogen Production." ACS Applied Materials & Interfaces; Energy, Environmental, and Catalysis Applications; 2018, 10, pp. 19764-19772.

Chinese Search Report, State Intellectual Property Office, received on Jul. 16, 2025, 6 pages.

* cited by examiner

Sensing Layer Nanofibers

Compound 1

Compound 2

Adsorption Layer Nanofibers

Compound 3

Compound 4

Compound 5

*HCl

1

2

3

4

5

Metamizole Sodium

Sodium Bicarbonate

D-Mannitol

Alpha-D-Lactose

DETECTING COMPOUNDS IN AIRBORNE PARTICLES USING ION EXCHANGE

RELATED APPLICATIONS

This application claims the benefit of U.S. Provisional Application No. 63/014,879, filed Apr. 24, 2020 which is incorporated herein by reference, and U.S. Provisional Application No. 63/061,478, filed Aug. 5, 2020, which is also incorporated herein by reference.

GOVERNMENT INTEREST

This invention was made with government support under Grant No. 70RSAT18C00000018 and Grant No. 70RSAT19C00000016 awarded by the U.S. Department of Homeland Security. The government has certain rights in the invention.

BACKGROUND

Increases in the number of people addicted to opiates and fatalities resulting from opiate abuse have cause opiate abuse to become a public health emergency. For example, a seven-fold increase in fentanyl confiscations or seizures indicates that many overdoses may be caused by the availability of non-prescribed fentanyl. A dose as small as 2-3 mg can prove fatal for people exposed to fentanyl, including emergency responders. Fentanyl can be inhaled putting first responders at risk of an overdose when responding to calls regarding fentanyl or other drugs that may be spiked with fentanyl. Current methods used to identify fentanyl require direct contact with the material. Non-contact methods are expensive and bulky. Thus, first responders would benefit from a fentanyl identification device that is wearable, requires no contact with the unknown substance, is highly sensitive, selective, quickly generates results, at low cost.

More generally, determining the chemical composition of particles in the air is an ongoing challenge. For example, smoke detectors based on light scattering cannot be placed in bathrooms because they are unable to distinguish between smoke particles and water droplets (steam).

Some methods that have been used to detect airborne chemicals include particle counters, chemical sensors and analytical instruments. Particle Counters typically use an optical sensor to measure light scattering by any type of particle, including water droplets. This method generally detects all particles within a certain size range without any information on chemical composition. Chemical Sensors typically detect molecules through a measurable signal (frequency, voltage, conductance, etc.). Chemical sensors are generally insensitive to particles because of the small contact area. Many chemical sensors are in a housing that prevents particles from reaching them. Analytical Instruments typically detect molecules using spectrophotometric or spectroscopic techniques in a laboratory after sample preparation. Analytical methods, such as mass spectrometry, require expensive instrumentation (>$100 k) and sample preparation. In this approach, particles are collected and then brought to the laboratory. The samples are then prepared by breaking down particles into molecular components, for example, by laser ablation or chemical extraction. Although highly accurate and reliable, this method is expensive, user-intensive, non-portable, and requires the user to be skilled in chemistry. Other technologies are based on Raman spectroscopy (e.g. the THERMO SCIENTIFIC™ TRUNARC™ handheld narcotics analyzer from Thermo Fisher Scientific (USA)) which are portable and suitable for detecting powders, and do not require sample decomposition. However, these devices are poorly adapted to sensitively detect airborne particles and tend to be expensive.

SUMMARY

The present disclosure describes sensors and methods for detecting solid particles of certain salts, such as the salt form of fentanyl. In some examples, a sensor to detect solid particles of a target salt can include a support substrate, an adsorption layer, a sensing layer oriented between the support substrate and the adsorption layer, and an electrode pair in contact with the sensing layer and separated by the sensing layer. The adsorption layer can include an ion exchange medium formed of a first porous structured material functionalized with basic or acidic functional groups. The basic functional groups can remove an acid component from the target salt to form a free base of the target salt. In the case of acidic functional groups, the acidic functional groups can remove a base component from the target salt to form a free acid of the target salt. The sensing layer can include a second porous structured material functionalized to detect the free base or free acid of the target salt by a change in conductivity.

The present disclosure also describes methods of detecting solid particles of the target salt. In one example, a method of detecting solid particles of a target salt can include exposing an adsorption layer to a gaseous medium in which particles of the target salt are entrained. The adsorption layer can include an ion exchange medium formed of a first porous structured material functionalized with basic or acidic functional groups. The basic or acidic functional groups can remove an acid or a base component from the target salt to form a free base or free acid of the target salt. The free base or free acid of the target salt can diffuse to a sensing layer that is adjacent to the adsorption layer. The sensing layer can include a second porous structured material functionalized to detect the free base or free acid of the target salt. In particular, the free base of free acid of the target salt can change the conductivity of the second porous structured material. The method can also include measuring a change in conductivity of the sensing layer using an electrode pair in contact with the sensing layer and separated by the sensing layer. Contact between the electrode pair and the sensing layer can be direct contact, although electrical contact via intermediate conductors can also be used. In some examples, the gaseous medium can include air. In further examples, the free base can be a vapor or gas. In certain examples, the concentration of the target salt in the gaseous medium can be from 0.1 $mg/m^3$ to 100 $mg/m^3$, and in some cases 1 $mg/m^3$ to 4 $mg/m^3$.

There has thus been outlined, rather broadly, some features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

FIG. 4A-B) Fentanyl particles are introduced to the sensor. FIG. 4C-D) The particles adsorb to the base functionalized nanofibers in the adsorption layer. There may be a small signal recorded as the particles contact the adsorption layer and disturb the nanofibers. FIG. 4E-F) The base-functionalized nanofibers cause an ion exchange interaction with the fentanyl salt and convert the fentanyl molecules to their free base form. Free base fentanyl migrates, with a portion reaching the sensing layer where it generates a signal through charge transfer.

Figure 1:
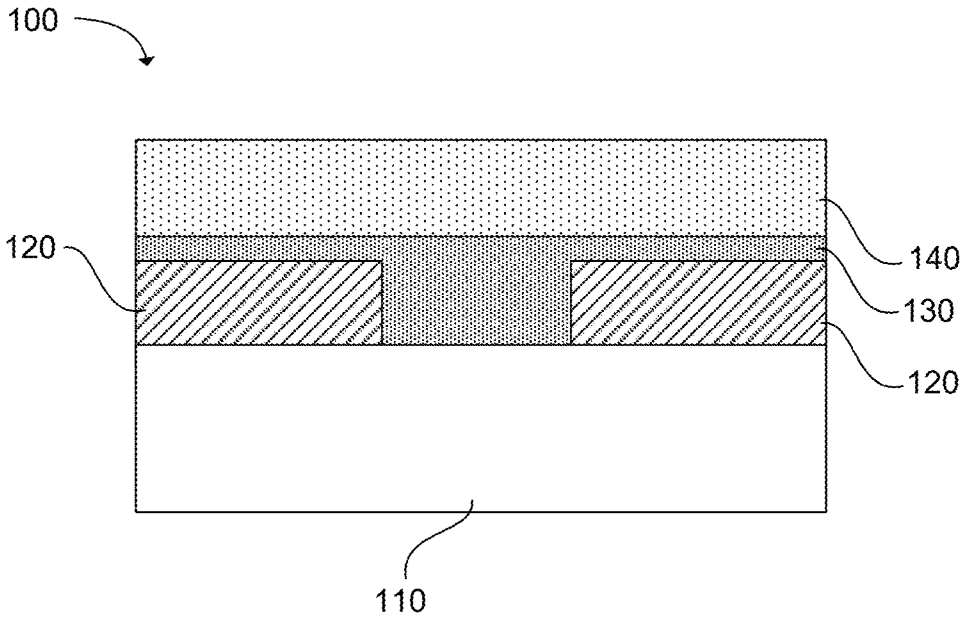
FIG. 1 is a schematic side cross-sectional view of an example sensor in accordance with the present disclosure.

These drawings are provided to illustrate various aspects of the invention and are not intended to be limiting of the scope in terms of dimensions, materials, configurations, arrangements or proportions unless otherwise limited by the claims.

DETAILED DESCRIPTION

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

Definitions

In describing and claiming the present invention, the following terminology will be used.

The singular forms "a," "an," and "the" include plural referents unless the context clearly dictates otherwise. Thus, for example, reference to "a particle" includes reference to one or more of such materials and reference to "subjecting" refers to one or more such steps.

As used herein, the term "about" is used to provide flexibility and imprecision associated with a given term, metric or value. The degree of flexibility for a particular variable can be readily determined by one skilled in the art. However, unless otherwise enunciated, the term "about" generally connotes flexibility of less than 2%, and most often less than 1%, and in some cases less than 0.01%.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "at least one of" is intended to be synonymous with "one or more of." For example, "at least one of A, B and C" explicitly includes only A, only B, only C, and combinations of each.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Sensors to Detect Solid Particles of a Target Salt

The technology described herein can provide low-cost, low-power, small form factor sensors capable of determining at least one of the chemical components of a solid particle of a target salt. The sensors can utilize a solid-state ion exchange process that releases one of the compounds as free, neutral molecules that can subsequently be detected using a chemical sensor.

Many particles of interest, such as explosives and narcotics, are in a salt form where acid and base components are held together through ionic bonds. These ionic bonds can be broken through an ion-exchange process that involves the introduction of a base or acid. If a base is introduced, the base can remove the acid component from the target salt, which releases the base component of the target salt as a free base. If an acid is introduced, the acid can remove the base component of the target salt, which releases the acid component of the target salt as a free acid. The component that is released can then be detected. In some examples, the released component can be detected using a chemical sensor or mass spectrometry or other methods. The present disclosure describes the ion exchange process used to dissociate the components of solid-state particles collected in air, a method to detect target components with specificity, and an application in using these methods to identify exposure to fentanyl or other ionic compounds.

In the sensors described herein, the ion-exchange process can be performed using an ion exchange medium that includes a porous structured material that is functionalized with basic or acidic functional groups. Accordingly, the basic or acidic functional groups can remove the acidic or basic components, respectively, of a target salt. This can convert the target salt into a free base or free acid. The porous structured material can be a variety of materials that have a structure that allows gas and solid particles of the target salt that may be entrained in the gas to enter the pores of the material. In certain examples, the porous structured material can include organic nanofibers, polymeric nanofibers, carbon nanotubes, silicon nanowires, metal oxide nanowires, boron nitride nanotubes, aerogels, xerogels, highly porous ceramics, metal-organic frameworks (MOF), glassy carbon, chalcopyrites, chalcogenides, or combinations thereof.

In one embodiment, the ion exchange media can include organic nanofibers functionalized with bases (e.g., primary amines). When a salt particle adsorbs onto the nanofibers, the acid component (e.g., hydrochloric acid) is pulled out of the particle by the strong base functionality of the nanofiber. The organized, one-dimensional nanofiber structure provides efficient pathways for expedient diffusion of the acid, enabling a large effective surface to drive the ion exchange process. Furthermore, the nanofibers form a porous film that facilitates the transport of the released component. In some cases, the particle can be fentanyl hydrochloride, a common opioid that releases fentanyl as a free base as a result of the ion exchange process.

In another embodiment, a sensor comprises two components including a top adsorption layer and a bottom sensing layer. The top adsorption layer collects the particles and releases the target component using the ion exchange process described above. The bottom sensing layer detects the released component of the salt, for example, by a change in conductivity. The sensing layer can be made of a second porous structured material that may be functionalized to detect the free base or free acid that is released from the adsorption layer. Any of the porous materials mentioned above can be used in the sensing layer. In a particular embodiment, the sensing layer can include organic nanofibers functionalized to detect the free base or free acid of the target salt (e.g., free base fentanyl). The organic nanofibers can be in contact with an electrode pair that applies an electrical bias to the nanofibers. The nanofibers can change conductivity in response to the target chemical, producing a measurable change in electric current. Other forms of chemical sensors can be used, such as electrochemical cells, conducting polymers, fluorescent polymers, colorimetric sensors, inorganic nanostructures, nanotubes (boron-nitride or carbon), graphene, 2-dimensional dichalcogenides, and metal oxides.

This type of bilayer sensor can be incorporated into an instrument that includes a variety of additional components for convenience and to increase the sensing ability of the sensor. The instrument can include interfaces between the environment and the sensor, and interfaces between the sensor and the user. In some examples, an instrument can include several components or subsystems, such as: a housing; a sampling system (either passive or active) that facilitates interaction between the sensors and the environment; the sensors themselves; electronic components (amplifiers, analog to digital converter, multiplexor, microcontroller, passive components, etc.) to operate the sensors; a power supply (e.g., battery, transformer, etc.); firmware to operate the system; a user interface (e.g., haptic alarm, visual alarm, auditory alarm, display); and communications (e.g., wi-fi, Bluetooth, USB, LTE, LoRa, etc.).

Instruments may be in a number of form factors. One example form factor is a wearable detector. In this embodiment, a bilayer sensor can be housed in a wearable, battery-powered device. The wearable device can be sized to be conveniently worn or attached to clothing. For example, the wearable device can have a length, width, and/or height that is from about 0.5 inches to about 4 inches. Particles of the target salt can be delivered to the sensor actively using a blower. The user can be alerted to the presence of the target compound with audible, visual, and haptic alarms. An example is a wearable sensor for detecting fentanyl compounds to be used by the first responder community. One non-limiting example of such a wearable sensor is described in U.S. Patent Application Publication No. 20200326286, now. U.S. Pat. No. 11,175,233, which is incorporated herein by reference.

In another form factor, the sensor can be in a stationary device. This embodiment can be similar to a smoke detector. The device can be mounted to a fixed location (e.g., a wall). The sensor can be open to the environment to sample passively. Power can be provided through a battery or electrical lines. One example can be a smoke detector where the sensor is able to discern between smoke and steam. A second example can be an outdoor air monitor capable of distinguishing between primary (e.g., soot, dust) and secondary (typically ammonium nitrate) particulate matter.

The sensing layer can be a chemiresistive sensing that is coated over electrodes or between electrodes. In any of the examples described herein, the sensing layer material can be electrically connected to a pair of electrodes so that electric current can flow from one electrode, through the sensing layer, to the other electrode. The chemiresistive sensing material can exchange electrons with adsorbed gasses, causing a resistivity change in the sensing material. The resistivity change can be measured electronically to develop a finger-print profile for specific gases. As mentioned above, some target compounds, such as fentanyl, can be found in solid powder particles instead of as a gas. Fentanyl is often in the form of a powder of fentanyl hydrochloride, which has a negligible vapor pressure. In fact, the saturated vapor of fentanyl is significantly lower than a dangerous concentration. The threat of fentanyl inhalation is due to the possibility of inhaling solid particles of fentanyl hydrochloride. Therefore, the bilayer design described herein allows solid particles of fentanyl hydrochloride to be adsorbed in the top adsorption layer, and free base fentanyl can then diffuse to the sensing layer where it can be detected by a resistivity change in the sensing layer. Fentanyl is a weak base and a stronger base can draw out the hydrochloric acid and convert fentanyl to its more volatile free base form. Once converted to the free base form, fentanyl can be detected by the sensing layer of the sensors described herein. Fentanyl has a pKa of 8.4, while alkyl amines with primary and secondary amines have pKa values larger than 10.5. Sensors can be synthesized with primary and secondary alkyl amines that will readily convert the hydrochloric salt of fentanyl and decompose it to its free base form.

Although fentanyl hydrochloride is discussed as one example, a variety of other target salts can also be detected using sensors as described herein. If the target compound can be identified by a unique free base form of the salt, then the sensor can include an adsorption layer that is functionalized with basic functional groups to remove the acid component of the target salt and allow the free base molecule to be detected by the sensing layer. On the other hand, if the target salt can be identified by a unique free acid form, then the adsorption layer can be functionalized with acidic functional groups to remove the base component of the target salt, forming a free acid that can be detected by the sensing layer.

The bilayer sensors described herein can detect target compounds at low concentrations with a good response time. In experimental testing, a sensor designed to detect fentanyl hydrochloride was tested with a simulant of fentanyl hydrochloride. The sensor was capable of detecting solid particles of the simulant of fentanyl hydrochloride at a concentration of 1.6 mg/$m^3$ in less than 5 minutes. When the same sensor was exposed to cutting agents such as mannitol, lactose, or baking soda, no response was observed even when high concentrations such as 10-20 mg/$m^3$ were used. Another interferent, metamizole, showed a smaller response in the opposite direction as the fentanyl simulant.

These results demonstrate the feasibility of detecting fentanyl in its relevant form and concentration using the sensors described herein. Moreover, the sensors are appropriate for integration into a small, wearable device. Such a product can provide early warning of exposure to fentanyl to first responders, expediting diagnosis and improving the chances of survival for a first responder that has been exposed.

In more specific examples, the porous structured material of either the adsorption layer, or sensing layer, or both, can be made from organic nanofibers. In certain examples, the organic nanofibers can be formed by assembling building block molecules that are functionalized to alter their sensitivity and selectivity to the compounds of interest. Once assembled from building block molecules, the nanofibers can be coated onto an electrode pair so that the resistivity of the layer of nanofibers can be measured as they interact with molecules in the environment. The resistance of the nanofibers can change because the electron density is altered as molecules adsorb to the surface of the nanofibers and transfer electrons. Because the response is not covalent in nature, the sensors can recover from this interaction and can be reused. The sensor response is proportional to the Langmuir adsorption model, enabling quantification of detected chemicals. Non-limiting examples of building block materials for formation of the nanofibers can include those listed in U.S. Pat. Nos. 8,486,708; 8,889,420; 8,703,500; and 8,809,063, U.S. Pat. App. Pub. No. US-2014-0235493-A1; US-2018-0201612-A1, now U.S. Pat. No. 11,261,181; and US-2017-0160252-A1, now U.S. Pat. No. 11,022,592, which are each incorporated herein by reference. These materials can be functionalized with amines as described herein for use in forming the basic nanofibers in the adsorption layer; or used as presented for the sensing layer.

FIG. 1 shows a cross-sectional side view of an example sensor 100 in accordance with the present disclosure. This example includes a support substrate 110, a pair of electrodes 120 formed on the support substrate, a sensing layer 130 formed over the support substrate and the electrodes, and an adsorption layer 140 formed over the sensing layer. The sensing layer is in contact with the electrodes and the electrodes are separated by the sensing layer, meaning that a pathway for electric current from one electrode to the other passes through the sensing layer. Therefore, a change in conductivity of the sensing layer can be measured by passing an electric current between the electrodes. The adsorption layer can include an ion exchange medium formed of a first porous structured material. The first porous structured material can be functionalized with basic or acidic functional groups to remove the acidic or basic components from a target salt to form a free base or free acid of the target salt. The sensing layer can include a second porous structured material. The second porous structured material can be functionalized to detect the free base or free acid of the target salt by a change in conductivity.

The particular sensor design shown in FIG. 1 is a single example. Other arrangements of the elements of the sensor are also possible. For example, FIG. 1 shows the sensing layer deposited over the top of the electrodes and filling the space between the electrodes. However, in other examples, the sensing layer material may not be over the top of the electrodes, or the sensing layer material may not fill the space between the electrodes. Any arrangement can be used as long as the sensing layer material is in electrical contact with both electrodes so that an electric current from one electrode to the other passes through the sensing layer. Additionally, the adsorption layer can cover the entire sensing layer in some examples, while in other examples the adsorption layer may cover a portion of the sensing layer. The adsorption layer can be deposited over the electrodes in some examples, while in other examples the adsorption layer may not be deposited over the electrodes. In some examples, the adsorption layer and the sensing layer can both be located between the electrodes. However, in certain examples, the adsorption layer can be separated from the electrodes by the sensing layer, so that the adsorption layer material is not in direct contact with the electrodes. Thus, electric current can pass from one electrode to the other through the sensing layer, and not through the adsorption layer. In another alternative, electric current may also pass through the adsorption layer.

Figure 2A:
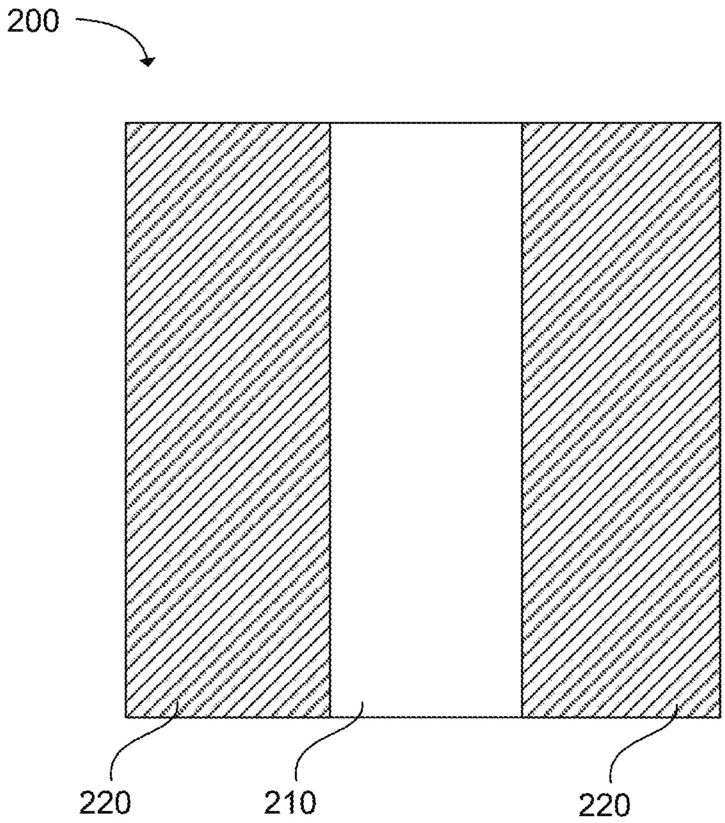
FIGS. 2A-2D show schematic top and side cross-sectional views of an example sensor in accordance with the present disclosure.
Figure 2B:
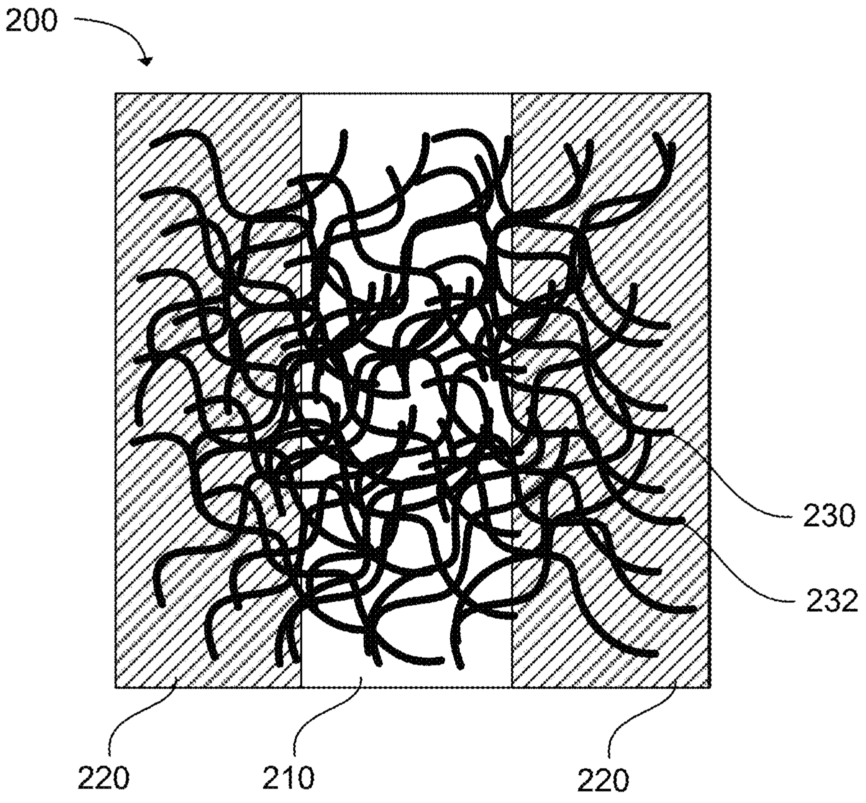
Figure 2C:
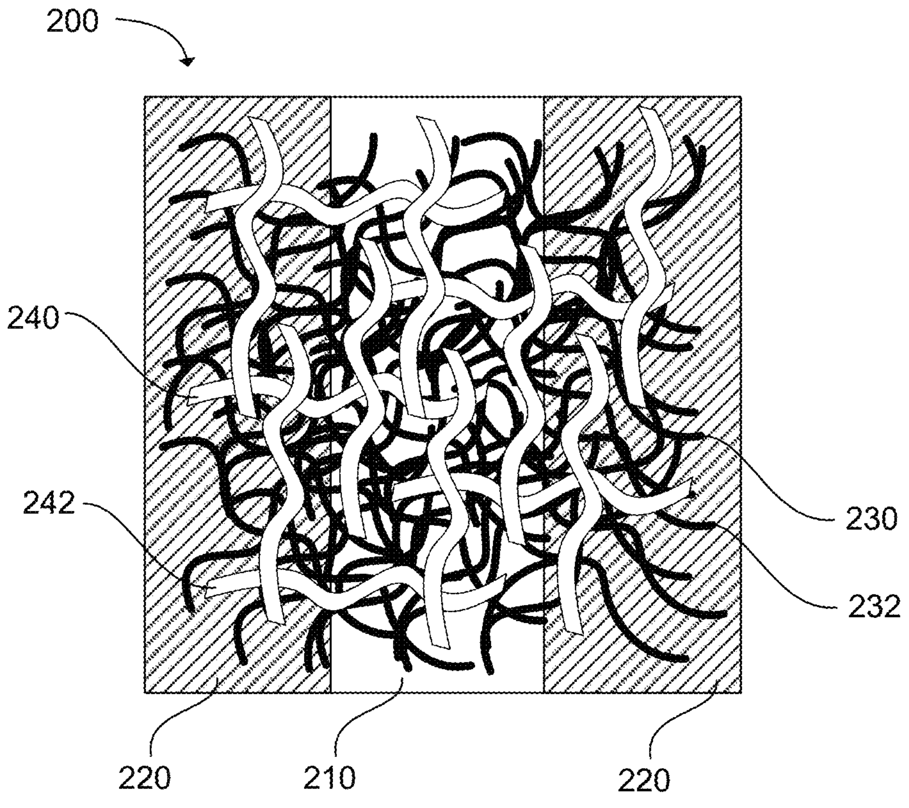
Figure 2D:
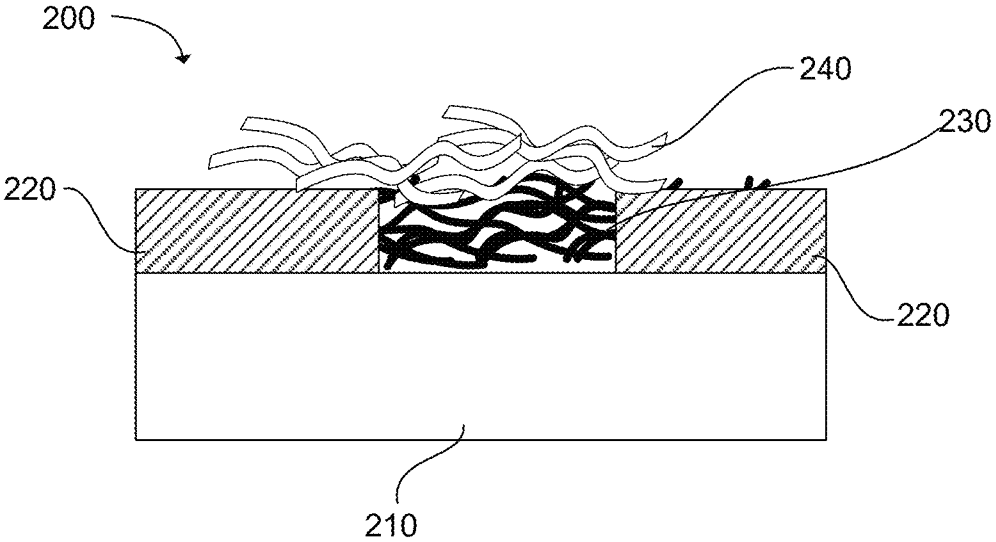

FIGS. 2A-2D show a process of making another example sensor 200. FIG. 2A shows a top-down view of a support substrate 210 and two electrodes 220 formed on the support substrate. FIG. 2B shows a sensing layer 230 made up of nanofibers 232 deposited over the substrate and the electrodes. FIG. 2C shows an adsorption layer 240 made up of nanofibers 242 deposited over the sensing layer. FIG. 2D shows a side cross-sectional view of the sensor. As explained above, the nanofibers in the adsorption layer can be functionalized with basic groups that can remove the acid component from a target salt. The nanofibers in the sensing layer can be capable of detecting the free base form of the target salt by a change in electrical conductivity.

In a particular example, a sensor of the type shown in FIGS. 2A-2D can be used to detect fentanyl hydrochloride. The adsorption layer can catch particles of fentanyl hydrochloride and convert them to a free base by drawing out the hydrochloric acid. The free base fentanyl can then diffuse to the sensing layer where it can be detected. With this system, the adsorption layer can have a high enough density so that fentanyl hydrochloride particles can be captured and provide enough interfacial interaction for the complete conversion of the particles to their free base form. The sensing layer nanofibers can have the ability to sensitively detect fentanyl in its free base form.

Figure 3A:
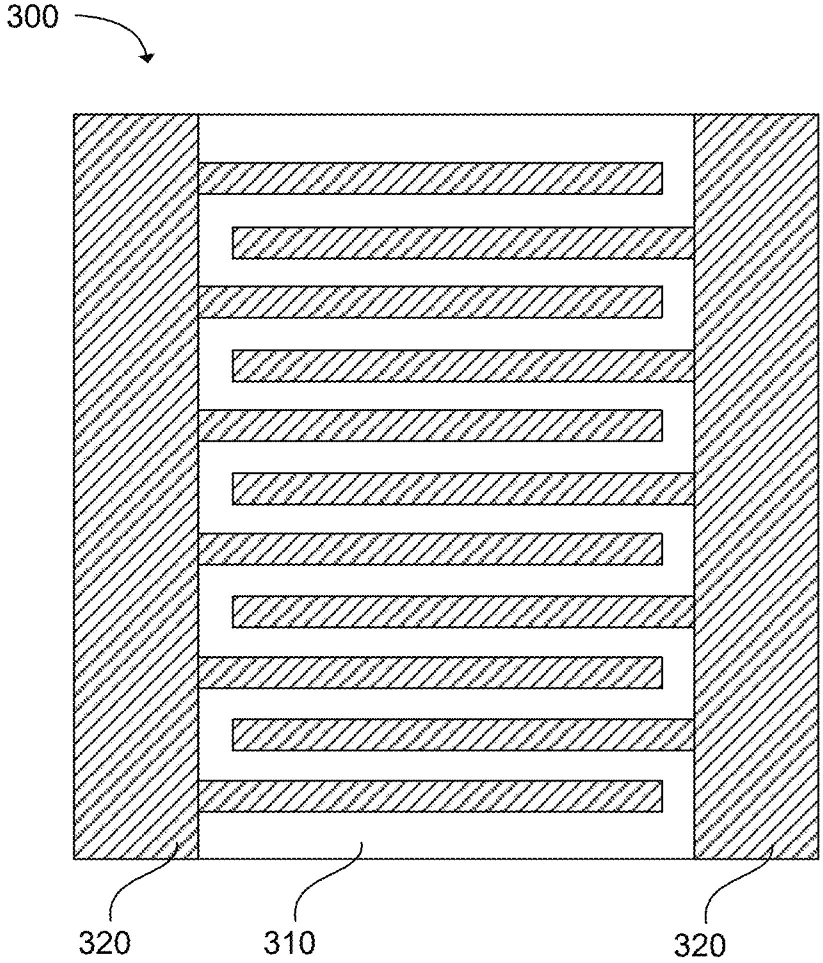
FIGS. 3A-3B show schematic top and side cross-sectional views of an example sensor in accordance with the present disclosure.
Figure 3B:
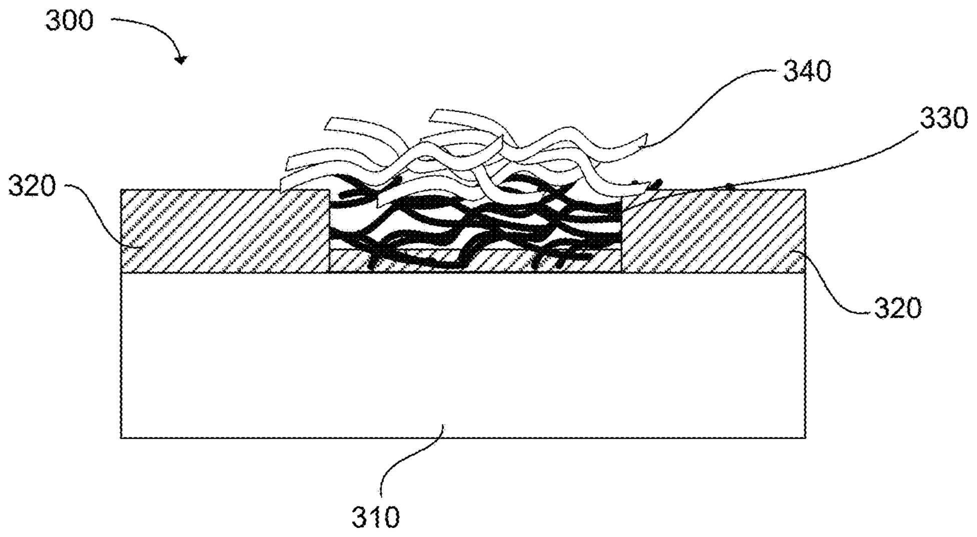

FIGS. 3A-3B show another example sensor 300. This sensor includes interdigitated electrodes 320. The electrodes can be formed as patterned metal layers on the support substrate 310. FIG. 3A shows the substrate and the electrodes without the overlying layers for clarity. FIG. 3B shows a cross-sectional side view of the sensor. This view shows the sensing layer 330 and the adsorption layer 340 deposited over the substrate and the electrodes. In this example, the electrodes include a main electrode body and fingers that extend from the main electrode body toward the opposite electrode. The fingers of the electrodes in this example have a smaller width than the main electrode body. However, in other examples, the electrode body and fingers can have the same thickness so that the entire electrode has a uniform thickness. In some cases, using interdigitated electrodes can increase the sensitivity of the sensor by allowing more electric current to pass between the electrodes through the sensing layer when a target molecule diffuses into the sensing layer.

Figure 4A:
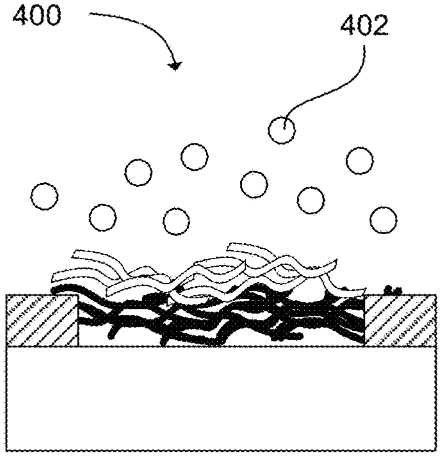
FIGS. 4A-4F show an overview of the operation of the sensor during a fentanyl detection event.
Figure 4B:
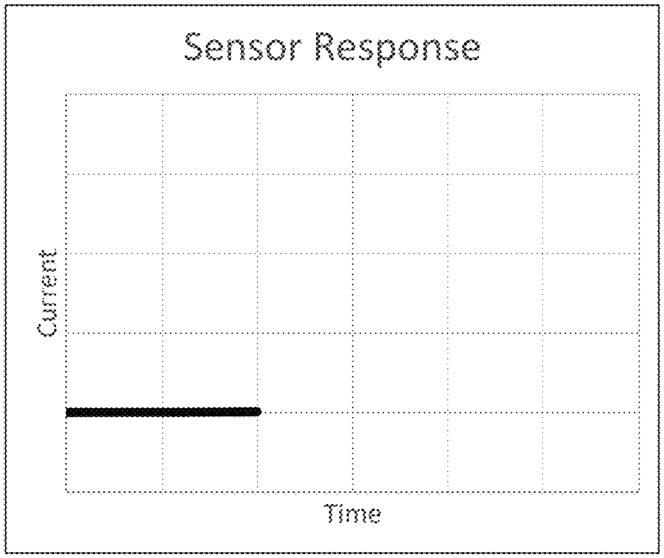
Figure 4C:
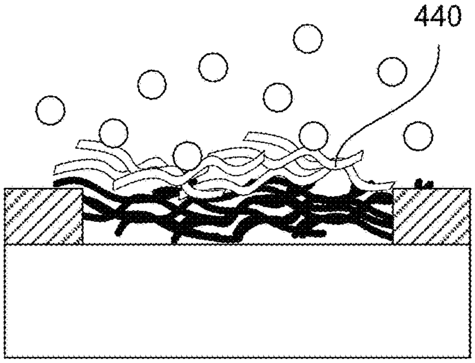
Figure 4D:
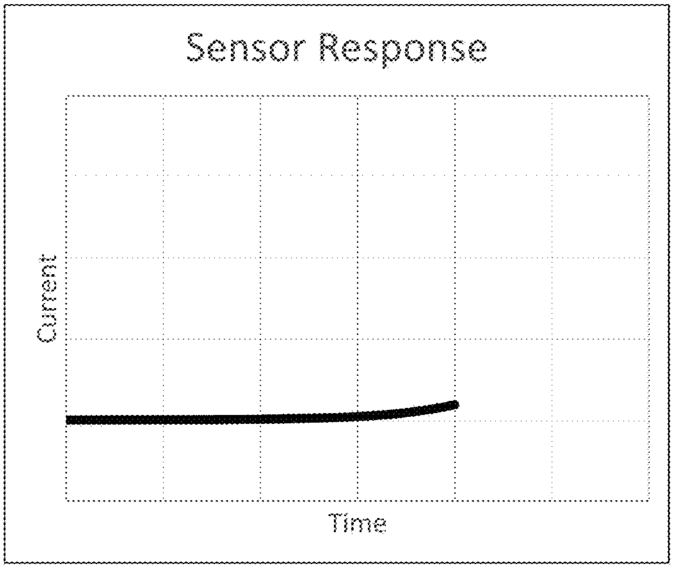
Figure 4E:
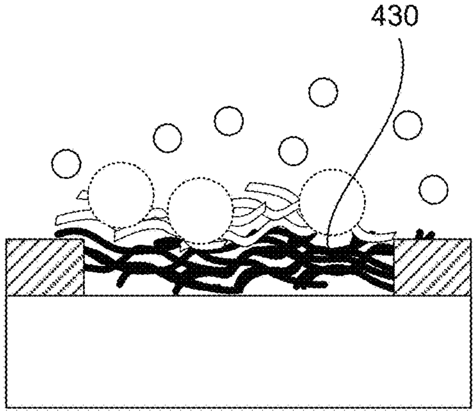
Figure 4F:
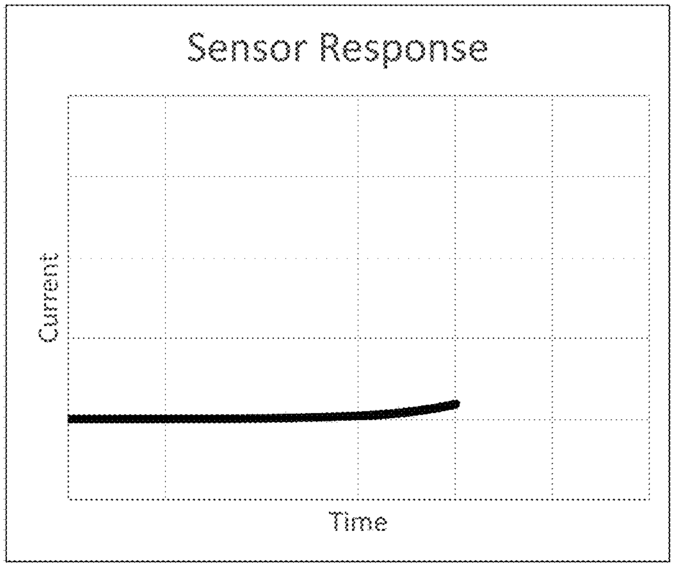

FIGS. 4A, 4C, and 4E show a schematic of the process of detection of fentanyl hydrochloride using a sensor 400, and an accompanying theoretical response from the sensor in FIGS. 4B, 4D and 4F, respectively. In FIG. 4A, fentanyl hydrochloride particles 402 are introduced to the sensor. In FIG. 4C, the fentanyl hydrochloride particles adsorb on the adsorption layer 440. A small response may occur as charge transfer might be possible between the nanofibers and particles. In FIG. 4F, the ion-exchange interaction occurs with the base-functionalized nanofibers converting fentanyl hydrochloride to its free base, releasing fentanyl to migrate to the sensing layer 430. The sensing nanofibers interact with the fentanyl molecules through charge transfer, causing an increase in the signal. This scheme enables airborne particles of nonvolatile materials such as fentanyl to be detected.

Figure 5:
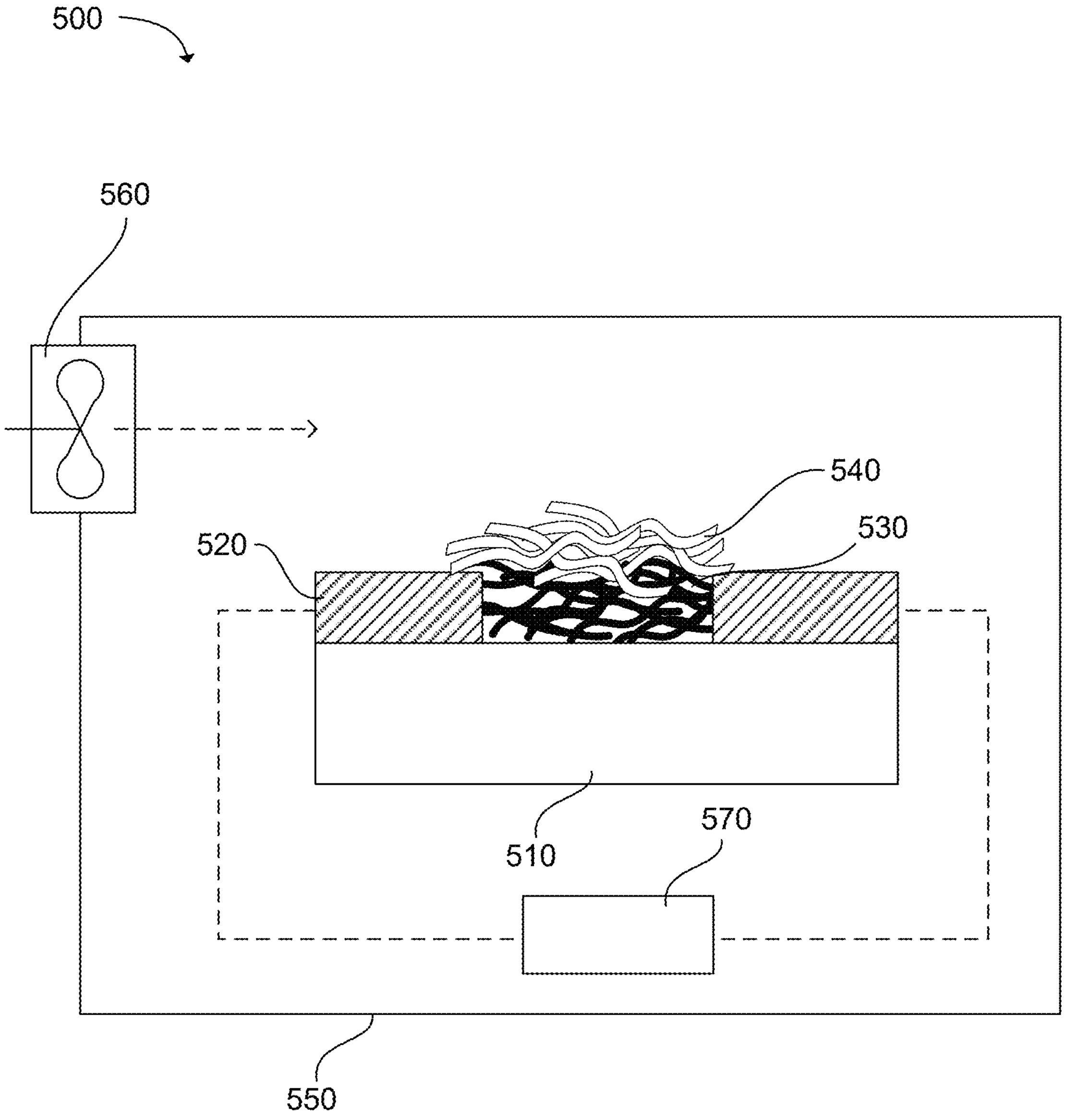
FIG. 5 is a schematic view of another example sensor in accordance with the present disclosure.

FIG. 5 shows another example sensor 500 that includes a support substrate 510, a pair of electrodes 520, a sensing layer 530, and an adsorption layer 540 as in the previous examples. This sensor also includes a housing 550 around the substrate, electrodes, sensing layer, and adsorption layer. A blower 560 is positioned to blow air into the housing so that the air contacts the adsorption layer. This can draw in particles of the target salt from the surrounding environment. The sensor also includes an alarm 570 connected to the electrodes and configured to trigger an alarm signal. The alarm signal can include a haptic alarm, visual alarm, auditory alarm, display, or a combination thereof.

In further detail regarding the target salt, the sensors described herein can be designed to detect a variety of target salts. The target salt can include a base component and an acid component. In various examples, the target salt can include hydrochloride, sodium, sulfate, acetate, phosphate, diphosphate, chloride, potassium, maleate, calcium, citrate, mesylate, nitrate, tartrate, aluminum, gluconate, perchlorate, or other acid or base components. In some examples, the target salt can be a salt of an alkaloid. In more specific examples, the target salt can be a salt of an opiate. In particular examples, the target salt can be fentanyl hydrochloride. The target salt can be in the form of solid particles. In some examples, the target salt can have an average particle size from about 0.1 μm to about 10 μm. In further examples, the average particle size can be from about 0.1 μm to about 5 μm, or from about 0.1 μm to about 1 μm, or from about 1 μm to about 5 μm, or from about 1 μm to about 10 μm. As used herein, the average particle size can refer to a number average of the longest dimension of the particle, if the particles are non-spherical, or the diameter of the particles if the particles are spherical.

The support substrate used in making the sensors can include a variety of rigid materials. In some examples, the support substrate can include glass, silicon, alumina, sapphire, mica, quartz, plastic, or a combination thereof. Alternatively, the support substrate can be a flexible substrate. Non-limiting examples of suitable flexible substrates can include polyethylene and MYLAR. The thickness and other dimensions of the substrate are not particularly limited. In some examples the substrate can have a thickness from about 0.1 mm to about 1 cm or from about 0.1 mm to about 2 mm.

As explained above, the sensor can include two layers of porous structured material. In many examples, the two layers can be made of two different porous structured materials, including a first porous structured material for the top adsorption layer and a second porous structured material for the bottom sensing layer. The first and/or second porous structured materials can include organic nanofibers, polymeric nanofibers, carbon nanotubes, silicon nanowires, metal oxide nanowires, boron nitride (BN) nanotubes, aerogels, xerogels, highly porous ceramics, metal-organic frameworks (MOF), glassy carbon, chalcopyrites, chalcogenides, or a combination thereof. The porous structured materials can also be functionalized with various functional groups. In some examples, the first porous structured material can be functionalized with basic functional groups to form a free base of the target salt when a target salt particle is adsorbed onto the first porous structure material. The second porous material can be made up of acidic nanofibers that can detect the free base of the target salt. Some examples of basic functional groups can include primary amino groups, secondary amino groups, tertiary amino groups, and combinations thereof. In some examples, the basic functional groups can include hexylamine, ethylethylamine, dimethylbutylamine, or a combination thereof. In certain examples, the first porous structured material can include organic nanofibers that include these functional groups.

In other examples, the first porous structured material can be functionalized with acidic functional groups to form a free acid of a target salt when a particle of the target salt is adsorbed on the first porous structured material. Non-limiting examples of acidic functional groups can include carboxylic acids, phenols, thiophenols, alkyl or aromatic phosphonic acids, alkyl phosphorothioic acids, and the like. As a general guideline, organic compounds with a pKa of less than 7.0 can be used as acidic functional groups.

The first porous structured materials can be made up of organic nanofibers in some examples. In certain examples, the first porous structured material can include first organic nanofibers assembled from stacked molecules selected from the group consisting of: 3,4,9,10-perylene-tetracarboxylic diimide, 3,4,9,10-perylene-tetracarboxylic dianhydride, perylene 3,4,9,10-tetracarboxyl-3,4-anhydride-9,10-imide, an indolocarbazole derivative, and an oligomer made up of 3 to 9 carbazole derivative monomers, wherein at least a portion of the stacked molecules are further functionalized with basic functional groups. In certain examples, the first organic nanofibers can be assembled from stacked molecules having one of the following structures:

(I)

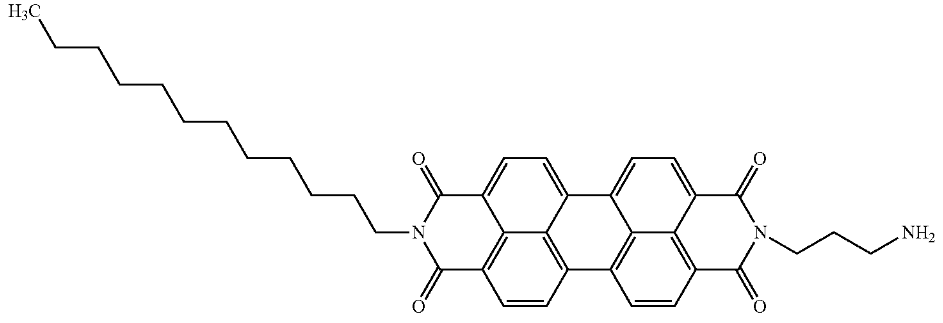

-continued
(II)
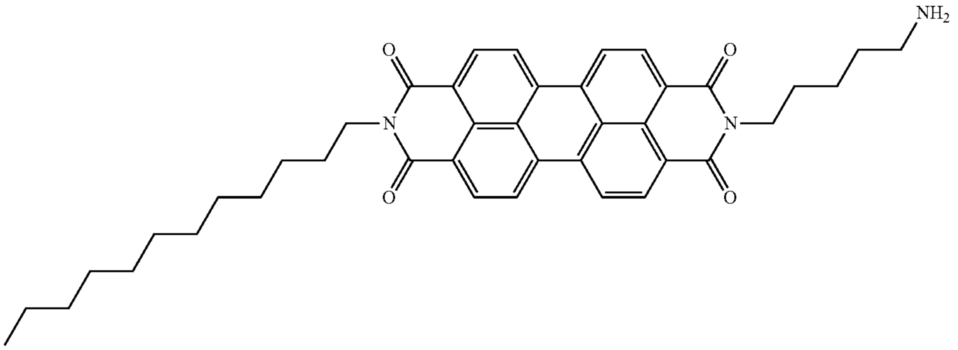
(III)
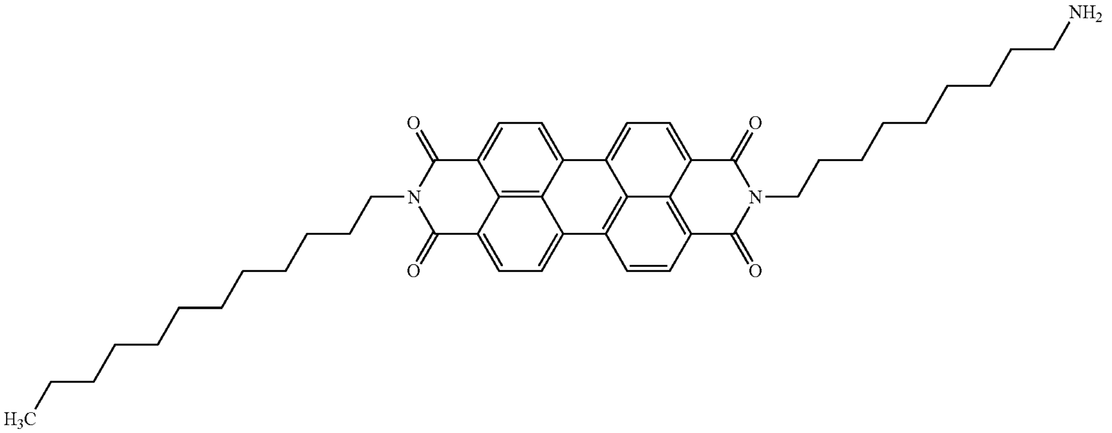
(IV)
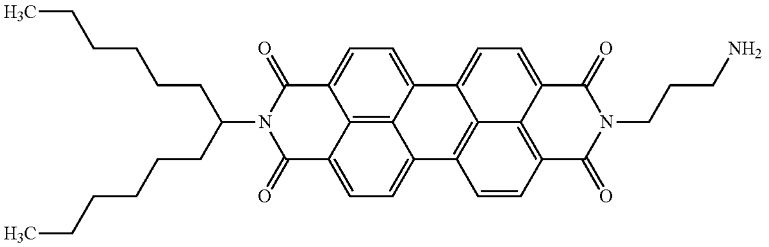
(V)
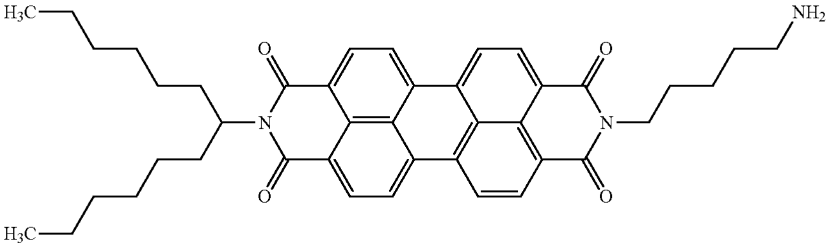
(VI)
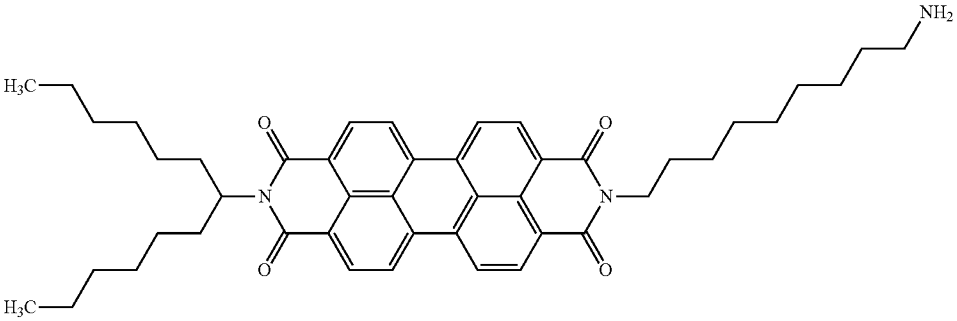

-continued
(VII)
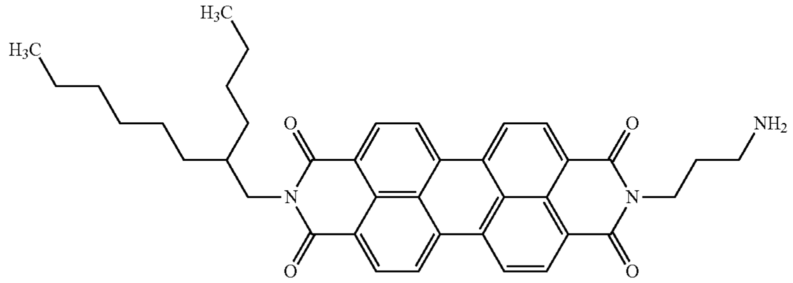
(VIII)
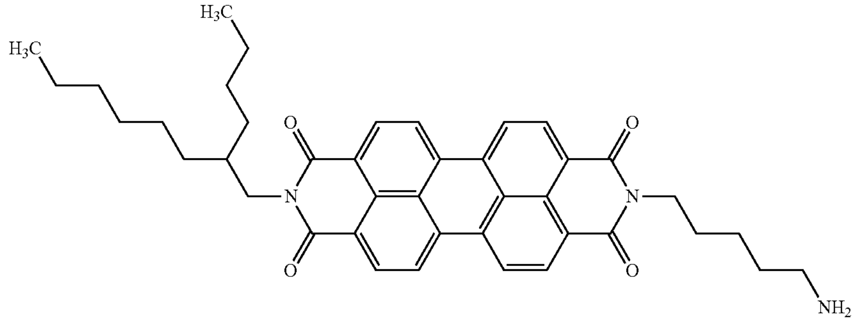
(IX)
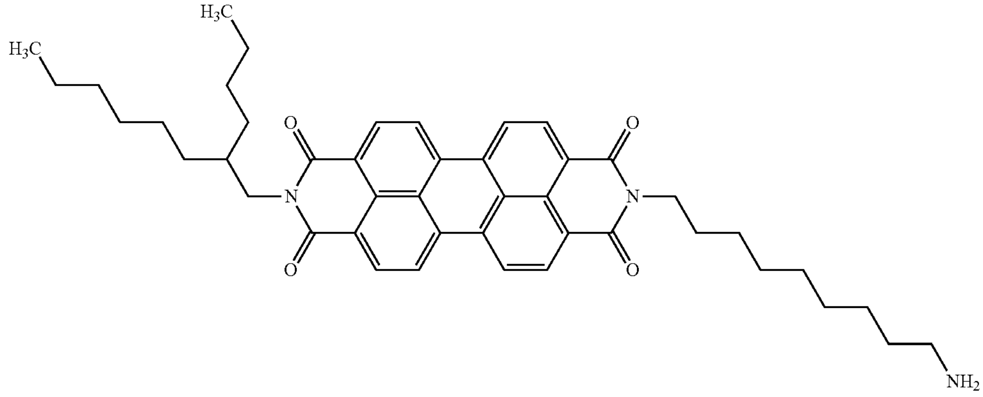
(X)
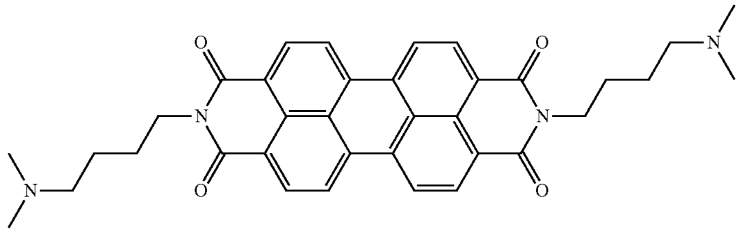
(XI)
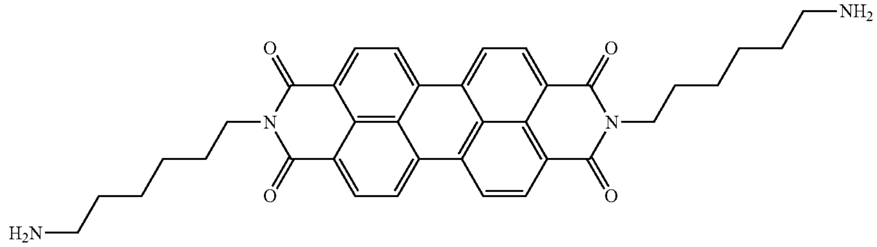

-continued (XII)

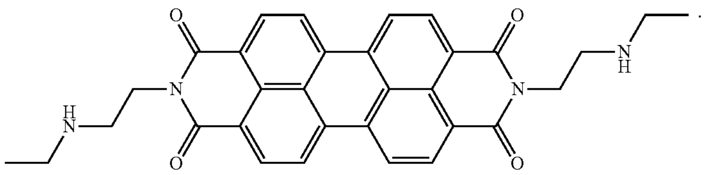

The adsorption layer can have a thickness that is sufficient to capture particles of the target salt and allow a basic or acidic component of the target salt to diffuse to the sensing layer. In some examples, the adsorption layer can have a thickness from about 50 nm to about 5 µm. In other examples, the adsorption layer can have a thickness from about 50 nm to about 1 µm, or from about 50 nm to about 500 nm, or from about 1 µm to about 5 µm. In further examples, the adsorption layer can have a mass per area of about 0.1 µg to 6 µg per 3 $mm^2$. The area of the adsorption layer can be from about 0.1 $mm^2$ to 10 $mm^2$, or from about 0.1 $mm^2$ to 1 $mm^2$, or from about 1 $mm^2$ to 10 $mm^2$, in some examples. The adsorption layer can also have a pore size from about 10 nm to about 1 µm, or from about 10 nm to about 500 nm, or from about 10 nm to about 100 nm, in some examples.

In further examples, the sensing layer can be made up of a second porous structured material. In certain examples, the second porous structured material can include second organic nanofibers assembled from stacked molecules selected from the group consisting of: substituted or unsubstituted 3,4,9,10-perylene-tetracarboxylic diimide, substituted or unsubstituted 3,4,9,10-perylene-tetracarboxylic dianhydride, substituted or unsubstituted perylene 3,4,9,10-tetracarboxyl-3,4-anhydride-9,10-imide, an indolocarbazole derivative, and an oligomer made up of 3 to 9 carbazole derivative monomers. In further examples, the second porous structured material can include second organic nanofibers assembled from stacked molecules having one of the following structures:

(XIII)

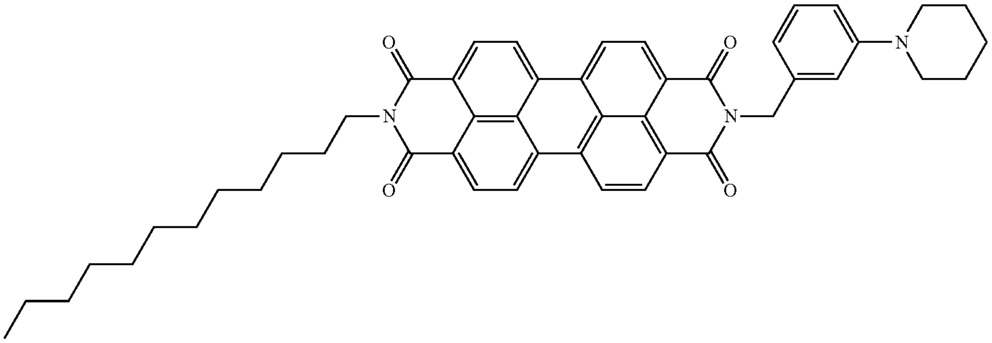

(XIV)

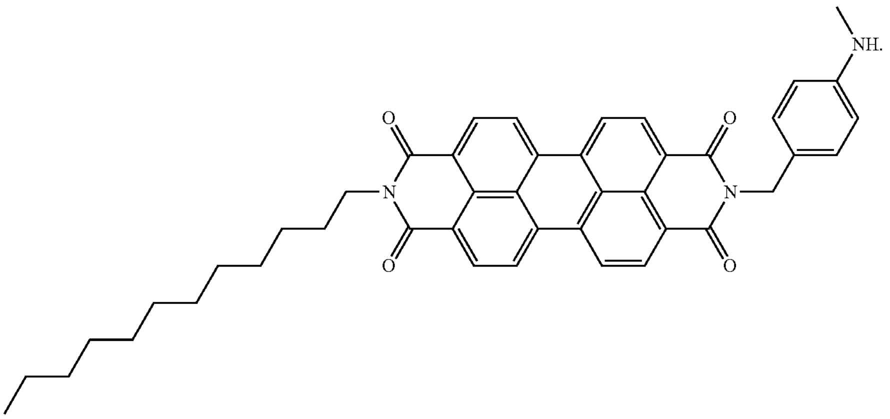

The sensing layer can have a thickness from about 50 nm to about µm, or from about 50 nm to about 1 µm, or from about 1 µm to about 5 µm, in some examples. In further examples, the sensing layer can have a mass per area from about 0.1 µg to about 6 µg per 3 $mm^2$.

The electrodes of the sensor can be formed by depositing an electrically conductive material onto the substrate to form two electrodes that are separated by a gap. As explained above, the gap can be bridged by the sensing layer so that an electric current can pass from one electrode to the other through the sensing layer. In some examples, the electrodes can be made of gold, titanium, indium tin oxide, indium zinc oxide, tungsten, aluminum, platinum, silver, copper, PEDOT:PSS, or a combination thereof. The thickness of the electrode material is not particularly limited. In some examples, the electrode material can be deposited at a thickness from about 5 nm to about 100 μm. In further examples, the electrodes can be separated by a gap distance that is from about 50 nm to about 100 μm.

Examples

Three new molecules for adsorption layer nanofibers for the bilayer sensors were synthesized and the structures were confirmed using nuclear magnetic resonance spectroscopy. Nanofibers were grown by injecting a concentrated solution of the molecules into a nonsolvent. The nonsolvent caused the molecules to precipitate. Growth was primarily in one direction because of the planar, pi-conjugated structures of the molecules, leading to the formation of nanofibers. Once the correct assembly conditions had been determined, each nanofiber was coated onto electrodes and characterized using scanning electron microscope (SEM) imaging and electrical characterization.

Fabrication of bilayer sensors can be accomplished using any suitable technique. For example, a suspension of nanofibers can be coated onto the electrodes to form each layer. The coating layer can be sufficient to provide complete coverage (i.e. filling the gap between electrodes and fully covering an underlying coated layer while achieving the target thickness). Excessive thickness can increase response time and reduce sensitivity due to increased diffusion times, depending on the nanofiber network density and porosity of materials used.

Fentanyl detection can be accomplished using sensors that respond to fentanyl hydrochloride particles in the environment. The Blaumstein Atomizer (BLAM) uses a solution to generate aerosol particles with diameters between 0.7-2.5 μm, which are the size relevant to respiratory inhalation. Once aerosolized, the mist is routed into a diffusion dryer that removes solvent, producing dry particles at the outlet. Concentration is controlled by changing the injection rate into the BLAM or by diluting the sample air.

Particles were generated using a simulant of fentanyl in solution. Prior to testing, the hydrochloride particles of the simulant created by the particle generator was quantified using a DUSTTRAK™ II particle counter from TSI Incorporated (USA). Three different concentrations were tested to demonstrate if a dose-dependent response existed. The concentrations were: 1-2, 2-4, and 8-16 mg/$m^3$.

Fentanyl is often found in the presence of a cutting agent, which can potentially interfere with the sensors. Using the same test fixture described above, several interferents were tested for potential cross-reactivity. Metamizole, mannitol, lactose, and baking soda were tested at concentrations 10× higher than the concentration used for the fentanyl simulant.

Figure 6A:
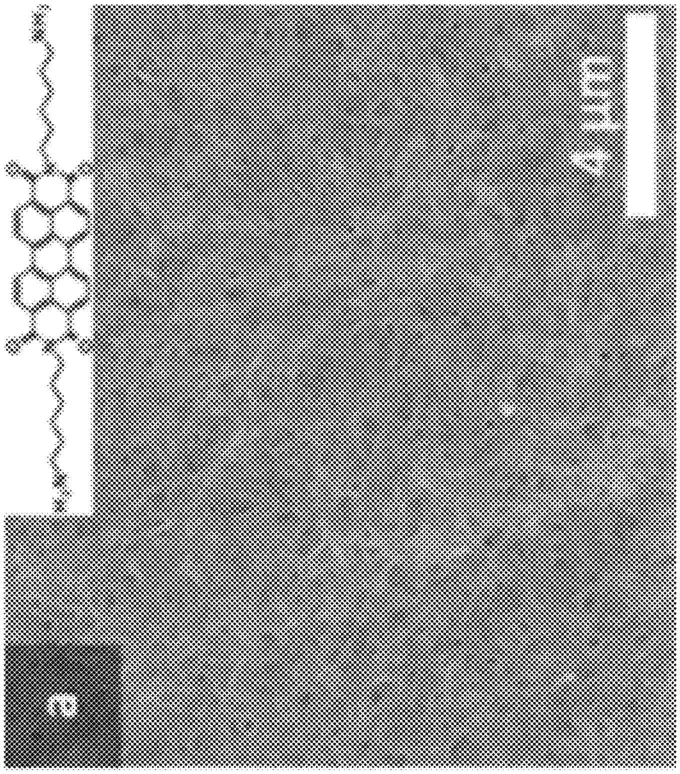
FIGS. 6A-6D show chemical structures with SEM images of Bis(N-hexylamine) nanofiber (FIG. 6A); Bis(N-ethylethylamine) nanofiber (FIG. 6B); Bis(N-propylpropylamine) nanofiber (FIG. 6C); Bis(N,N-dimethylbutylamine) (FIG. 6D). All images are on the same scale.
Figure 6B:
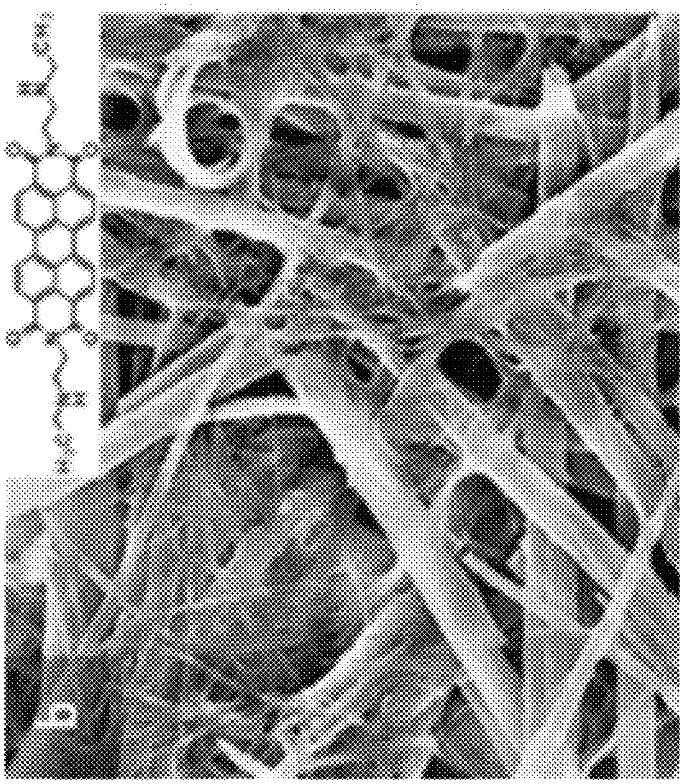
Figure 6D:
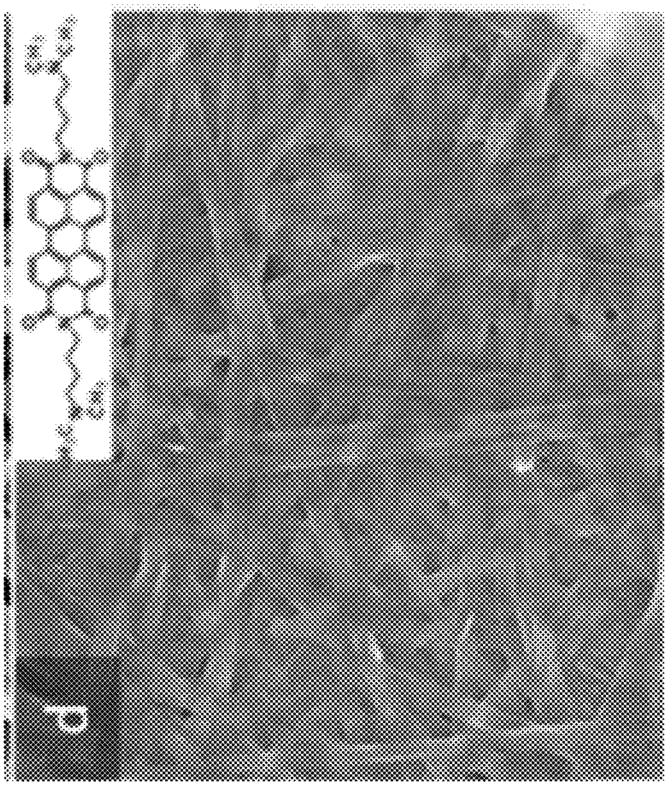
Figure 6C:
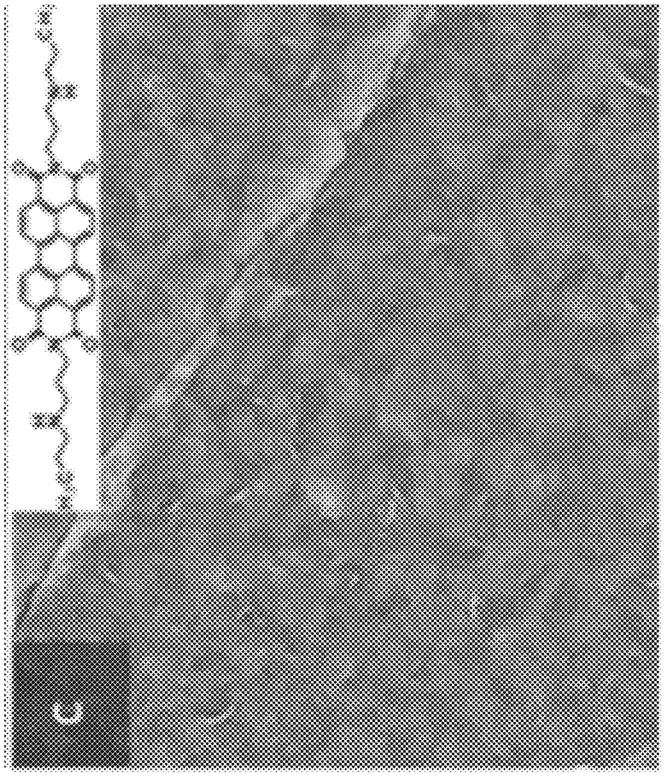

Each newly synthesized adsorption layer nanofiber had a unique morphology and exhibited a variety of properties. Molecular structures and SEM images of each new adsorption layer are included in FIGS. 6A-6D. Surface area, porosity, and activity of the functional groups are all factors to consider in choosing nanofibers for a particular target compound. Variations of each can improve or decrease sensitivity and selectivity of the binding and can be adjusted for a particular target. The Bis(N-hexylamine) nanofiber is shown in FIG. 6A. FIG. 6B displays the bis(N-ethylethylamine) nanofiber. FIG. 6C shows bis(N-propylpropylamine) nanofiber. FIG. 6D displays the bis(dimethylbutylamine) nanofiber and has a morphology that is between the nanofibers shown in FIGS. 6A and 6B.

Figure 7A:
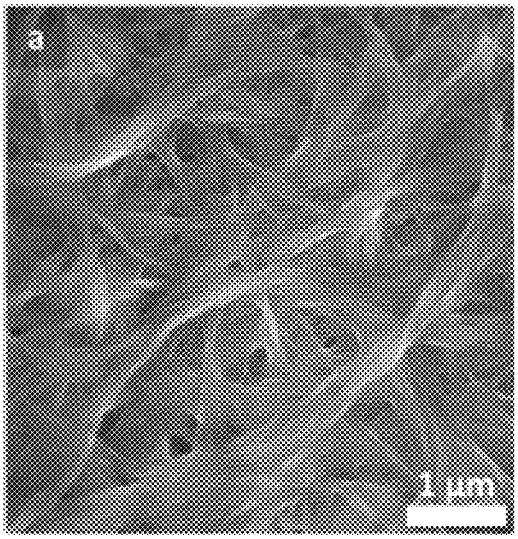
FIG. 7A is an SEM image of a sensing layer nanofiber coated onto an electrode.
Figure 7B:
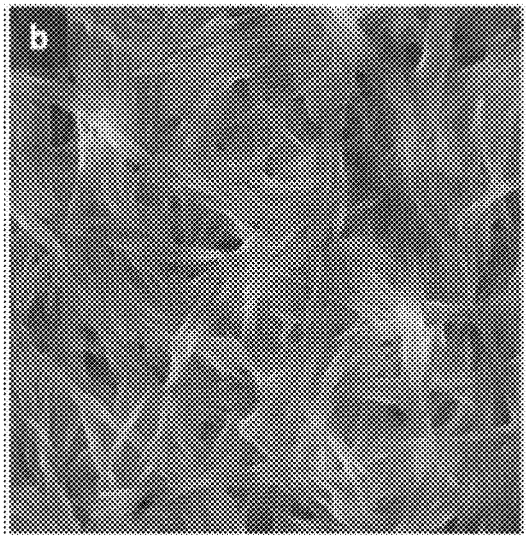
FIG. 7B is an SEM image of a sensing layer nanofiber after undergoing a second coating process using ethanol without any nanofibers.
Figure 8A:
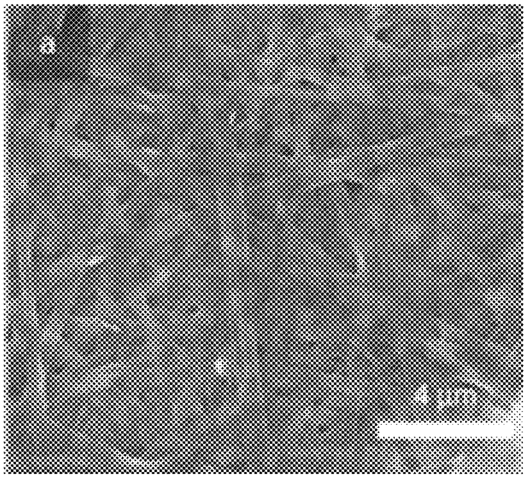
FIGS. 8A and 8B are SEM images of bis-N—N-dimethylbutylamine adsorption layer and sensing layer nanofiber controls.
Figure 8B:
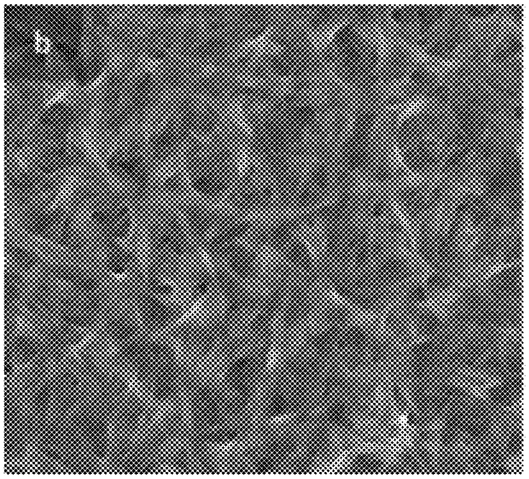
Figure 8C:
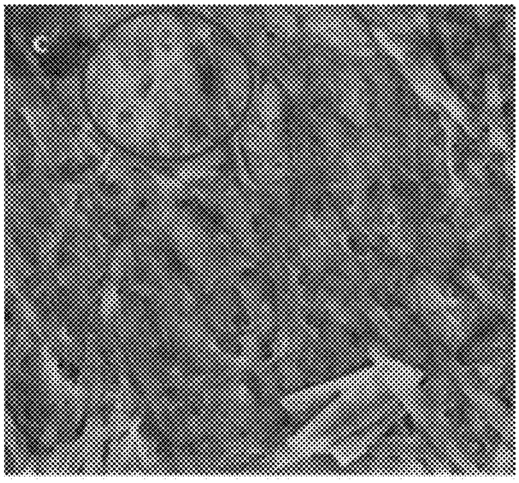
FIG. 8C is an SEM image of bilayers at 1 μg adsorption layer mass.
Figure 8D:
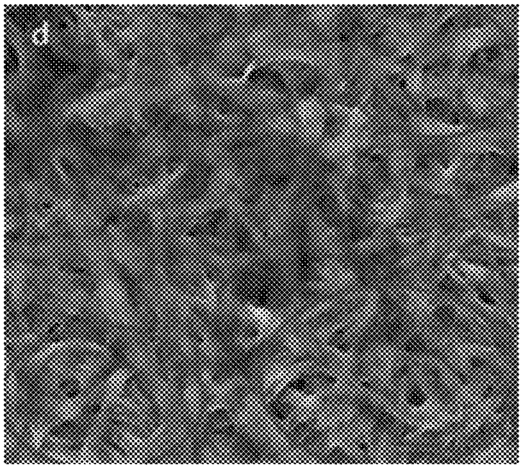
FIG. 8D is an SEM image of bilayers at 3 μg adsorption layer mass. Sensing layers can be seen through the pores in the adsorption layer and are marked in circles. All images are on the same scale.

FIG. 7A shows an example of a sensing layer that was coated onto an electrode, and FIG. 7B shows the sensing layer after undergoing a second coating process using ethanol without any nanofibers as a control.

Bilayer sensors were then fabricated from the sensing and adsorption layer nanofibers using the standard 6 μg of nanofiber material for both layers. Prior to fabricating bilayer sensors, a sensing and an adsorption layer gave current measurements of 1.1 nA and 130 μA, respectively. After fabricating bilayer sensors, the sensors' current increased two orders of magnitude to 180 nA. The increase in current appears to be caused by the adsorption layer nanofiber doping the sensing layer, subsequently increasing the sensing layer's electron density and the overall conductivity of the bilayer sensor. Alternatively, the adsorption layer can carry most of the current because it is more conductive. This second case is less likely because it is difficult for charges to move normal to the plane of the electrodes. Significant doping of the sensing layer can reduce the bilayer's sensitivity to fentanyl, so the amount of adsorption layer material was decreased to reduce the change in current of the sensors. Thinner films of adsorption layer may also facilitate the transfer of free base fentanyl to the sensing layer, which is expected to be a diffusion-limited process.

Uniform bilayers were created by using 1 and 3 μg of the bis-N,N-dimethylbutylamine adsorption layer nanofibers and all three of the sensing layers; the SEM images of the bilayer sensors are included in FIGS. 8A-8D. The sensing layer can clearly be seen at the top of the image in the 1 μg bilayer sample displayed by FIG. 8C. Sensing layer nanofibers are visible through the adsorption layer pores in several other points of this image. Distinguishing the sensing layer control in the 3 μg sample (shown in FIG. 8D) is more difficult, but it can be seen at the corners of the image, indicating that it is not thick enough to fully obscure the sensing layer. Both masses of adsorption layer material create uniform films and still expose the underlying sensing layer.

Figure 9A:
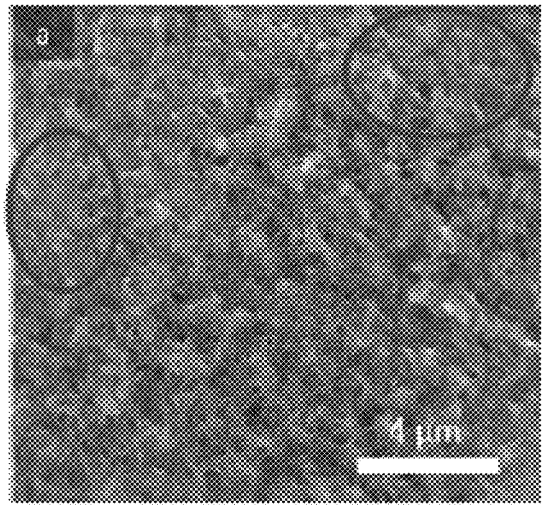
FIG. 9A is an SEM images of the bis-butylamine nanofiber in a 1 μg amount on a sensing layer nanofiber. Ovals have been included that point out the sensing layer nanofiber that is visible below the adsorption layer.
Figure 9B:
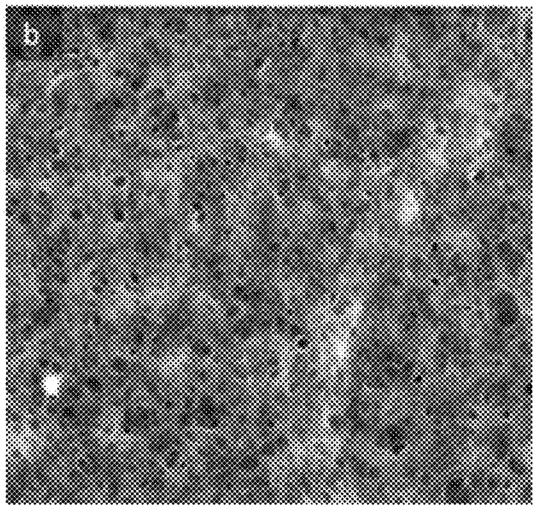
FIG. 9B is an SEM images of the bis-butylamine nanofiber in a 3 μg amount on a sensing layer nanofiber.
Figure 9C:
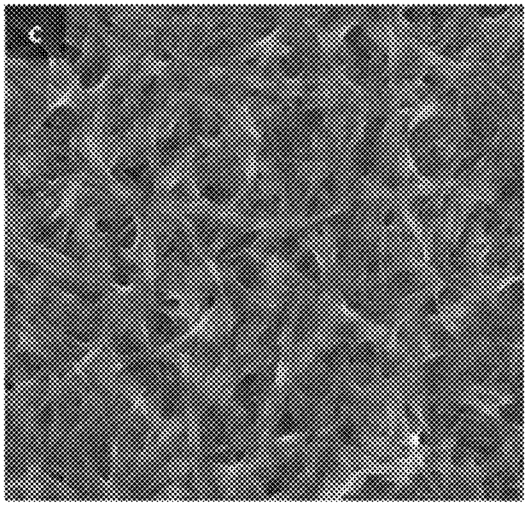
FIG. 9C is an SEM image of a single sensing layer nanofiber. All images are on the same scale.

Samples using 1 (FIG. 9A) and 3 μg (FIG. 9B) of adsorption layer material coating a sensing layer (Compound 1) were also made with the bis-butylamine nanofiber and the results are included in FIGS. 9A and 9B. FIG. 9C shows the sensing layer before the adsorption layer was applied. The 1 μg samples completely covered the sensing layer but did have a small amount of the underlying sensing layer visible. After increasing the adsorption layer to 3 μg of nanofiber material, the sensing layer was completely obscured by the adsorption layer. However, complete coverage may not be an issue as long as the adsorption layer is not too thick, since the porosity of the adsorption layer can still allow for efficient diffusion of the fentanyl free base.

Figure 10A:
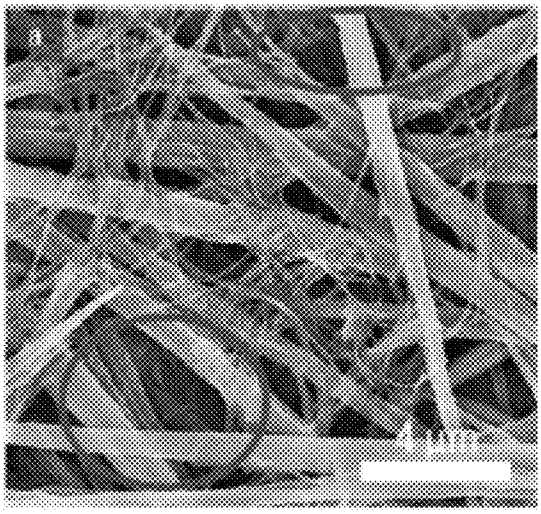
FIG. 10A is an SEM images of the bis-(N-ethylethylamine) nanofiber in a 1 μg amount on a sensing layer nanofiber. Ovals have been included that point out the sensing layer nanofiber that is visible below the adsorption layer.
Figure 10B:
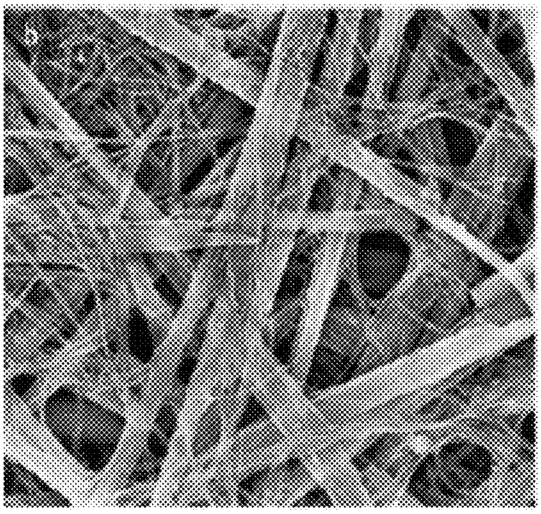
FIG. 10B is an SEM images of the bis-(N-ethylethylamine) nanofiber in a 3 μg amount on a sensing layer nanofiber.
Figure 10C:
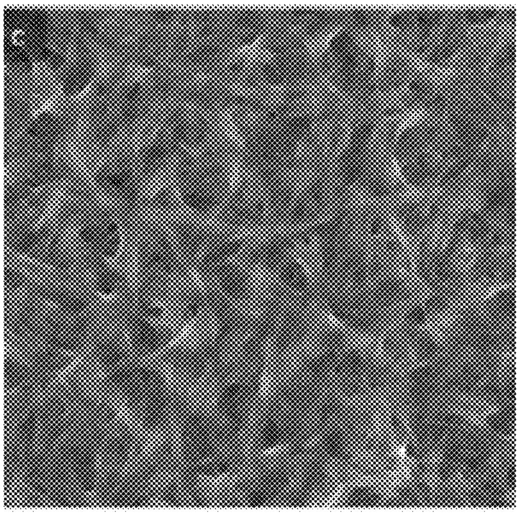
FIG. 10C is an SEM image of a single sensing layer nanofiber. All images are on the same scale.

Bilayer samples of the bis(N-ethylethylamine) nanofiber coated onto a sensing layer at 1 (FIG. 10A) and 3 μg (FIG. 10B) loadings are shown in FIGS. 10A and 10B. The underlying sensing layer is identified by the red ovals. FIG. 10C shows the entire sensing layer before the adsorption layer was applied. Due to the bis(N-ethylethylamine)'s large diameter nanofibers, fentanyl particles will have less surface area to adsorb to but a potentially more efficient route for fentanyl to migrate to the sensing layer. There is no easily identifiable sensing layer visible in the 3 μg adsorption layer bilayer sample, but the porosity of the bis(N-ethylethylamine) nanofiber is expected to facilitate diffusion. The sensing layer may not be observable because of the depth of field of the SEM. Because this material is less densely packed than the others, it would be expected to produce a thicker film given the same mass of nanofibers.

Figure 11:
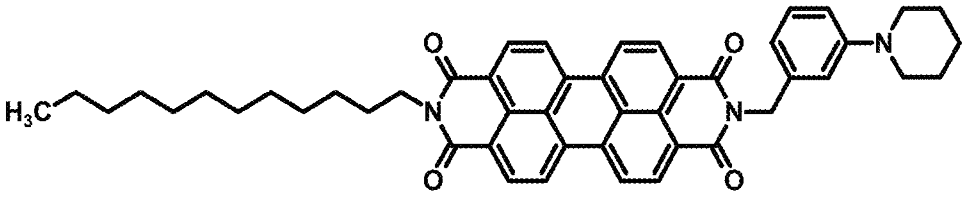
FIG. 11 illustrates several example molecular structures used in the sensing and adsorption layer nanofibers in several example sensor array cards.
Figure 11:
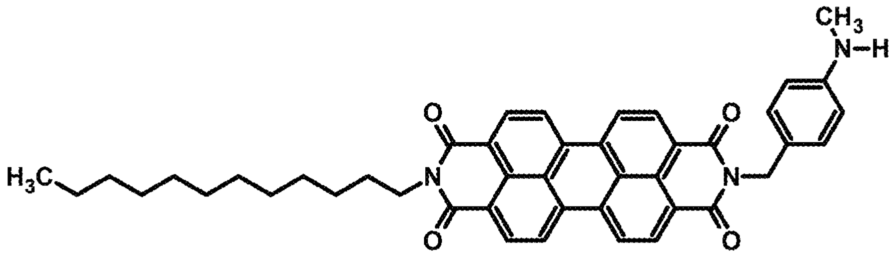
Figure 11:
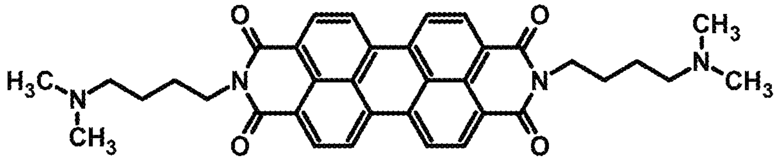
Figure 11:
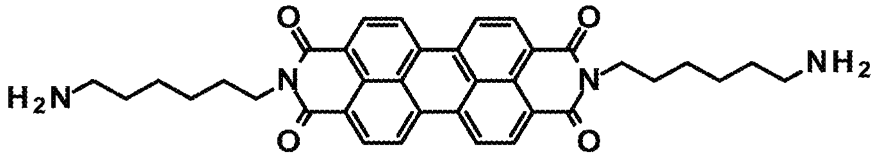
Figure 11:
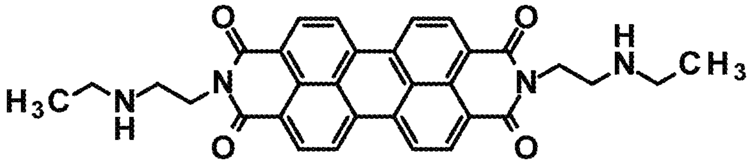

FIG. 11 displays the molecular structures and internal names of the sensing and adsorption layer nanofibers chosen for testing.

Figure 12:
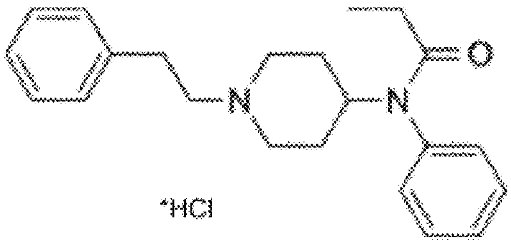
FIG. 12 shows fentanyl and fentanyl simulants including Fentanyl HCl, Norfentanyl HCl, N-Benzyl-2-methylpropenamide N-{1-[2-(4-hydroxyphenyl)ethyl]piperidin-4-yl}-N-phenylpropanamide, and Benzyl fentanyl.
Figure 12:
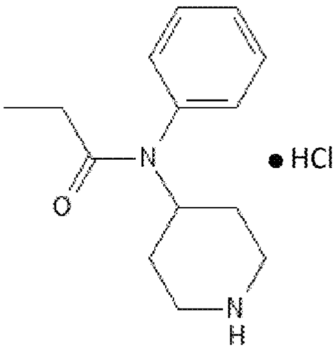
Figure 12:
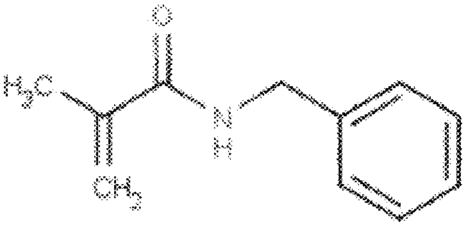
Figure 12:
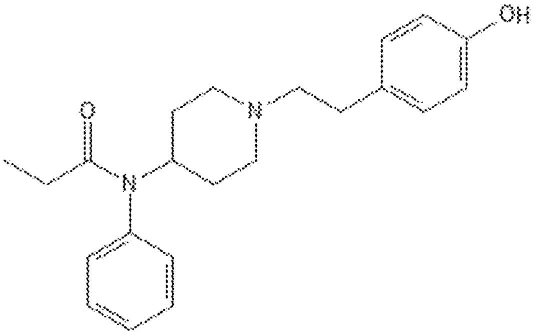
Figure 12:
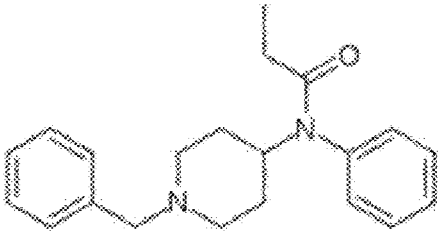

A fentanyl simulant was selected that is expected to elicit a similar response to fentanyl. A simulant was required for initial testing for safety and licensing reasons. Four different candidates were identified that had similar structures to fentanyl, which are shown in FIG. 12. Candidates for fentanyl simulants were: norfentanyl HCl (2 in FIG. 12), N-Benzyl-2-methylpropenamide (3 in FIG. 12), N-{1-[2-(4-hydroxyphenyl)ethyl]piperidin-4-yl}-N-phenylpropanamide (4 in FIG. 12), and benzyl fentanyl (5 in FIG. 12). Compound 3 in FIG. 12 was ultimately chosen because 4 in FIG. 12 has a phenol group that the nanofibers may detect and 2 turned out to be a controlled substance.

The fentanyl simulant was tested at three different concentrations (1-2, 2-4, and 8-16 mg/$m^3$), as well as with three different interferents, being: D-mannitol, metamizole, and alpha-D Lactose.

Figure 13A:
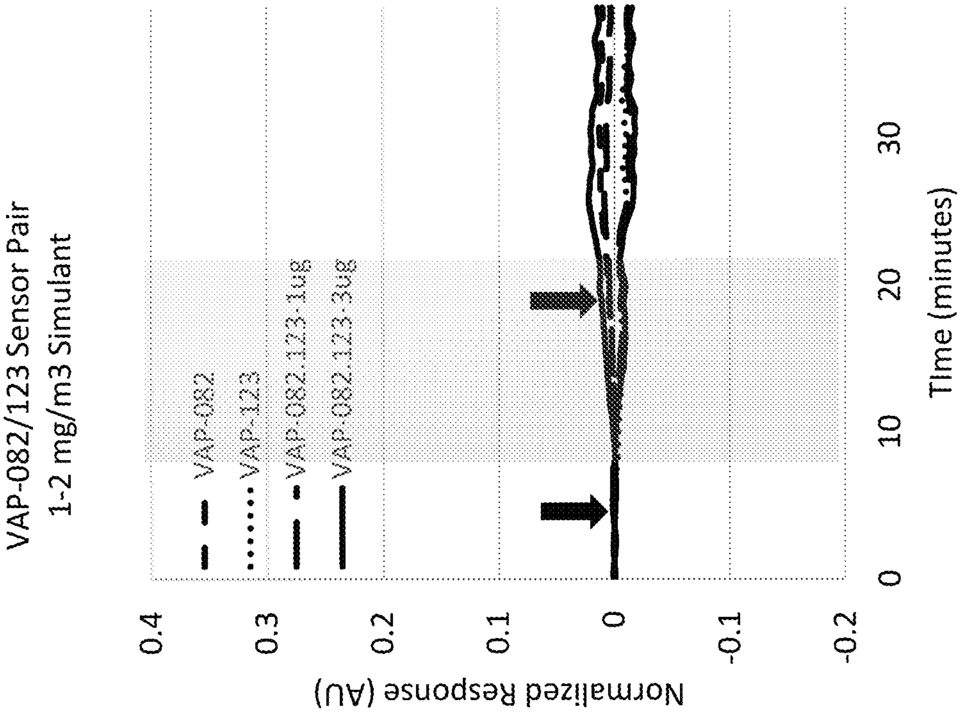
FIG. 13A shows sensing results from exposing a sensor to 1-2 $mg/m^3$ of simulant using Compound 2 as the sensing layer and Compound 4 as the adsorption layer, with 1 and 3 μg of adsorption layer material used for the bilayer sensors.
Figure 13B:
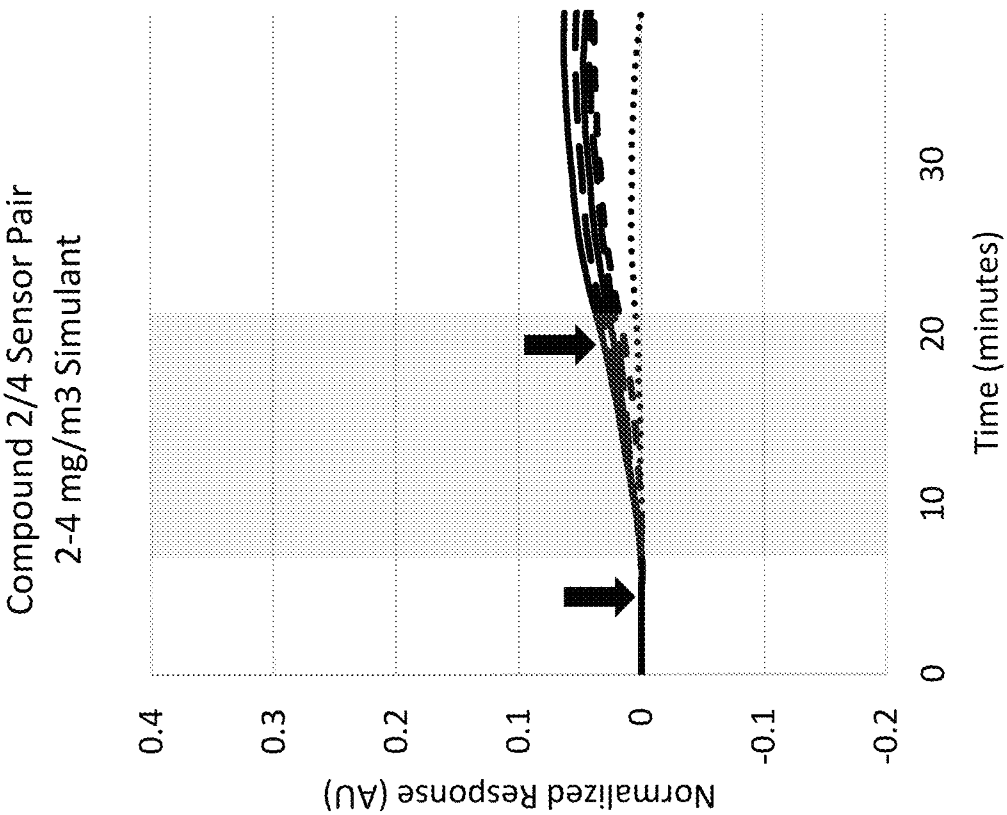
FIG. 13B shows sensing results from exposing a sensor to 2-4 $mg/m^3$ of simulant using Compound 2 as the sensing layer and Compound 4 as the adsorption layer, with 1 and 3 μg of adsorption layer material used for the bilayer sensors.
Figure 13C:
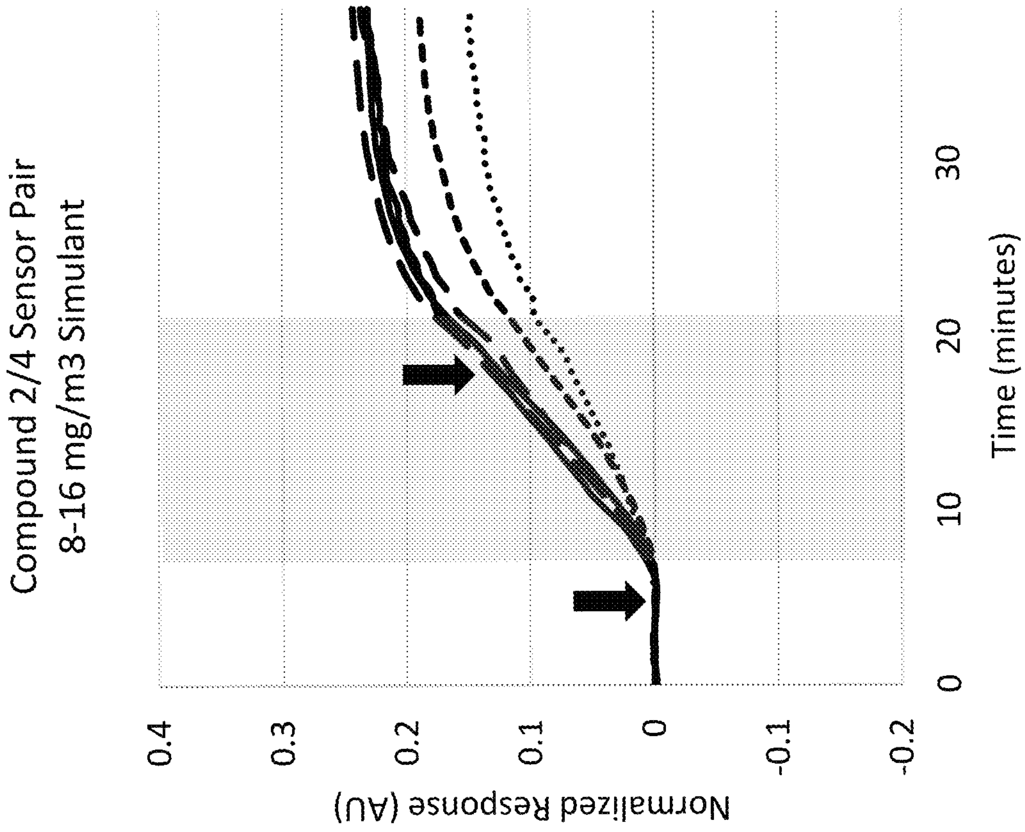
FIG. 13C shows sensing results from exposing a sensor to 8-16 $mg/m^3$ of simulant using Compound 2 as the sensing layer and Compound 4 as the adsorption layer, with 1 and 3 μg of adsorption layer material used for the bilayer sensors.

FIGS. 13A-13C shows the sensor response for the various experiments that were performed. The beginning of the experiment starts by injecting pure solvent. The first black arrow (left side) indicates the baseline zero point and corresponds to when the valve is turned on and the sample syringe is started for target analyte delivery. Because it takes time for the sample to reach the atomizer, the grey box indicates the time duration the nanofibers are expected to receive analyte particles based on the flow rates of the syringe pump. Finally, the second black arrow (right side) indicates when the sample syringe pump is turned off and the valve is activated to stop the flow of analyte solution to the atomizer.

Sensing results for the Compound 2 sensing layer and Compound 4 adsorption layer combinations at each simulant concentration are included in FIGS. 13A-13C. The first observation that can be made is that the Compound 4 adsorption layer control had a dose-dependent response that was more apparent in FIGS. 13B and 13C. There appeared to be little to no response in the smallest concentration (FIG. 13A). Compared to the rest of the adsorption layer functional groups, Compound 4's amine functional group on the end of the alkyl chains has the greatest potential response to the free base molecules because it has the greatest ability to drive the ion exchange interaction with fentanyl hydrochloride particles and can also respond to free base fentanyl.

The Compound 2/4 bilayer pairs also exhibit a dose-dependent response that increases as the concentration increases. In this case, the bilayers clearly performed better than the control in FIG. 13C. The bilayer pairs for Compound 4 appear to have the most separation from the Compound 2 control at the highest concentration (FIG. 13C) but lack significant separation in the lower two concentrations (FIG. 13A and FIG. 13B).

Figure 14A:
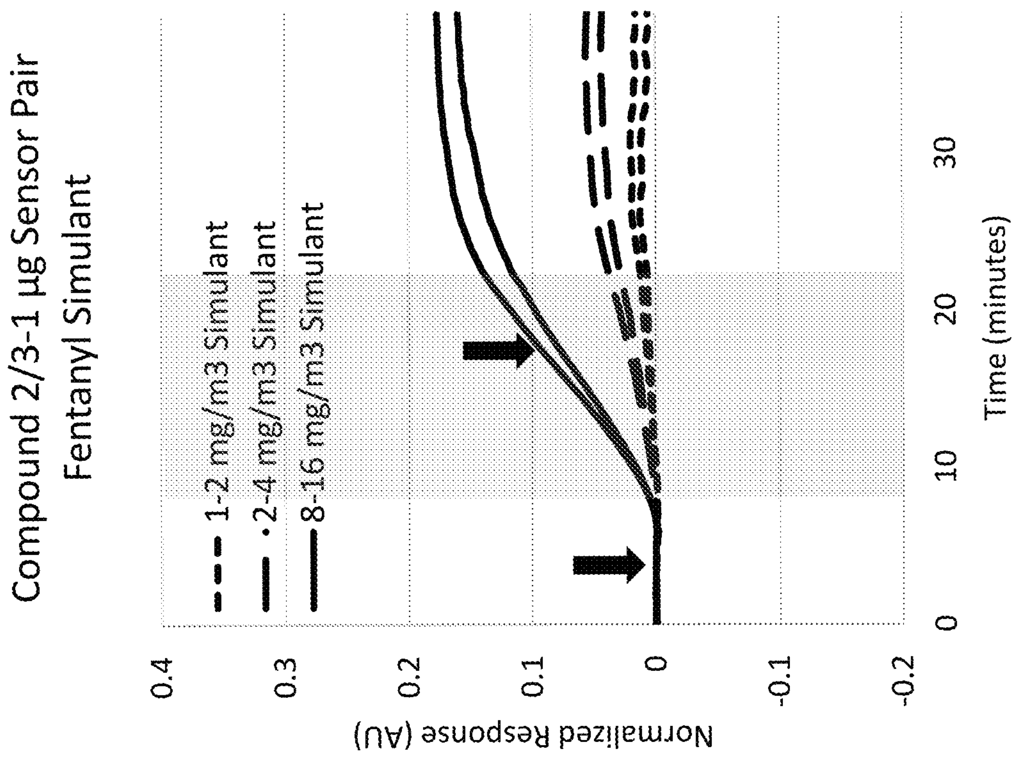
FIG. 14A shows concentration dependence for a bilayer sensor with Compound 2 as the sensing layer and Compound 3 as the adsorption layer.
Figure 14B:
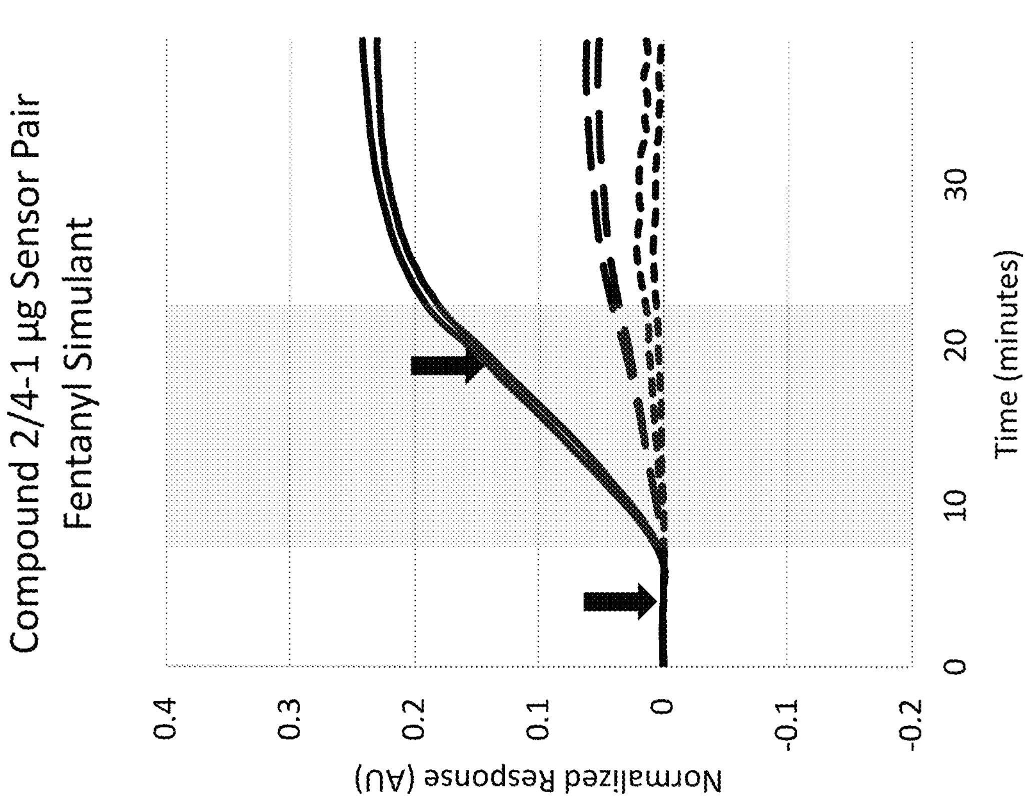
FIG. 14B shows concentration dependence for a bilayer sensor with Compound 2 as the sensing layer and Compound 4 as the adsorption layer.
Figure 14C:
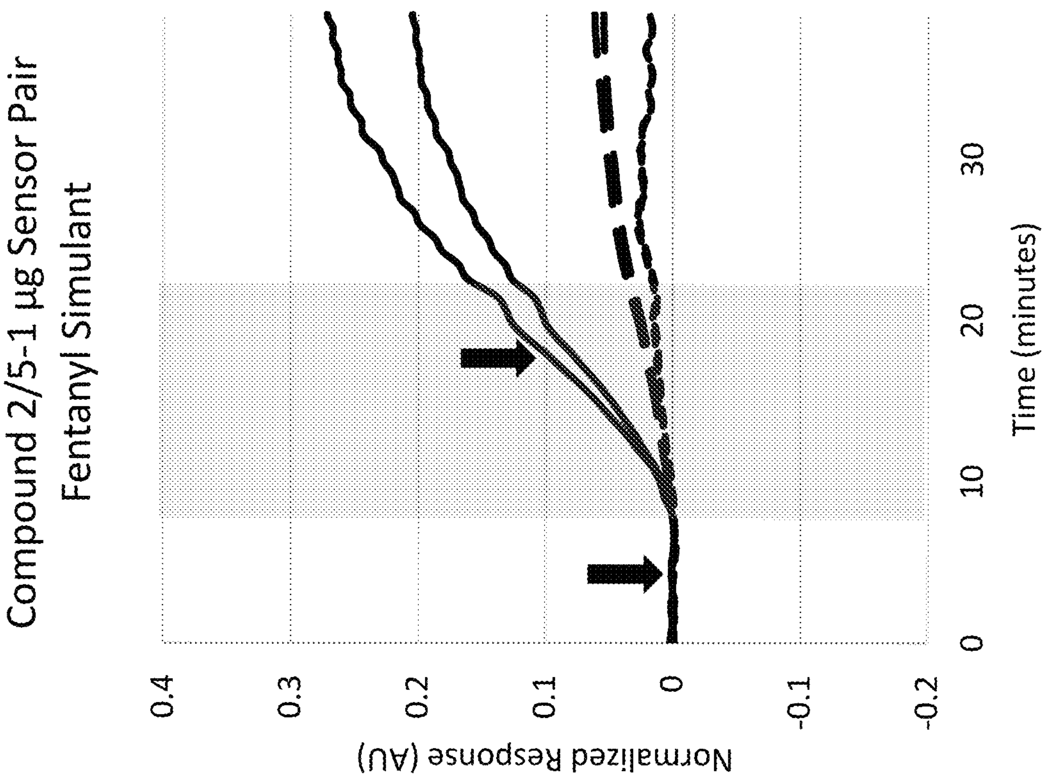
FIG. 14C shows concentration dependence for a bilayer sensor with Compound 2 as the sensing layer and Compound 5 as the adsorption layer.

FIG. 14A shows sensor response for sensors formed with a Compound 2/3 bilayer pair; FIG. 14B shows sensor response for a Compound 2/4 bilayer pair; and FIG. 14C shows sensor response for a Compound 2/5 bilayer pair.

Figure 15:
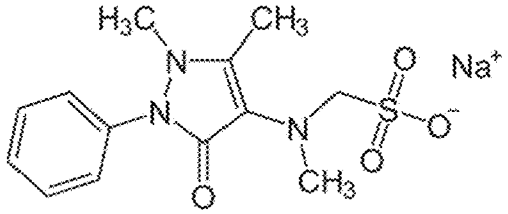
FIG. 15 shows fentanyl cutting agents tested to determine responses from interferents.
Figure 15:
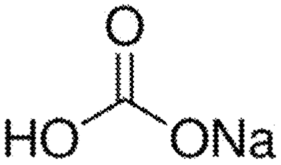
Figure 15:
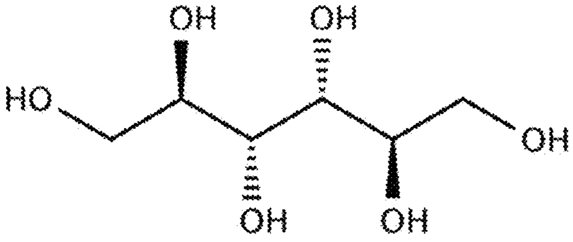
Figure 15:
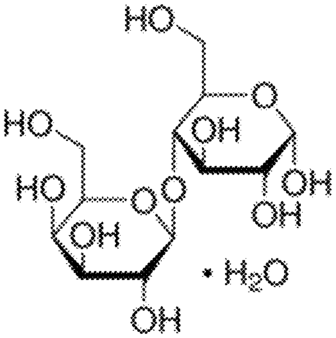

Four potential interferents (D-mannitol, sodium bicarbonate, metamizole, and alpha-D lactose) were tested at 10-20 mg/$m^3$, roughly ten times higher than the lowest concentrations tested for the fentanyl simulant. These interferents were tested because they are common cutting agents for final fentanyl-based formulations that are encountered in real world distribution of this opioid. Molecular structures for all four are included in FIG. 15.

Figure 16B:
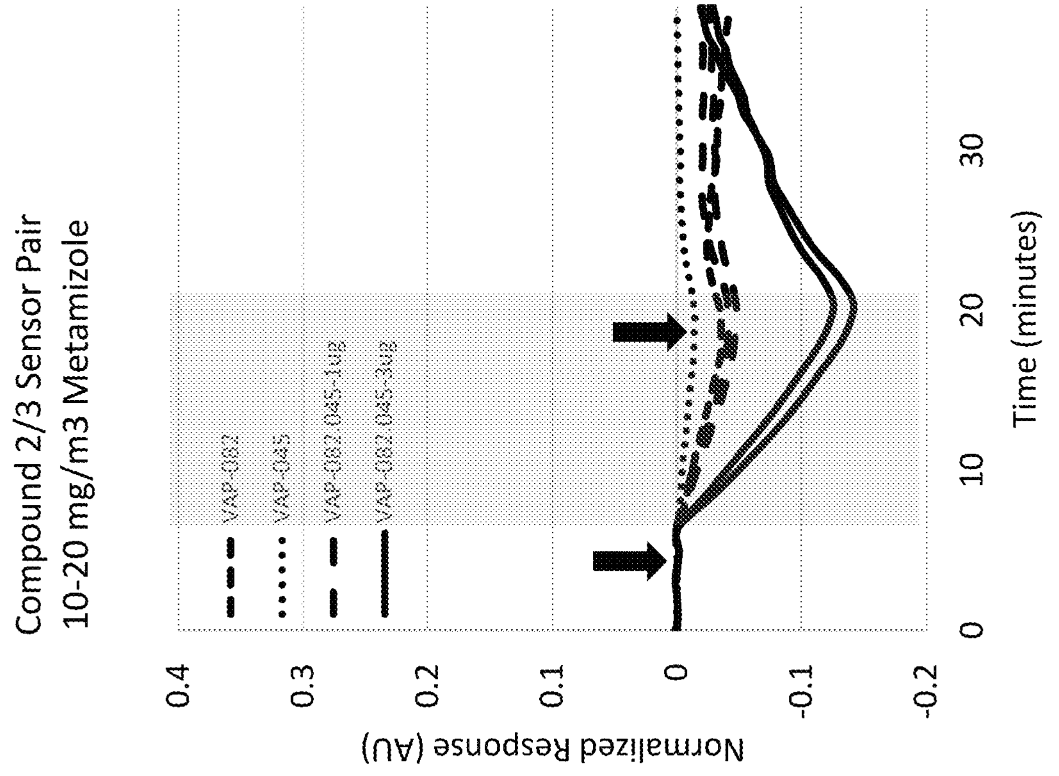
FIG. 16B shows the sensor response of a control sensor with compound 2 only, a control sensor with compound 4 only, a compound 2/4 (1 μg) bilayer sensor, and a compound 2/4 (3 μg) bilayer sensor to 10-20 $mg/m^3$ Metamizole.
Figure 16A:
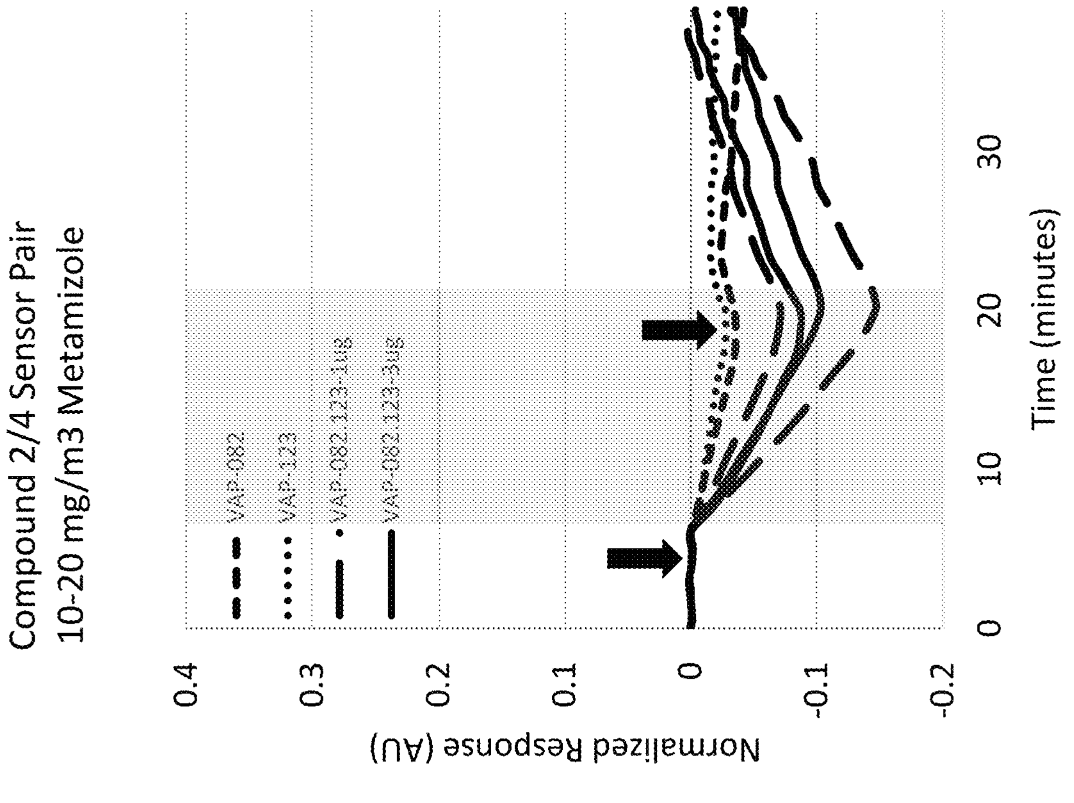
FIG. 16A shows the sensor response of a control sensor with compound 2 only, a control sensor with compound 3 only, a compound 2/3 (1 μg) bilayer sensor, and a compound 2/3 (3 μg) bilayer sensor to 10-20 $mg/m^3$ Metamizole.
Figure 16C:
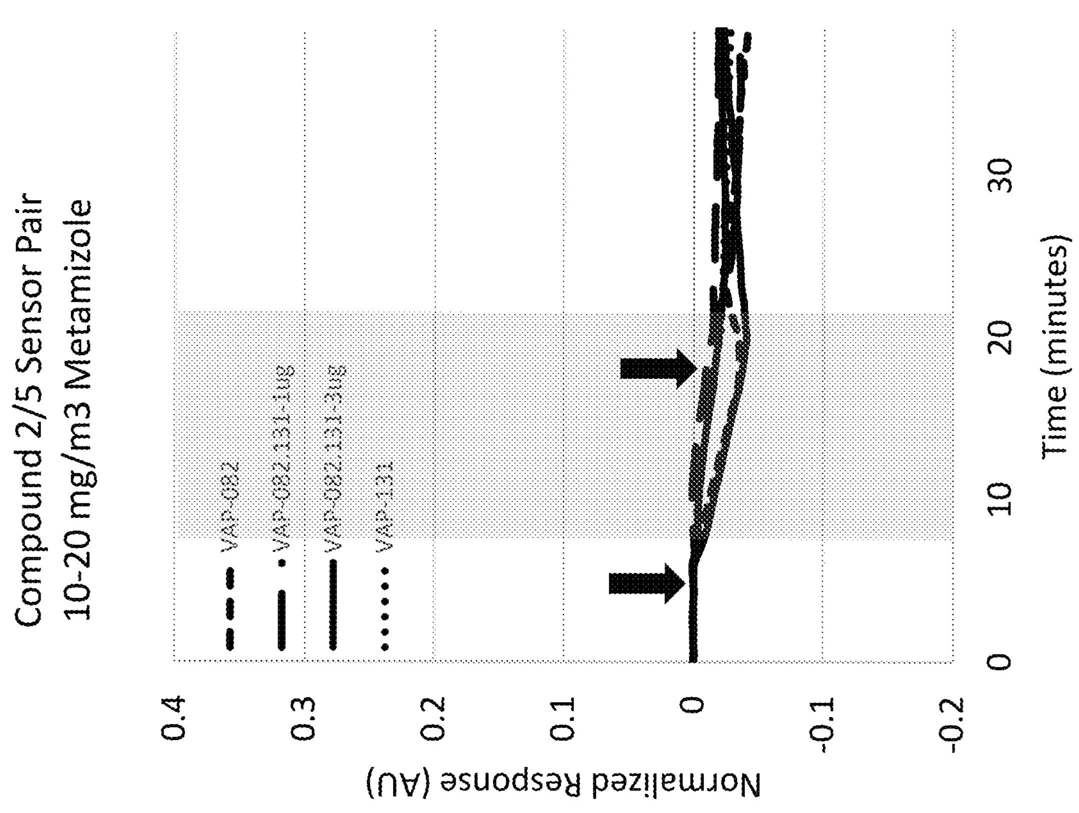
FIG. 16C shows the sensor response of a control sensor with compound 2 only, a control sensor with compound 5 only, a compound 2/5 (1 μg) bilayer sensor, and a compound 2/5 (3 μg) bilayer sensor to 10-20 $mg/m^3$ Metamizole.

Results for metamizole at 10-20 mg/$m^3$ for each adsorption layer and Compound 2 pair are included in FIGS. 16A-16C. A decreasing response is observed, likely due to the sulfonic acid pair in metamizole's chemical structure, which is much different than the fentanyl simulant's increasing response. FIG. 16A displays Compound 2/3 bilayer pairs and controls, all of which responded slightly; the 3 μg bilayer samples had a larger response than the 1 μg bilayer samples.

The bilayers of Compound 2/4 in FIG. 16B also respond to metamizole, while the sensing and adsorption layer controls have a negligible response. The Compound 4 control's dose-dependent response to the fentanyl simulant and lack of a response to metamizole may develop selectivity to the fentanyl simulant while reducing false positives due to metamizole.

The Compound 2/5 bilayer pairs displayed by FIG. 16C had only a small response to metamizole relative to the other bilayer pairs on the senor card. These results show that the adsorption layer plays a large role in sensor response. In this case, adsorption layers with more accessible amines tended to give larger responses to the simulant. Thicker films also, in some cases, caused a larger response to the interferent than thinner films. The accessibility of the amine and the amount of it available can determine the rate at which the ion exchange process occurs, thereby governing the sensor response. Further tuning the sensing layer can improve the selectivity of the sensors.

Finally, the Compound 2 sensing layer control had a negligible response to metamizole as well. This may be another good nanofiber that can aid in selectivity. These results demonstrate the impact of the adsorption layer on selectivity. Further optimization of the adsorption layer has the potential to improve selectivity. The use of a sensor array eliminates the potential for the response to metamizole to interfere with the detection of fentanyl. For example, a frequent concern is that the responses to fentanyl and metamizole will cancel each other out to produce zero response. While it is true that for one sensor, there exists a ratio of fentanyl to metamizole that would produce a cancelling effect, the ratio will be different for other sensors in the array. Selectivity against metamizole can be obtained through signal processing.

Figure 17A:
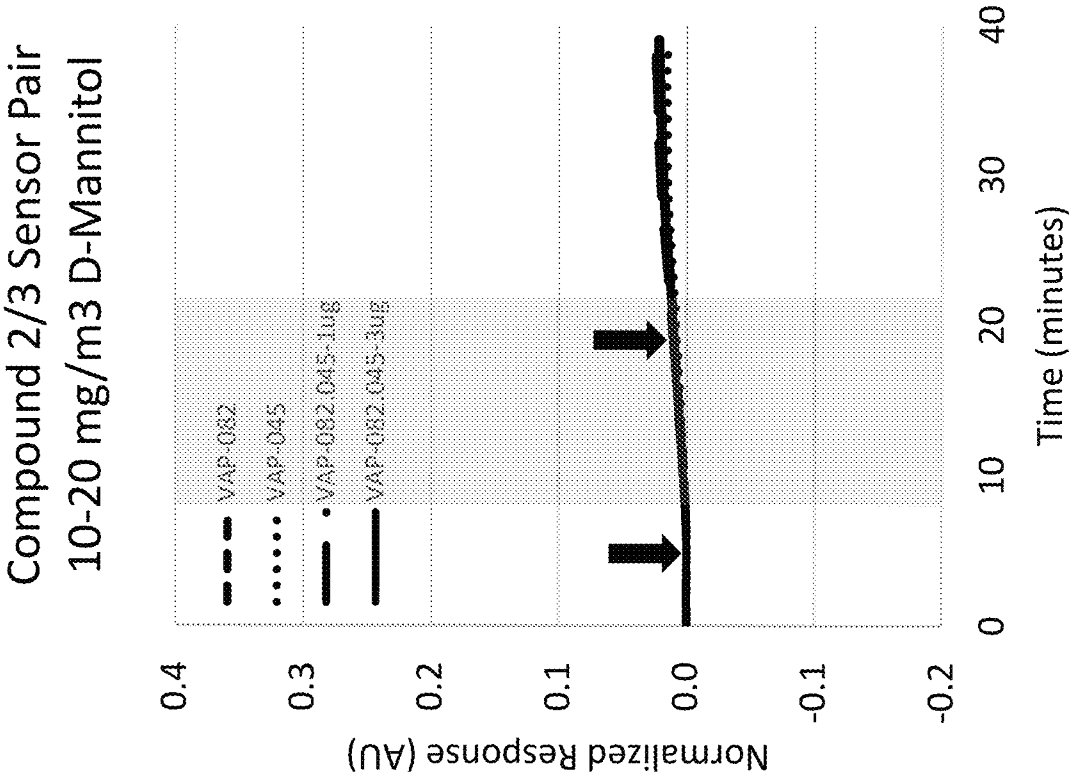
FIG. 17A shows the sensor response of a control sensor with compound 2 only, a control sensor with compound 3 only, a compound 2/3 (1 μg) bilayer sensor, and a compound 2/3 (3 μg) bilayer sensor to 10-20 $mg/m^3$ Mannitol.
Figure 17B:
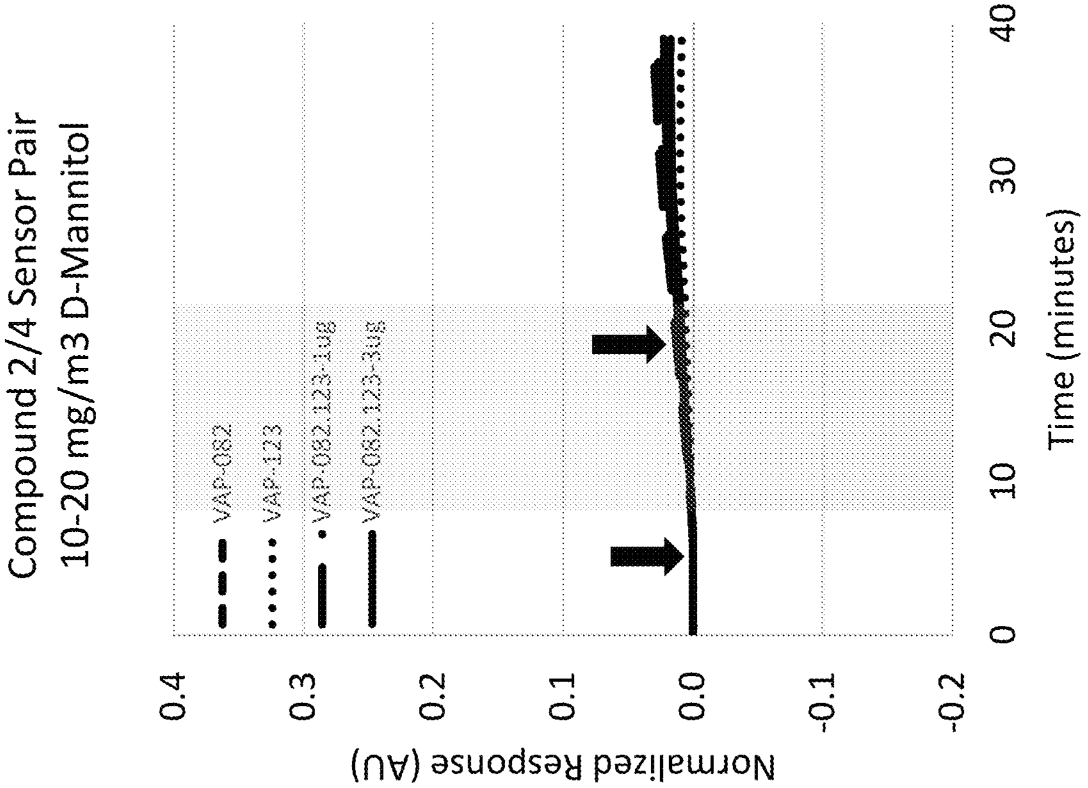
FIG. 17B shows the sensor response of a control sensor with compound 2 only, a control sensor with compound 4 only, a compound 2/4 (1 μg) bilayer sensor, and a compound 2/4 (3 μg) bilayer sensor to 10-20 $mg/m^3$ Mannitol.
Figure 17C:
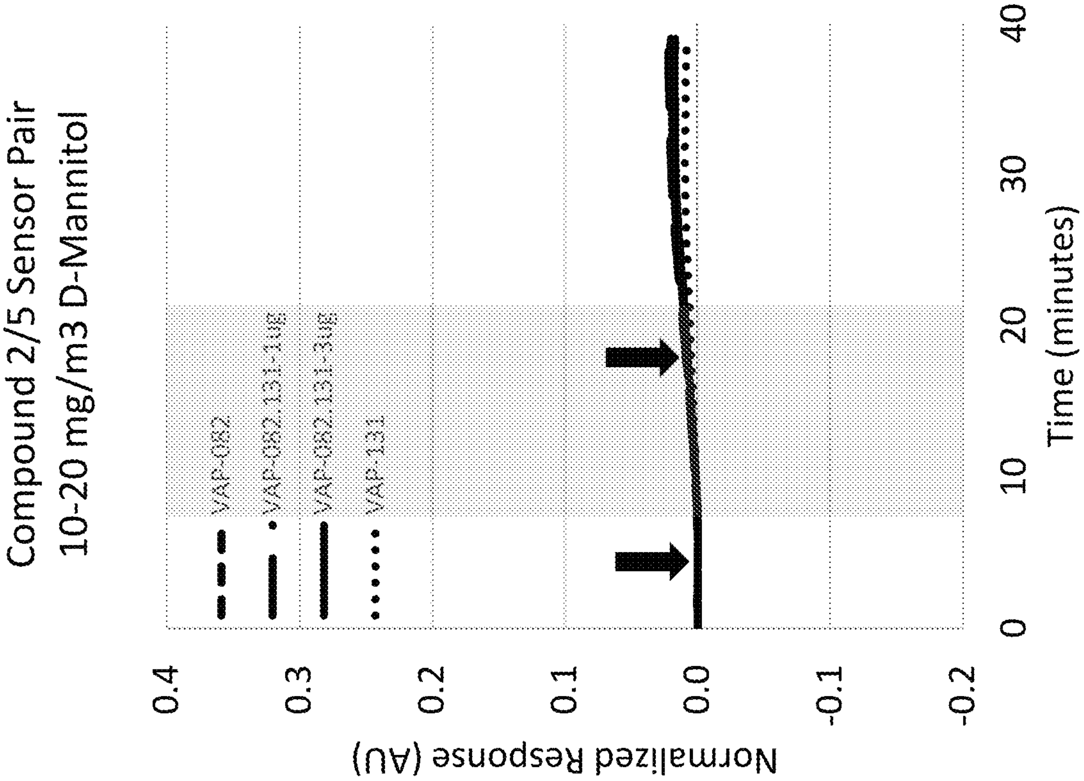
FIG. 17C shows the sensor response of a control sensor with compound 2 only, a control sensor with compound 5 only, a compound 2/5 (1 μg) bilayer sensor, and a compound 2/5 (3 μg) bilayer sensor to 10-20 $mg/m^3$ Mannitol.

Sensor responses for each of the adsorption and bilayer pairs to 10-20 mg/$m^3$ of D-Mannitol are shown in FIGS. 17A-17C. D-Mannitol contains no functional groups that typically interact with these sensors. The responses for each of the bilayer pairs in FIGS. 17A-17C appear to be drift and do not demonstrate a significant response to analyte. D-Mannitol is not likely to be an interferent for the sensors.

Figure 18B:
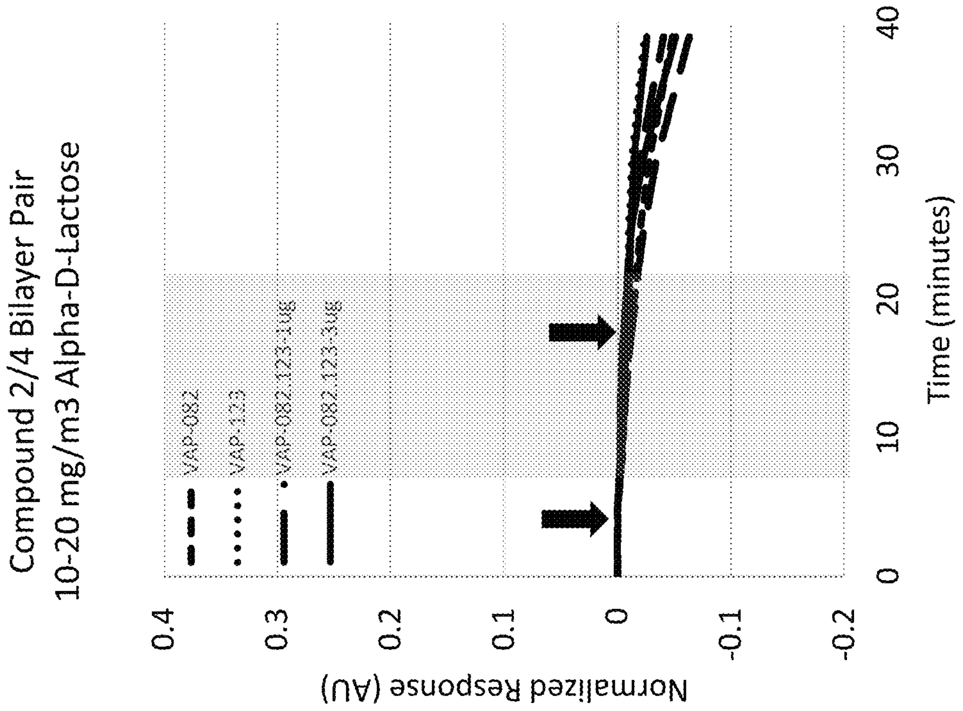
FIG. 18B shows the sensor response of a control sensor with compound 2 only, a control sensor with compound 4 only, a compound 2/4 (1 μg) bilayer sensor, and a compound 2/4 (3 μg) bilayer sensor to 10-20 $mg/m^3$ Alpha-D-Lactose.
Figure 18A:
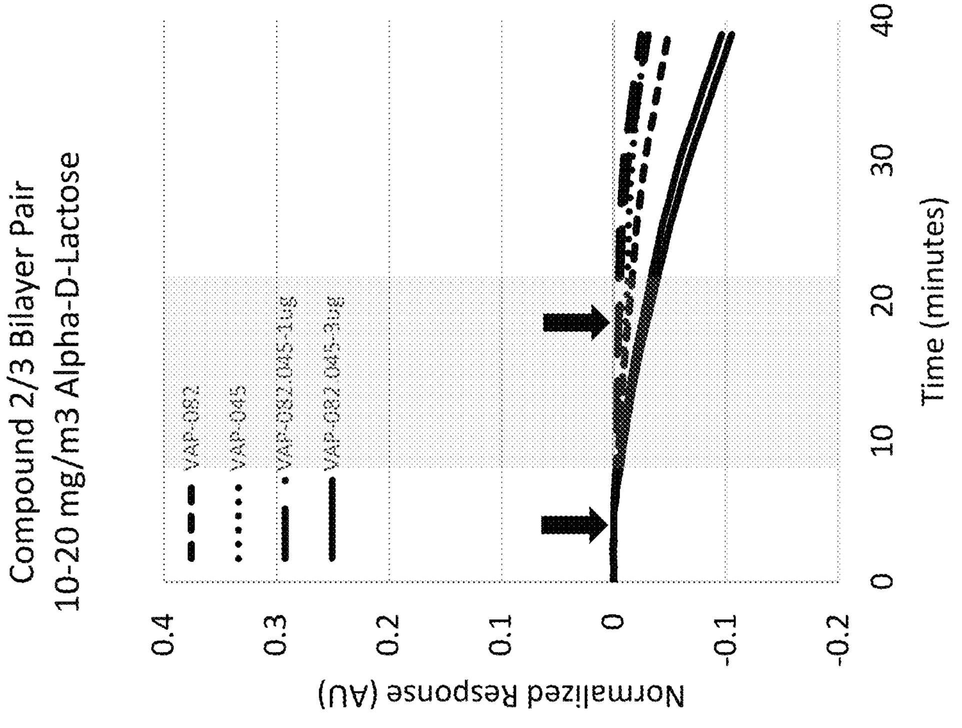
FIG. 18A shows the sensor response of a control sensor with compound 2 only, a control sensor with compound 3 only, a compound 2/3 (1 μg) bilayer sensor, and a compound 2/3 (3 μg) bilayer sensor to 10-20 $mg/m^3$ Alpha-D-Lactose.
Figure 18C:
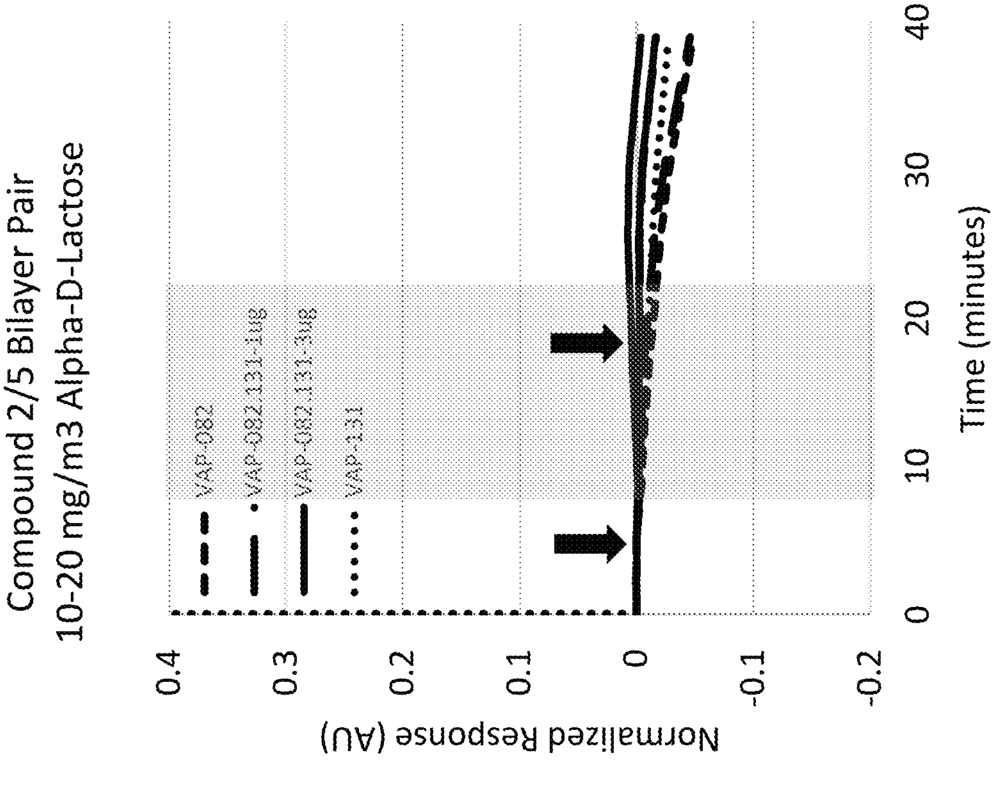
FIG. 18C shows the sensor response of a control sensor with compound 2 only, a control sensor with compound 5 only, a compound 2/5 (1 μg) bilayer sensor, and a compound 2/5 (3 μg) bilayer sensor to 10-20 $mg/m^3$ Alpha-D-Lactose.

Results from the sensor response to 10-20 mg/$m^3$ of Alpha-D-Lactose have been included in FIGS. 18A-18C. The alpha-D-Lactose molecule has similar functional groups to D-mannitol and did not elicit a response from the nanofibers. This is also not likely to be an interferent. These tests demonstrate the selectivity of the bilayer sensors toward fentanyl and suggest that fentanyl will be detectable in the presence of these compounds.

Figure 19A:
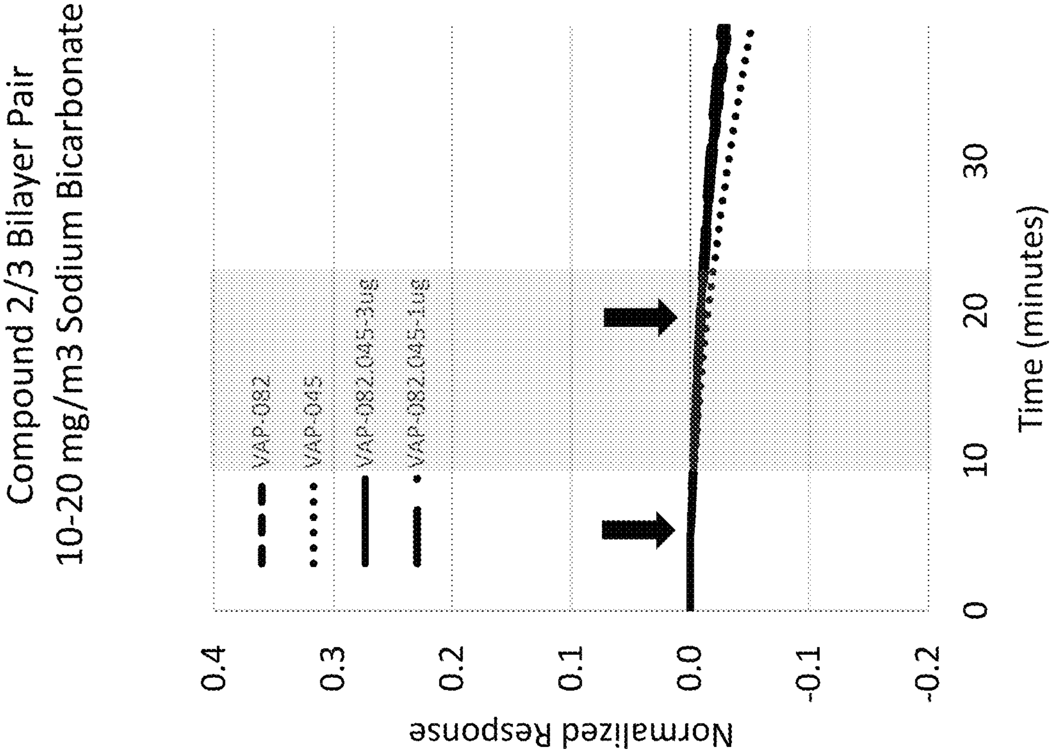
FIG. 19A shows the sensor response of a control sensor with compound 2 only, a control sensor with compound 3 only, a compound 2/3 (1 μg) bilayer sensor, and a compound 2/3 (3 μg) bilayer sensor to 10-20 $mg/m^3$ sodium bicarbonate.
Figure 19B:
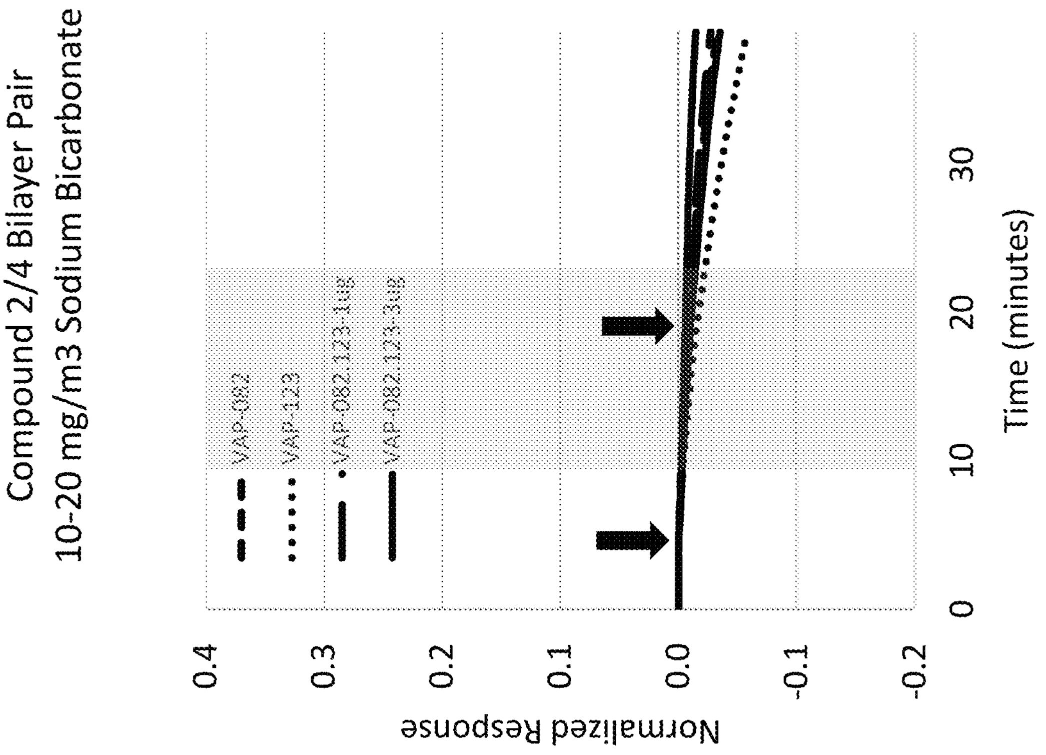
FIG. 19B shows the sensor response of a control sensor with compound 2 only, a control sensor with compound 4 only, a compound 2/4 (1 μg) bilayer sensor, and a compound 2/4 (3 μg) bilayer sensor to 10-20 $mg/m^3$ sodium bicarbonate.
Figure 19C:
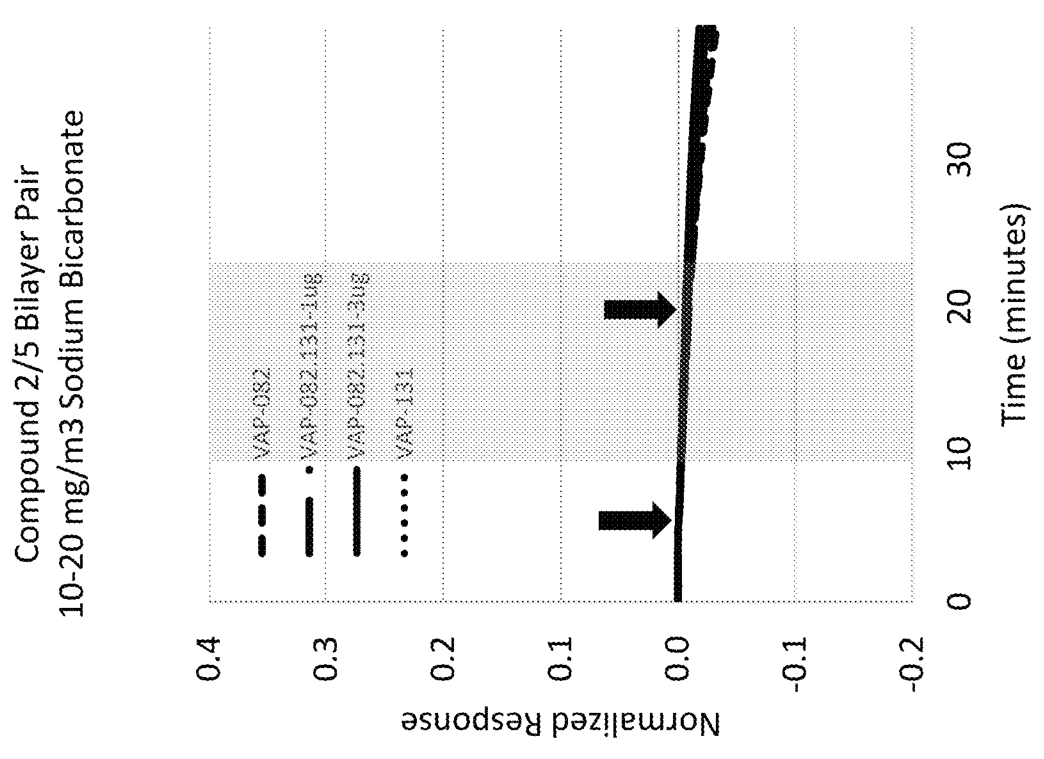
FIG. 19C shows the sensor response of a control sensor with compound 2 only, a control sensor with compound 5 only, a compound 2/5 (1 μg) bilayer sensor, and a compound 2/5 (3 μg) bilayer sensor to 10-20 $mg/m^3$ sodium bicarbonate.

Finally, the last interferent tested was sodium bicarbonate (baking soda), which is included in FIGS. 19A-19C. Because of its lack of reactive sites with the nanofibers, the bilayers and controls in FIGS. 19A-19C did not respond to sodium bicarbonate and it is not expected to mask fentanyl in a real-world setting. Testing in mixtures required an additional particle generator, method development, and testing time.

These sensors are the only chemiresistive technology that offers a high degree of intrinsic selectivity. Because the nanofibers are self-assembled from organic molecules, they are tailored to respond to a specific analyte or class of analyte prior to fabrication of the nanofiber structures. Furthermore, the large surface area and high porosity of the nanofiber films leads to quick absorption and desorption rates, which results in limits of detection down to the parts per trillion level for certain chemicals. Finally, the nanofibers operate at room temperature and atmospheric pressure, which eliminates the power draw compared to techniques that require additional heating or vacuum. The nanofibers also offer improvements over the various deficiencies in optical techniques, particularly low detection limits and chemical specificity. Organic nanofibers can be implemented at low cost and in a portable form factor without substantial loss of sensitivity or selectivity compared to lab-based instruments.

List of Additional Examples

The following list describes particular examples of the technology described herein. These particular examples are numbered for convenience. Examples 1-28 are sensors according to the technology described herein. Examples 29-58 are methods of detecting solid particles of a target salt.

Example 1: A sensor to detect solid particles of a target salt, comprising: a support substrate; an adsorption layer comprising an ion exchange medium formed of a first porous structured material functionalized with basic or acidic functional groups, wherein the basic or acidic functional groups remove an acid or base component from the target salt to form a free base or free acid of the target salt; a sensing layer oriented between the support substrate and the adsorption layer, the sensing layer comprising a second porous structured material functionalized to detect the free base or free acid of the target salt by a change in conductivity; and an electrode pair in contact with the sensing layer and separated by the sensing layer.

Example 2: A sensor of any of examples 1-28, wherein the target salt is a salt of an alkaloid.

Example 3: A sensor of any of examples 1-28, wherein the target salt is a salt of an opiate.

Example 4: A sensor of any of examples 1-28, wherein the target salt is fentanyl hydrochloride or carfentanil.

Example 5: A sensor of any of examples 1-28, wherein the solid particles of the target salt have a particle size from about 0.1 μm to about 10 μm.

Example 6: A sensor of any of examples 1-28, wherein the support substrate comprises at least one of glass, silicon, alumina, sapphire, mica, quartz, or plastic.

Example 7: A sensor of any of examples 1-28, wherein the first porous structured material is functionalized with basic functional groups so as to form a free base of the target salt, and the second porous structured material is acidic nanofibers functionalized to detect the free base.

Example 8: A sensor of any of examples 1-28, wherein the basic functional groups include primary amino groups, secondary amino groups, or a combination thereof.

Example 9: A sensor of any of examples 1-28, wherein the basic functional groups include hexylamine, ethylethylamine, dimethylbutylamine, or a combination thereof.

Example 10: A sensor of any of examples 1-28, wherein the first porous structured material and the second porous structured material are formed of at least one of organic nanofibers, polymeric nanofibers, carbon nanotubes, silicon nanowires, metal oxide nanowires, boron nitride nanotubes, aerogels, xerogels, highly porous ceramics, and metal-organic frameworks (MOF).

Example 11: A sensor of any of examples 1-28, wherein the first porous structured material is a network of first organic nanofibers.

Example 12: A sensor of example 11, wherein the first organic nanofibers are assembled from stacked molecules selected from the group consisting of: 3,4,9,10-perylene-tetracarboxylic diimide, 3,4,9,10-perylene-tetracarboxylic dianhydride, perylene 3,4,9,10-tetracarboxyl-3,4-anhydride-9,10-imide, an indolocarbazole derivative, and an oligomer made up of 3 to 9 carbazole derivative monomers, wherein at least a portion of the stacked molecules are further functionalized with the basic functional groups.

Example 13: A sensor of example 11, wherein the first organic nanofibers are assembled from stacked molecules having one of the following structures:

(I)

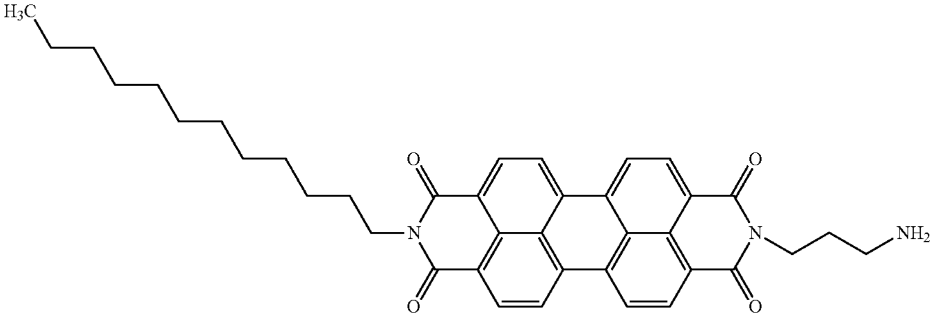

(II)

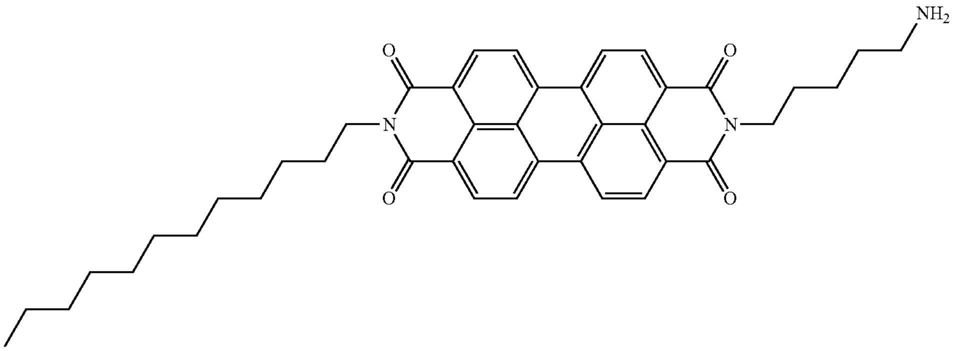

-continued
(III)
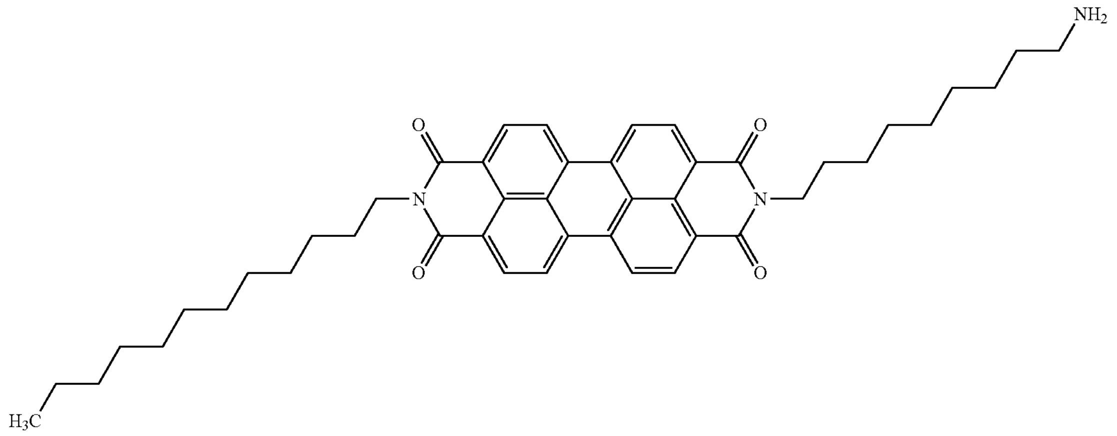
(IV)
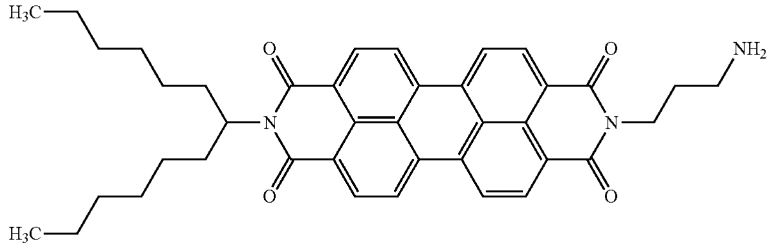
(V)
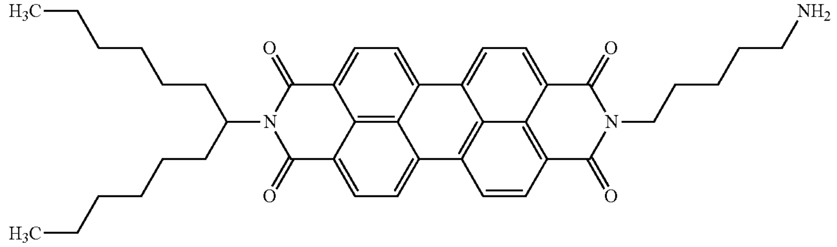
(VI)
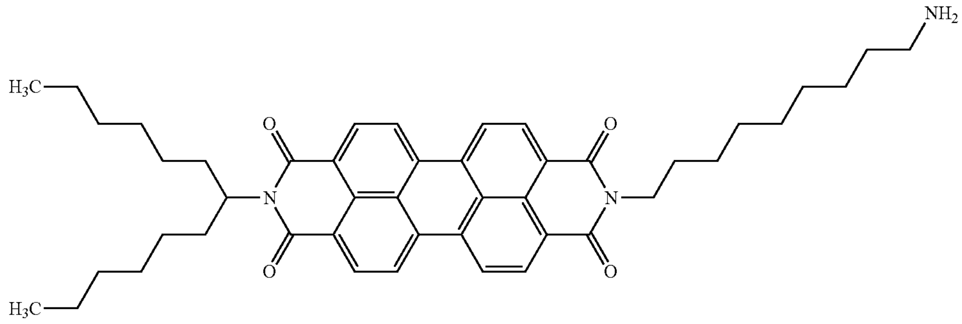
(VII)
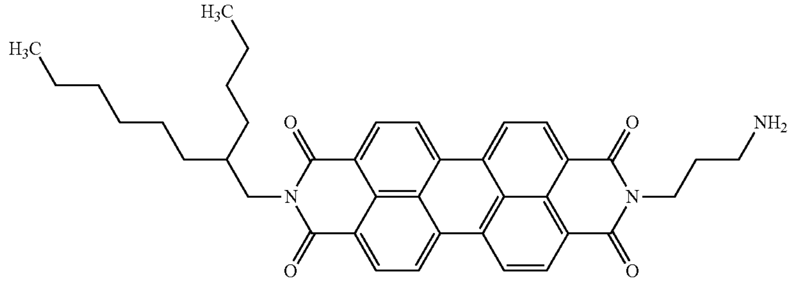

-continued
(VIII)
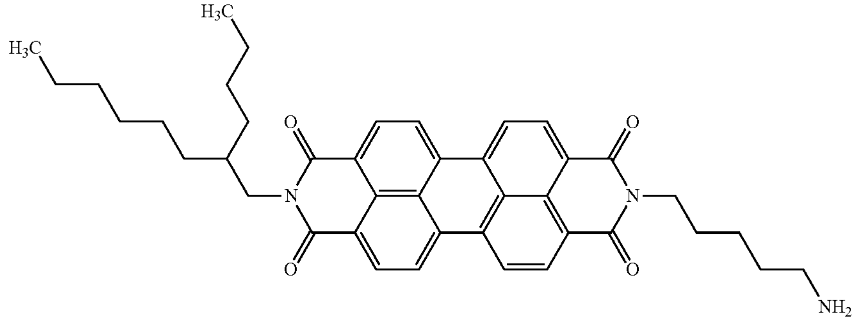
(IX)
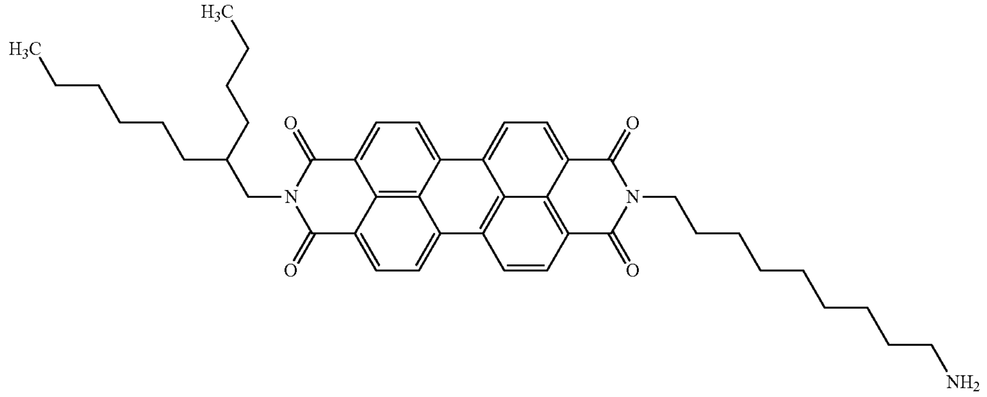
(X)
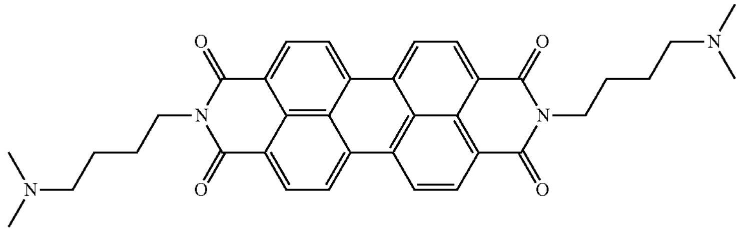
(XI)
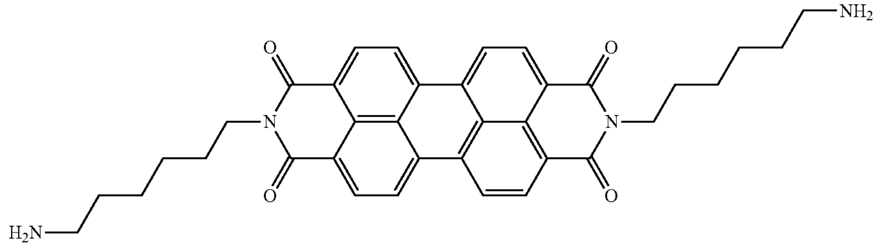
(XII)
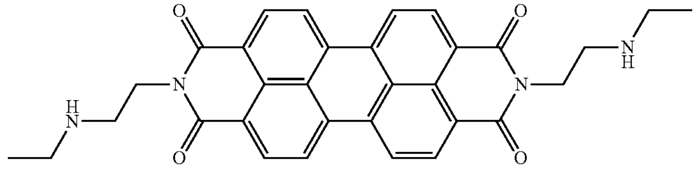
.
Example 14: A sensor of example 13, wherein the second organic nanofibers are assembled from stacked molecules having one of the following structures:

(XIII)

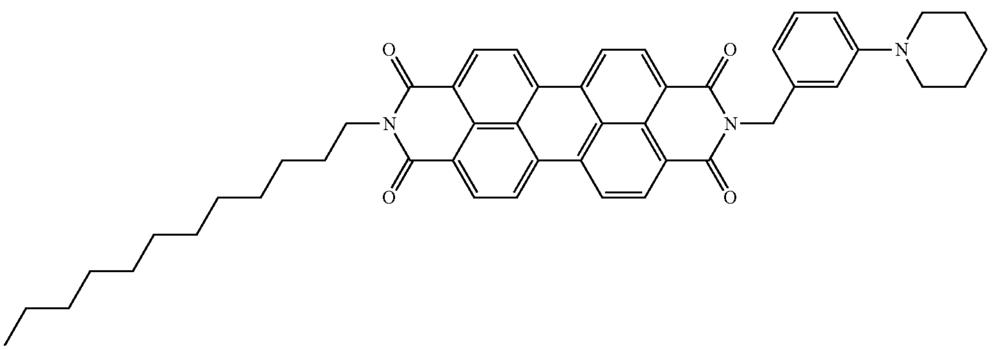

(XIV)

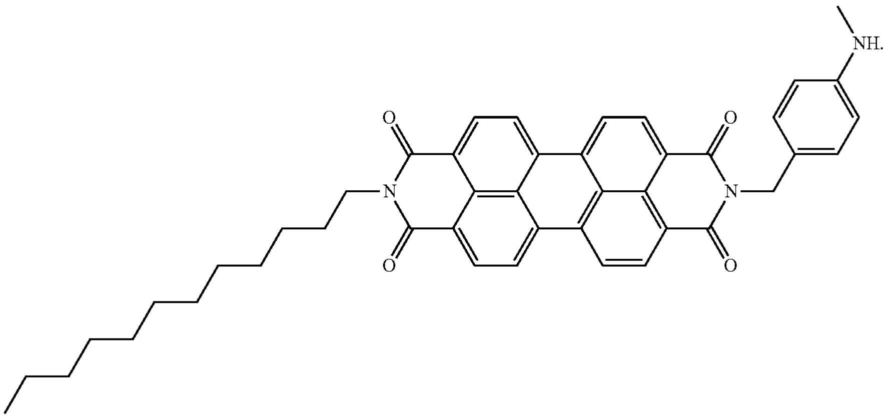

Example 15: A sensor of example 14, wherein the structure of the first organic nanofibers and the structure of the second organic nanofibers, respectively, are: X and XIV; XI and XIV; or XII and XIV.

Example 16: A sensor of any of examples 1-28, wherein the adsorption layer has a thickness from 50 nm to 5 μm.

Example 17: A sensor of any of examples 1-28, wherein the adsorption layer has a mass from 0.1 μg to 6 μg per 3 $mm^2$ and an area of 0.1 $mm^2$ to 10 $mm^2$.

Example 18: A sensor of any of examples 1-28, wherein the adsorption layer is porous with an average pore size from 10 nm to 1 μm.

Example 19: A sensor of any of examples 1-28, wherein the second porous structured material comprises second organic nanofibers assembled from stacked molecules selected from the group consisting of: substituted or unsubstituted 3,4,9,10-perylene-tetracarboxylic diimide, substituted or unsubstituted 3,4,9,10-perylene-tetracarboxylic dianhydride, substituted or unsubstituted perylene 3,4,9,10-tetracarboxyl-3,4-anhydride-9,10-imide, an indolocarbazole derivative, and an oligomer made up of 3 to 9 carbazole derivative monomers.

Example 20: A sensor of any of examples 1-28, wherein the second porous structured material comprises second organic nanofibers assembled from stacked molecules having one of the following structures:

(XIII)

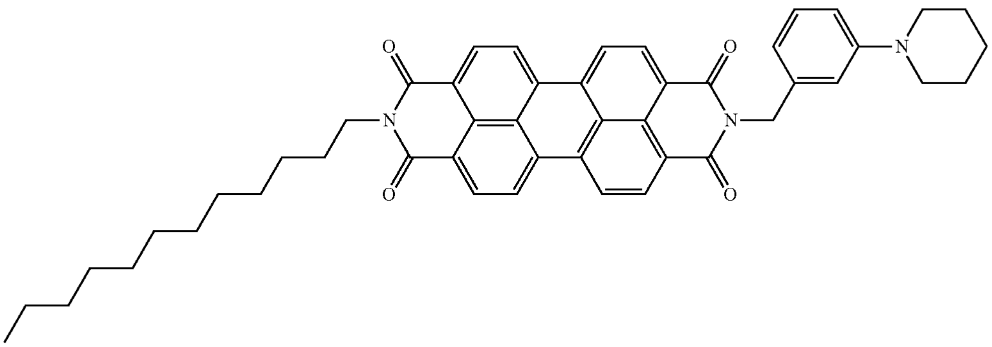

-continued (XIV)

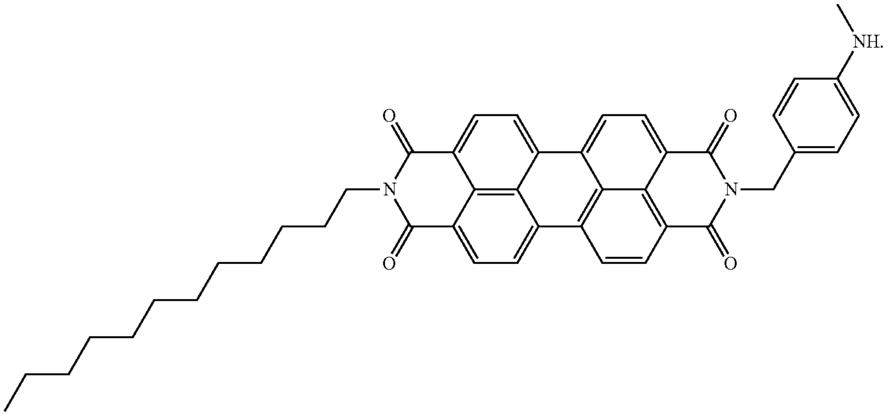

Example 21: A sensor of any of examples 1-28, wherein the adsorption layer is in direct contact with the sensing layer.

Example 22: A sensor of any of examples 1-28, wherein the sensing layer has a thickness from 50 nm to 5 μm.

Example 23: A sensor of any of examples 1-28, wherein the sensing layer has a mass from 0.1 μg to 6 μg per 3 $mm^2$.

Example 24: A sensor of any of examples 1-28, wherein the electrode pair comprises gold, titanium, indium tin oxide, indium zinc oxide, tungsten, aluminum, platinum, silver, copper, PEDOT:PSS, or a combination thereof.

Example 25: A sensor of any of examples 1-28, wherein the electrode pair is separated by a gap distance from 50 nm to 100 μm, an interdigitated gap width of 5 μm to 50 cm, and a finger width of 0.1 to 50 μm.

Example 26: A sensor of any of examples 1-28, further comprising a housing around the adsorption layer, sensing layer, and electrode pair.

Example 27: A sensor of any of examples 1-28, further comprising an alarm electrically connected to the electrodes and adapted to trigger an alarm signal, said alarm comprising a haptic alarm, visual alarm, auditory alarm, display, or a combination thereof.

Example 28: A sensor of any of examples 1-28, further comprising a blower oriented to blow air into the adsorption layer.

Example 29: A method of detecting solid particles of a target salt, comprising: exposing an adsorption layer to a gaseous medium in which particles of the target salt are entrained, wherein the adsorption layer comprises an ion exchange medium formed of a first porous structured material functionalized with basic or acidic functional groups, wherein the basic or acidic functional groups remove an acid or base component from the target salt to form a free base or free acid of the target salt, wherein the free base or free acid of the target salt diffuses to a sensing layer adjacent to the adsorption layer, the sensing layer comprising a second porous structured material functionalized to detect the free base or free acid of the target salt, wherein the free base or free acid of the target salt changes the conductivity of the second porous structured material; and measuring a change in conductivity of the sensing layer using an electrode pair in contact with the sensing layer and separated by the sensing layer.

Example 30: A method of any of examples 29-58, wherein the gaseous medium includes air.

Example 31: A method of any of examples 29-58, wherein the free base is a condensed matter, vapor or gas.

Example 32: A method of any of examples 29-58, wherein the concentration of the target salt in the gaseous medium is from 0.1 $mg/m^3$ to 100 $mg/m^3$.

Example 33: A method of any of examples 29-58, wherein the target salt is a salt of an alkaloid.

Example 34: A method of any of examples 29-58, wherein the target salt is a salt of an opiate.

Example 35: A method of any of examples 29-58, wherein the target salt is fentanyl hydrochloride or carfentanil.

Example 36: A method of any of examples 29-58, wherein the solid particles of the target salt have a particle size from about 0.1 μm to about 10 μm.

Example 37: A method of any of examples 29-58, wherein the first porous structured material is functionalized with basic functional groups so as to form a free base of the target salt, and the second porous structured material is acidic nanofibers functionalized to detect the free base.

Example 38: A method of any of examples 29-58, wherein the first porous structured material and the second porous structured material are formed of at least one of organic nanofibers, polymeric nanofibers, carbon nanotubes, silicon nanowires, metal oxide nanowires, BN nanotubes, aerogels, xerogels, highly porous ceramics, metal-organic frameworks (MOF), glassy carbon, chalcopyrites, and chalcogenides.

Example 39: A method of any of examples 29-58, wherein the first porous structured material is a network of first organic nanofibers and the second porous structured material is a network of second organic nanofibers.

Example 40: A method of example 39, wherein the first organic nanofibers are assembled from stacked molecules selected from the group consisting of: 3,4,9,10-perylene-tetracarboxylic diimide, 3,4,9,10-perylene-tetracarboxylic dianhydride, perylene 3,4,9,10-tetracarboxyl-3,4-anhydride-9,10-imide, an indolocarbazole derivative, and an oligomer made up of 3 to 9 carbazole derivative monomers, wherein at least a portion of the stacked molecules are further functionalized with the basic functional groups.

Example 41: A method of any of examples 29-58, wherein the basic functional groups include primary amino groups, secondary amino groups, or a combination thereof.

Example 42: A method of any of examples 29-58, wherein the basic functional groups include hexylamine, ethylethylamine, dimethylbutylamine, or a combination thereof.

Example 43: A method of any of examples 29-58, wherein the first organic nanofibers are assembled from stacked molecules having one of the following structures:

(I)
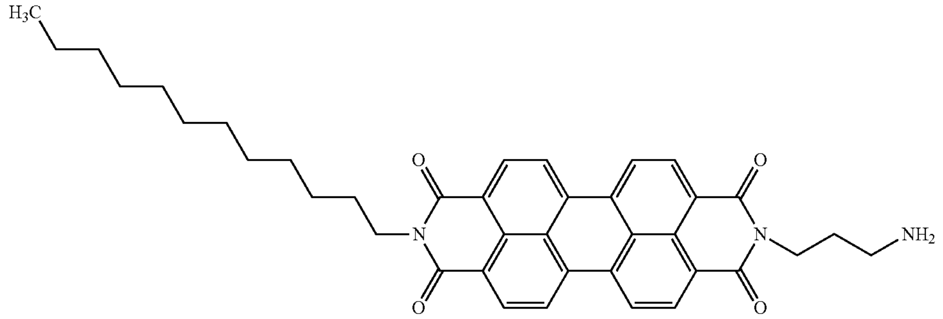
(II)
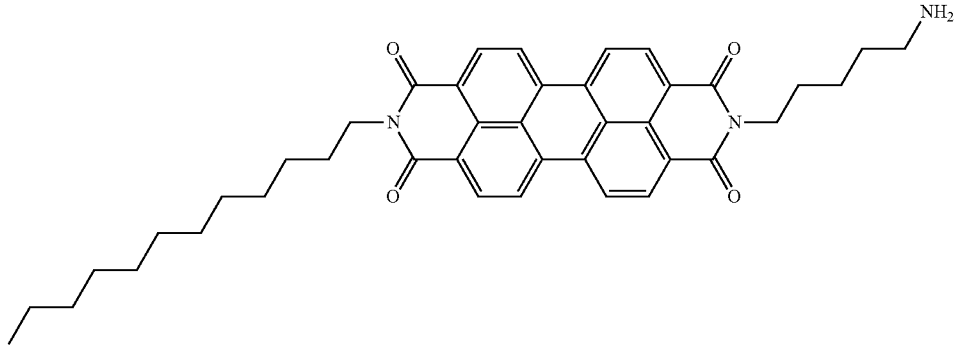
(III)
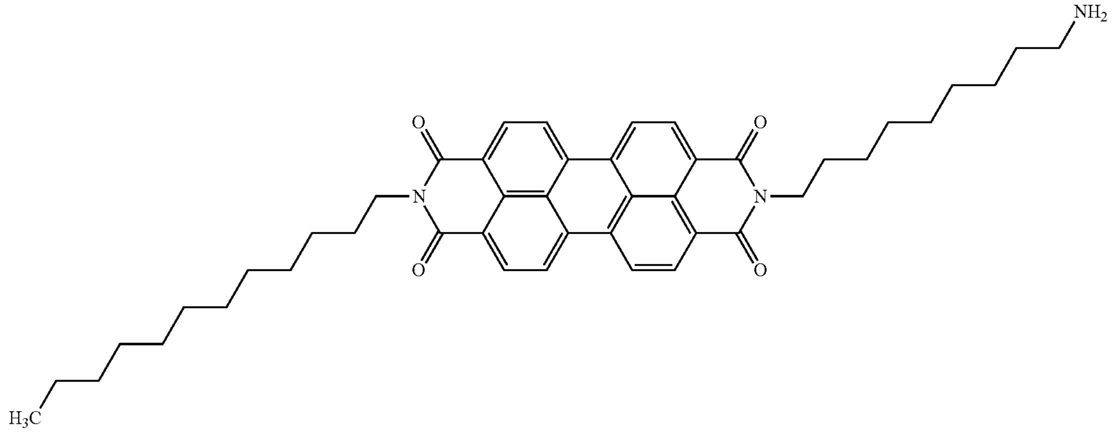
(IV)
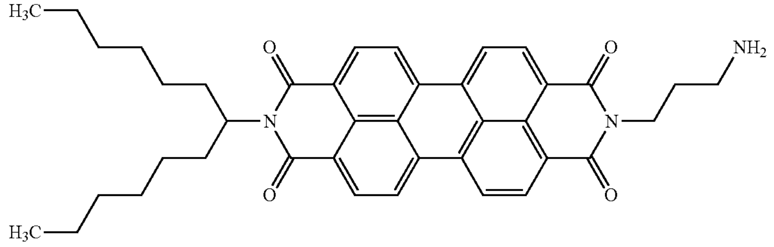
(V)
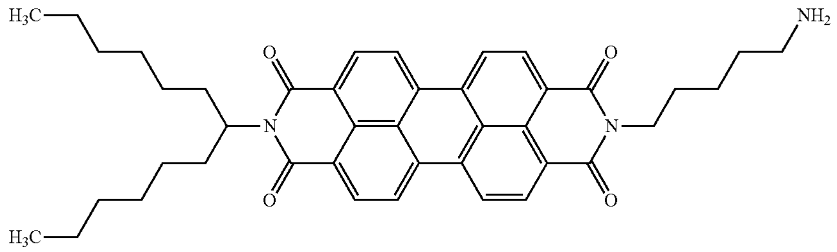

-continued
(VI)
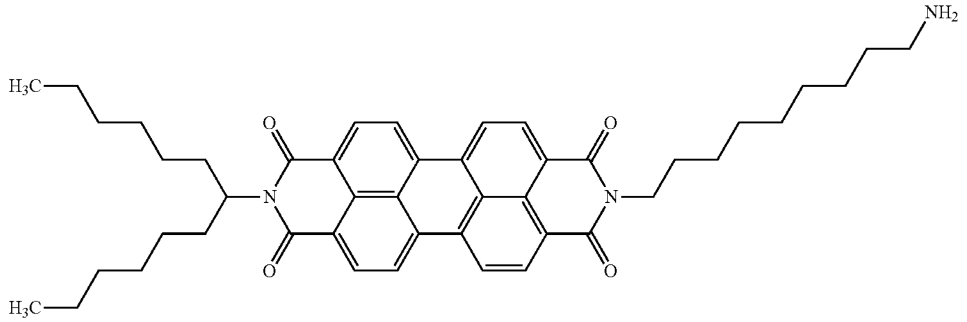
(VII)
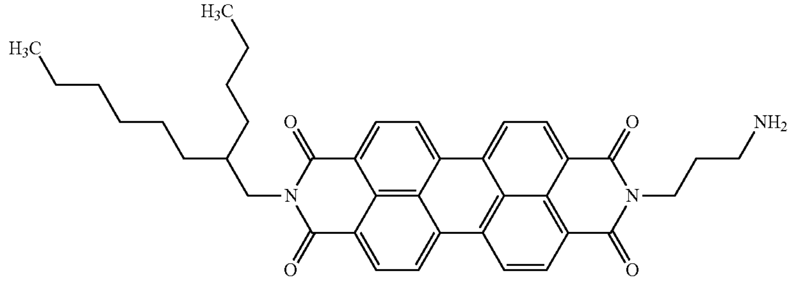
(VIII)
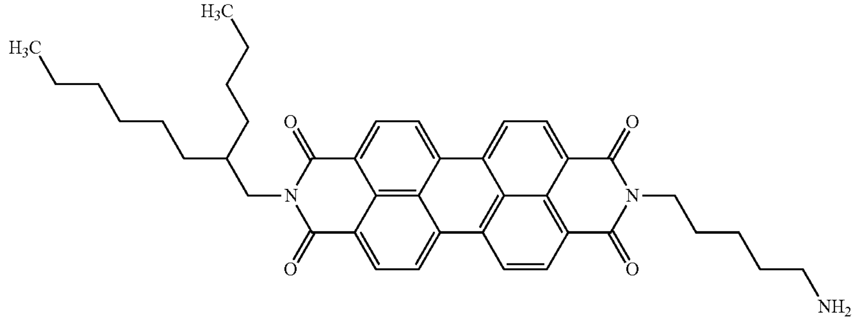
(IX)
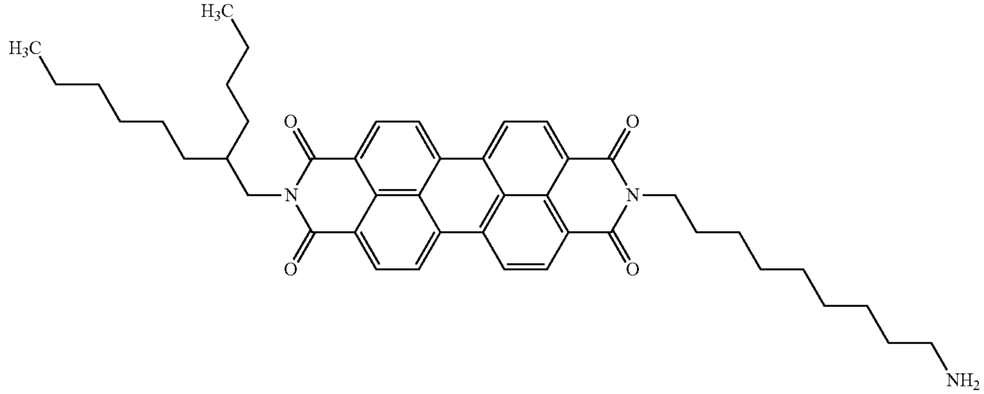
(X)
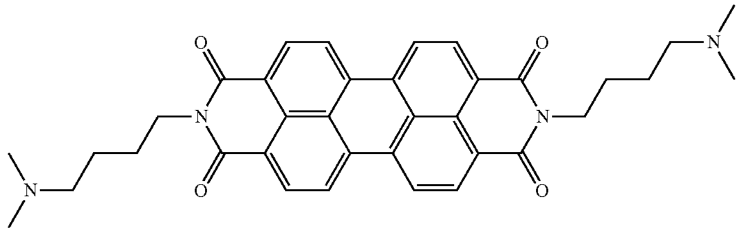

-continued (XI)

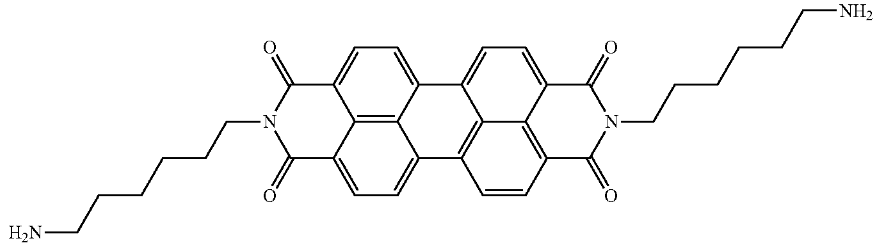

(XII)

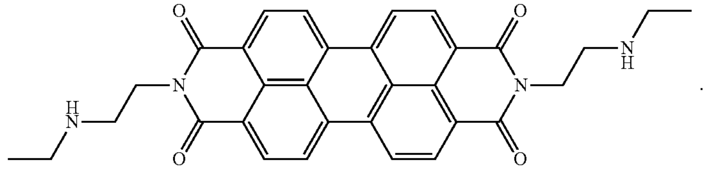

Example 44: A method of example 39, wherein the second organic nanofibers are assembled from stacked molecules having one of the following structures:

(XIII)

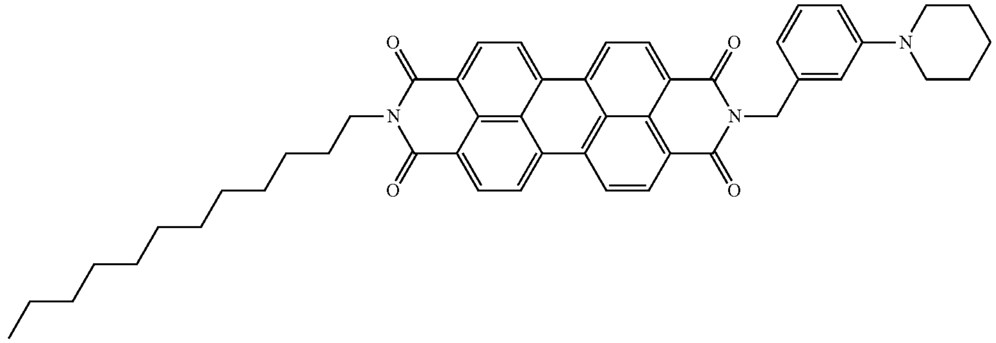

(XIV)

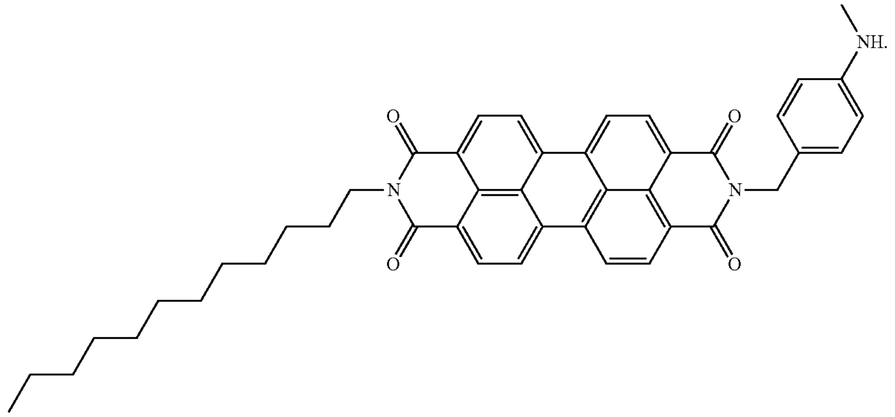

Example 45: A method of example 44, wherein the structure of the first organic nanofibers and the structure of the second organic nanofibers, respectively, are: X and XIV; XI and XIV; or XII and XIV.

Example 46: A method of any of examples 29-58, wherein the adsorption layer has a thickness from 50 nm to 5 μm.

Example 47: A method of any of examples 29-58, wherein the adsorption layer has a mass from 0.1 μg to 6 μg per 3 $mm^2$.

Example 48: A method of any of examples 29-58, wherein the adsorption layer is porous with an average pore size from 10 nm to 1 μm.

Example 49: A method of example 39, wherein the second organic nanofibers are assembled from stacked molecules selected from the group consisting of: substituted or unsubstituted 3,4,9,10-perylene-tetracarboxylic diimide, substituted or unsubstituted 3,4,9,10-perylene-tetracarboxylic dianhydride, substituted or unsubstituted perylene 3,4,9,10-tetracarboxyl-3,4-anhydride-9,10-imide, an indolocarbazole derivative, and an oligomer made up of 3 to 9 carbazole derivative monomers.

Example 50: A method of example 39, wherein the second organic nanofibers are assembled from stacked molecules having one of the following structures:

all such modifications or changes, if any, are intended to fall within the scope of the present invention as described and set forth herein.

(XIII)

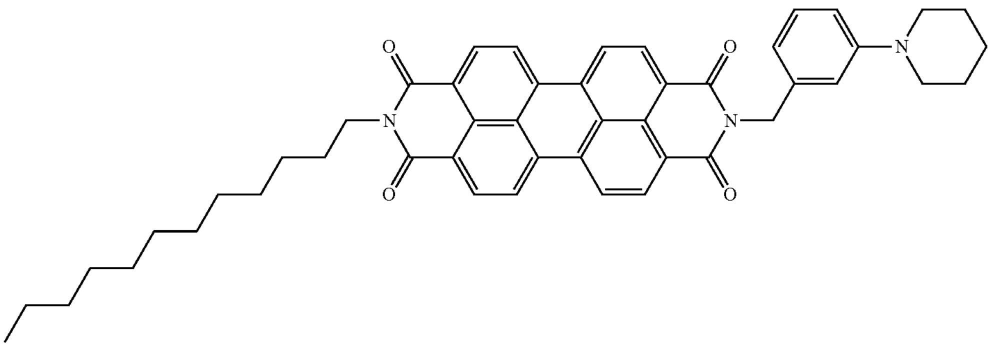

(XIV)

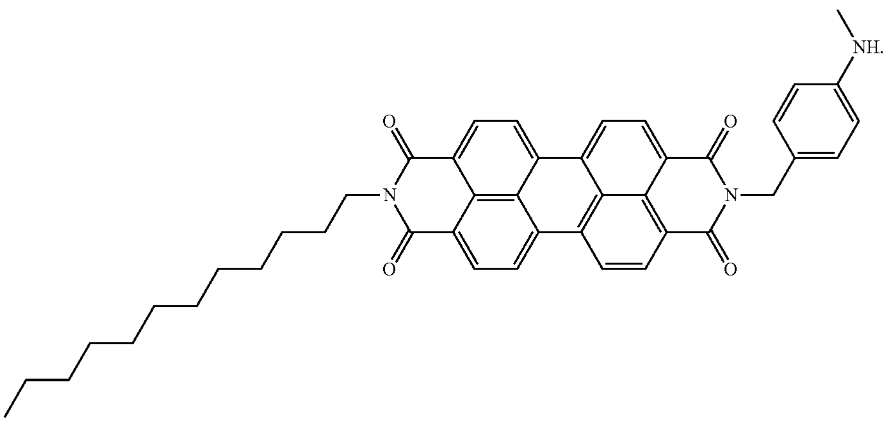

Example 51: A method of any of examples 29-58, wherein the sensing layer has a thickness from 50 nm to 5 μm.

Example 52: A method of any of examples 29-58, wherein the sensing layer has a mass from 0.1 μg to 6 μg per 3 $mm^2$.

Example 53: A method of any of examples 29-58, wherein the adsorption layer is in direct contact with the sensing layer.

Example 54: A method of any of examples 29-58, wherein the electrode pair comprises gold, titanium, indium tin oxide, indium zinc oxide, tungsten, aluminum, platinum, silver, copper, PEDOT:PSS, or a combination thereof.

Example 55: A method of any of examples 29-58, wherein the electrode pair is separated by a gap distance from 50 nm to 100 μm.

Example 56: A method of any of examples 29-58, wherein the free base of the target salt increases the conductivity of the second organic nanofibers in the sensing layer.

Example 57: A method of any of examples 29-58, further comprising alerting a user that the target salt is detected using a haptic alarm, visual alarm, auditory alarm, display, or a combination thereof.

Example 58: A method of any of examples 29-58, further comprising blowing the gaseous medium into the adsorption layer using a blower.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and

What is claimed is:

1. A sensor to detect solid particles of a target compound, comprising:

a support substrate;

an adsorption layer comprising a medium formed of a first porous structured material functionalized with basic functional groups, wherein said target compound is a salt or a free base compound, wherein the salt is converted by the basic functional groups to form a converted free base of the salt, wherein the first porous structured material is a network of first organic nanofibers, wherein the first organic nanofibers are assembled from stacked molecules selected from a group consisting of: 3,4,9,10-perylene-tetracarboxylic diimide, 3,4,9,10-perylene-tetracarboxylic dianhydride, perylene 3,4,9,10-tetracarboxyl-3,4-anhydride-9,10-imide, an indolocarbazole derivative, and an oligomer made up of 3 to 9 carbazole derivative monomers, wherein at least a portion of the stacked molecules are further functionalized with the basic functional groups;

a sensing layer oriented between the support substrate and the adsorption layer, the sensing layer comprising a second porous structured material functionalized to detect the converted free base or the free base compound by a change in conductivity, wherein the first porous structured material comprises a different material than the second porous structured material; and an electrode pair in contact with the sensing layer and separated by the sensing layer.

2. The sensor of claim 1, wherein the salt is a salt of an alkaloid or an opiate.

3. The sensor of claim 1, wherein the salt is fentanyl hydrochloride, and wherein the free base compound is carfentanil.

4. The sensor of claim 1, wherein the support substrate comprises glass, silicon, alumina, sapphire, mica, quartz, plastic, or a combination thereof.

5. The sensor of claim 1, wherein the basic functional groups include primary amino groups, secondary amino groups, tertiary amino groups, or a combination thereof.

6. The sensor of claim 1, wherein the basic functional groups include hexylamine, ethylethylamine, dimethylbutylamine, or a combination thereof.

7. The sensor of claim 1, wherein the second porous structured material comprises organic nanofibers, polymeric nanofibers, or a combination thereof.

8. The sensor of claim 1, wherein the second porous structured material is a network of second organic nanofibers.

9. The sensor of claim 8, wherein the basic functional groups are amines, wherein the first organic nanofibers are assembled from stacked molecules having at least one of the following structures:

(I)

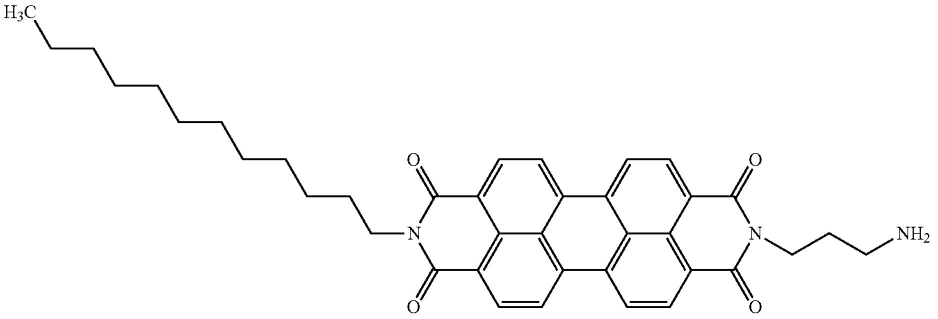

(II)

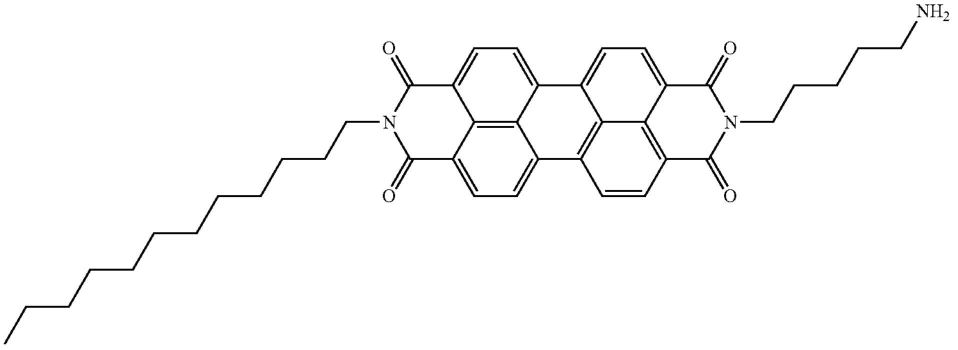

(III)

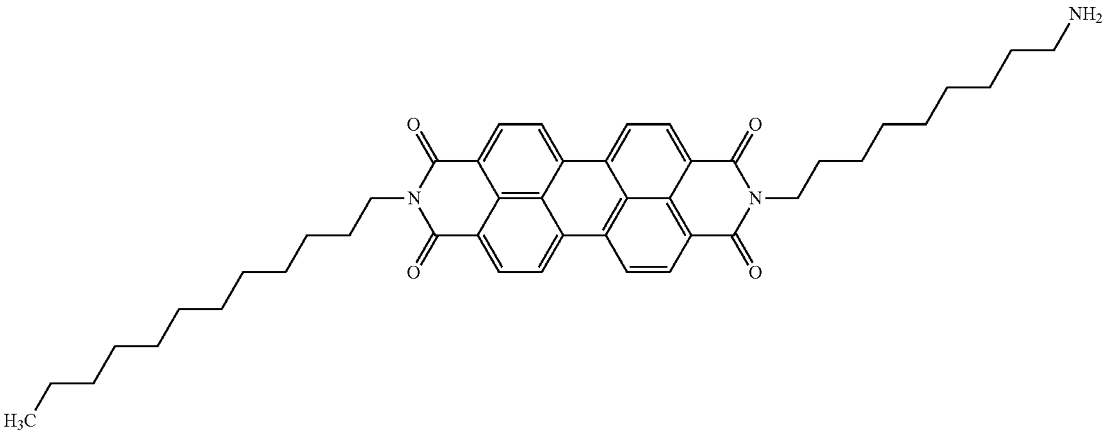

-continued
(IV)
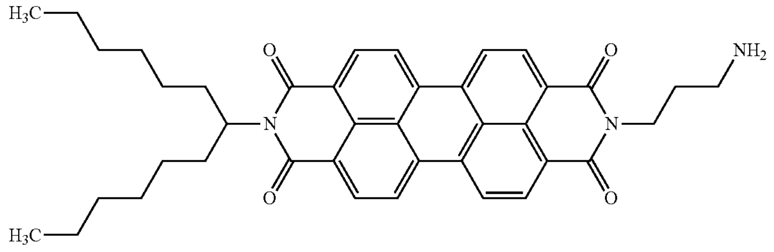
(V)
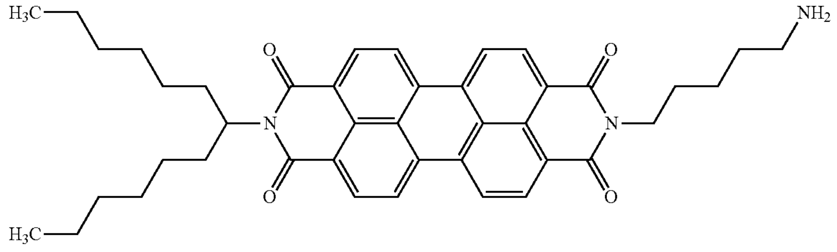
(VI)
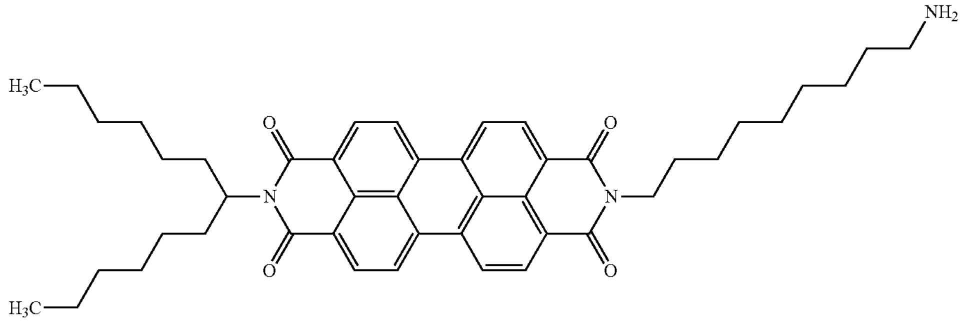
(VII)
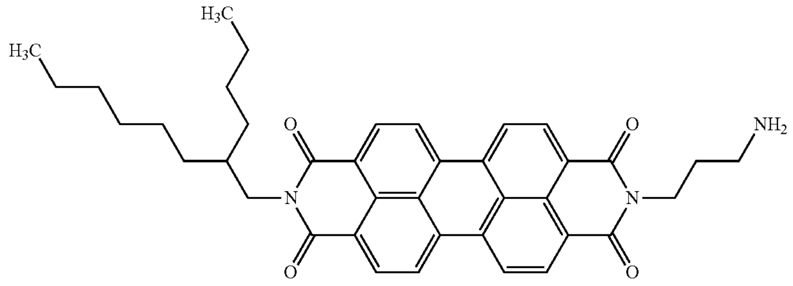
(VIII)
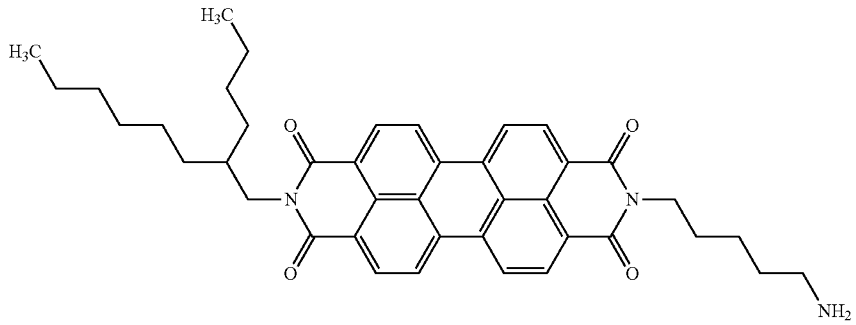

-continued
(IX)
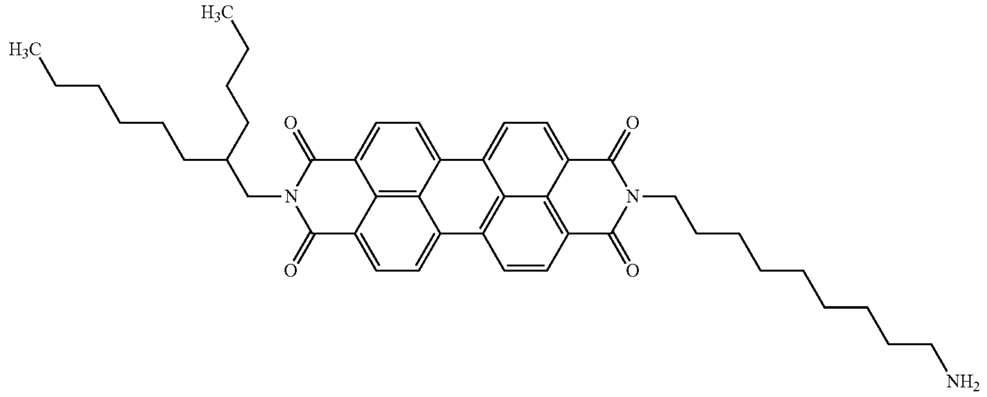
(X)
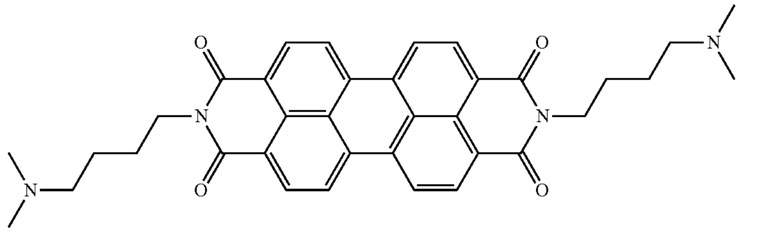
(XI)
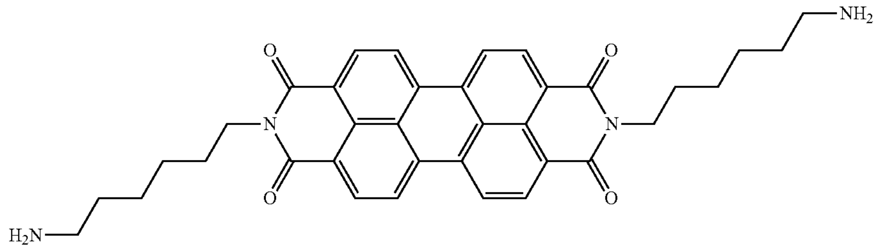
and
(XII)
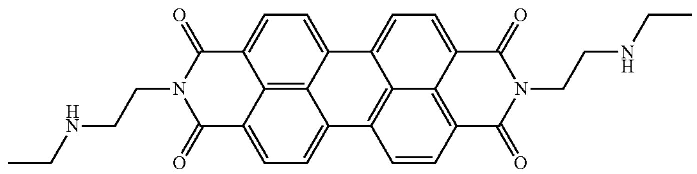
.
10. The sensor of claim 9, wherein the second organic nanofibers are assembled from stacked molecules having at least one of the following structures:
(XIII)
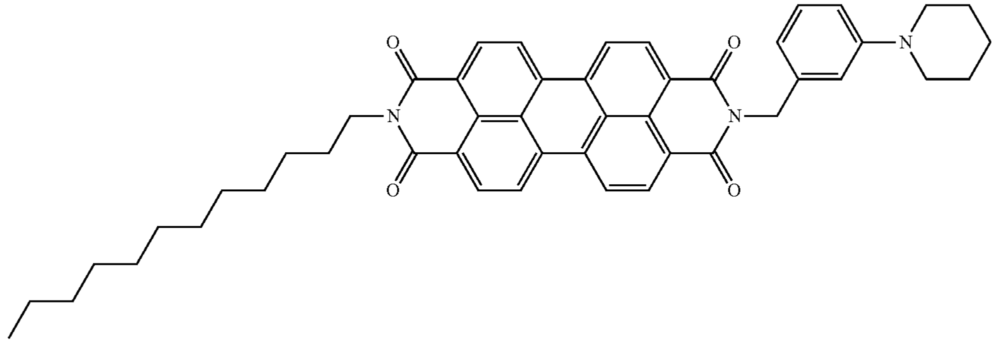
and -continued (XIV)

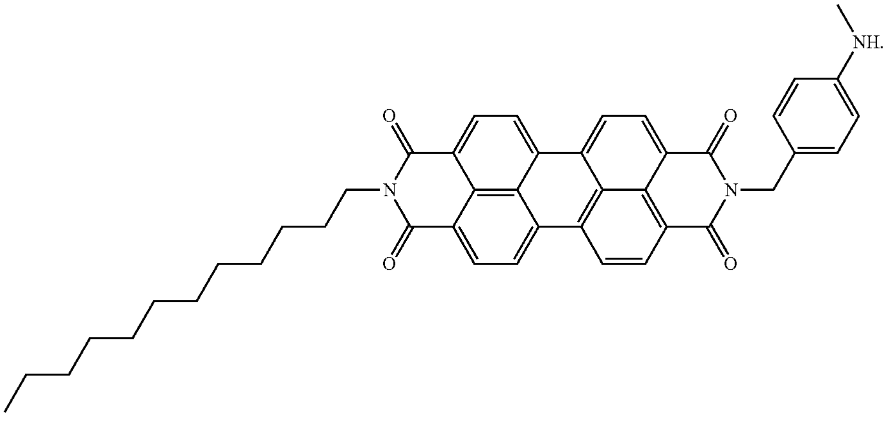

11. The sensor of claim 10, wherein the at least one of the structures of the first organic nanofibers and the at least one of the structures of the second organic nanofibers, respectively, are: X and XIV; XI and XIV; or XII and XIV.

12. The sensor of claim 1, wherein the second porous structured material comprises second organic nanofibers assembled from stacked molecules selected from a group consisting of: substituted or unsubstituted 3,4,9,10-perylene-tetracarboxylic diimide, substituted or unsubstituted 3,4,9,10-perylene-tetracarboxylic dianhydride, substituted or unsubstituted perylene 3,4,9,10-tetracarboxyl-3,4-anhydride-9,10-imide, an indolocarbazole derivative, and an oligomer made up of 3 to 9 carbazole derivative monomers.

13. The sensor of claim 1, wherein the adsorption layer and the sensing layer each has a thickness from 50 nm to 5 μm.

14. The sensor of claim 1, wherein the adsorption layer and the sensing layer each has a mass from 0.1 μg to 6 μg per 3 $mm^2$ and an area of 0.1 $mm^2$ to 10 $mm^2$.

15. The sensor of claim 1, wherein the adsorption layer is porous with an average pore size from 10 nm to 1 μm.

16. The sensor of claim 1, wherein the adsorption layer is in direct contact with the sensing layer.

17. The sensor of claim 1, wherein the electrode pair is separated by a gap distance from 50 nm to 100 μm.

* * * * *